US010457041B2

(12) United States Patent
Yamada et al.

(10) Patent No.: US 10,457,041 B2
(45) Date of Patent: Oct. 29, 2019

(54) LIQUID DISCHARGE APPARATUS, CIRCUIT SUBSTRATE, AND INTEGRATED CIRCUIT DEVICE

(71) Applicant: Seiko Epson Corporation, Tokyo (JP)

(72) Inventors: Tomokazu Yamada, Shiojiri (JP); Hidehiko Yajima, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/027,470

(22) Filed: Jul. 5, 2018

(65) Prior Publication Data
US 2019/0009526 A1   Jan. 10, 2019

(30) Foreign Application Priority Data
Jul. 6, 2017 (JP) ................. 2017-132827

(51) Int. Cl.
*B41J 2/045* (2006.01)
*H03K 17/687* (2006.01)

(52) U.S. Cl.
CPC ....... *B41J 2/04541* (2013.01); *B41J 2/04548* (2013.01); *B41J 2/04581* (2013.01); *B41J 2/04588* (2013.01); *B41J 2/04593* (2013.01); *B41J 2/04596* (2013.01); *H03K 17/6871* (2013.01)

(58) Field of Classification Search
CPC ............... B41J 2/04541; B41J 2/04581; B41J 2/04588; B41J 2/04593; B41J 2/04596; H03K 17/6871
USPC .................................................. 347/9–12, 14
See application file for complete search history.

(56) References Cited

U.S. PATENT DOCUMENTS

| | | | | |
|---|---|---|---|---|
| 6,320,298 | B1 * | 11/2001 | Kawabe | H02N 2/025 310/316.01 |
| 9,849,670 | B2 * | 12/2017 | Yamada | B41J 2/04588 |
| 9,908,329 | B2 * | 3/2018 | Yamada | B41J 2/04573 |
| 2014/0285556 | A1 | 9/2014 | Otsuka et al. | |
| 2016/0144616 | A1 | 5/2016 | Yamada | |
| 2017/0266958 | A1 | 9/2017 | Yamada | |

FOREIGN PATENT DOCUMENTS

| | | |
|---|---|---|
| JP | 2010-114711 A | 5/2010 |
| JP | 2014-184569 A | 10/2014 |
| JP | 2016-097613 A | 5/2016 |
| JP | 2017-165067 A | 9/2017 |

* cited by examiner

*Primary Examiner* — An H Do
(74) *Attorney, Agent, or Firm* — Harness, Dickey & Pierce, P.L.C.

(57) ABSTRACT

There is provided a liquid discharge apparatus including: a discharge unit which discharges a liquid by a piezoelectric element; and a driving circuit which drives the piezoelectric element, in which the driving circuit includes a first transistor pair which is driven by a first power source voltage and a second power source voltage, a second transistor pair which is driven by the second power source voltage and a third power source voltage, and a first control circuit which controls on a first input signal, and in which, the shortest distance between the first power source voltage and the first input terminal is shorter than the shortest distance between the second power source voltage and the first input terminal, and the shortest distance between the second power source terminal and the first input terminal is shorter than the shortest distance between the third power source voltage and the first input terminal.

16 Claims, 13 Drawing Sheets

| (SIH, SIL) | T1 | | T2 | |
|---|---|---|---|---|
| | Sa | Sb | Sa | Sb |
| (1, 1) [LARGE DOT] | H | L | H | L |
| (1, 0) [MEDIUM DOT] | H | L | L | H |
| (0, 1) [SMALL DOT] | L | L | L | H |
| (0, 0) [NON-RECORDING] | L | H | L | L |

LIQUID DISCHARGE APPARATUS, CIRCUIT SUBSTRATE, AND INTEGRATED CIRCUIT DEVICE

CROSS-REFERENCE TO RELATED APPLICATION

The entire disclosure of Japanese Patent Application No. 2017-132827, filed Jul. 6, 2017 is expressly incorporated by reference herein.

BACKGROUND

1. Technical Field

The present invention relates to a liquid discharge apparatus, a circuit substrate, and an integrated circuit device.

2. Related Art

As a liquid discharge apparatus, such as an ink jet printer for discharging ink to print an image or a document, a liquid discharge apparatus using a piezoelectric element (for example, a piezo element) is known. A piezoelectric element is provided corresponding to each of a plurality of nozzles in the head unit, each of the piezoelectric elements is driven according to a driving signal, and accordingly, a predetermined amount of ink (liquid) is discharged from the nozzle at a predetermined timing to form dots. Since the piezoelectric element is a capacitive load, such as a capacitor, in terms of electricity, it is necessary to supply a sufficient current in order to operate the piezoelectric element of each of the nozzles.

Therefore, in the above-described liquid discharge apparatus, a configuration in which the driving signal amplified by an amplifying circuit is supplied to a head unit (ink jet head) to drive the piezoelectric element, is employed. As a driving circuit for generating a driving signal, there is a device which performs current amplification of a source signal before amplification with a class AB amplifier or the like, but since energy efficiency is not excellent, in recent years, a driving circuit using a class D amplifier has been suggested (refer to JP-A-2010-114711). In addition, a driving circuit (division power source type driving circuit) that generates a driving signal by selecting a transistor to perform a switching operation from a plurality of transistors of which power source voltages are different according to the voltage of the driving signal has also been suggested (refer to JP-A-2014-184569).

However, in order to obtain discharge accuracy (in order to make the output waveform highly precise), the class D amplifiers for the ink jet heads are required to have an oscillation frequency (1 to 8 MHz) 20 times higher than that of the class D amplifiers for audio, and thus, noise, such as an electromagnetic interference (EMI) is likely to be generated. In contrast, the division power source type driving circuit has high energy efficiency and is capable of suppressing the generation of EMI. However, when the driving circuit for the ink jet head is integrated, a driving circuit that operates at a high voltage and a control circuit that operates at a low voltage coexist in the same IC chip. Therefore, the operation of the low-voltage circuit is affected by the noise generated in the high-voltage driving circuit, and the discharge of the ink may be disturbed.

SUMMARY

According to some aspects of the invention, there can be provided a liquid discharge apparatus, a circuit substrate, and an integrated circuit device which can reduce an influence of noise from a high-voltage circuit on a low-voltage circuit and generate a driving signal having a driving waveform with less distortion.

The invention has been made to solve at least a part of the above-described problems, and it is possible to realize the following aspects or application examples.

Application Example 1

According to this application example, there is provided a liquid discharge apparatus including: a discharge unit which includes a piezoelectric element and discharges a liquid by applying a first driving signal to the piezoelectric element; and a first driving circuit which outputs the first driving signal, in which the first driving circuit includes a first output node for outputting the first driving signal, a first transistor pair which includes a first transistor and a second transistor which are connected to each other in series between a first power source voltage supply line for supplying a first power source voltage and a second power source voltage supply line for supplying a second power source voltage that is higher than the first power source voltage, a second transistor pair which includes a third transistor and a fourth transistor which are connected to each other in series between the second power source voltage supply line and a third power source voltage supply line for supplying a third power source voltage that is higher than the second power source voltage, a first gate driver to which the first power source voltage and the second power source voltage are supplied and which generates a first control signal that controls a switching operation of the first transistor pair, a second gate driver to which the second power source voltage and the third power source voltage are supplied and which generates a second control signal that controls a switching operation of the second transistor pair, and a first control circuit which controls the first gate driver and the second gate driver based on a first input signal, in which an output end of the first transistor pair and an output end of the second transistor pair are connected to the first output node, in which at least a part of the first gate driver, at least a part of the second gate driver, and at least a part of the first control circuit are integrated in an integrated circuit device, in which the integrated circuit device includes a first power source terminal to which the first power source voltage is supplied, a second power source terminal to which the second power source voltage is supplied, a third power source terminal to which the third power source voltage is supplied, and a first input terminal to which the first input signal is input, in which the shortest distance between the first power source terminal and the first input terminal is shorter than the shortest distance between the second power source terminal and the first input terminal, and in which the shortest distance between the second power source terminal and the first input terminal is shorter than the shortest distance between the third power source terminal and the first input terminal.

In the liquid discharge apparatus according to the application example, since the output end of the first transistor pair and the output end of the second transistor pair are connected to the first output node, the signal output from the first transistor pair and the signal output from the second transistor pair respectively become a part of the first driving signal. Therefore, the accuracy of the first driving signal depends on the accuracy of the first control signal for controlling the switching operation of the first transistor pair and the second control signal for controlling the switching operation of the second transistor pair. Here, while the first gate driver which generates the first control signal operates as the first power source voltage and the second power source voltage are supplied, the second gate driver which generates the second control signal operates as the second power source voltage that is higher than the first power source voltage and the third power source voltage that is higher than the second power source voltage are supplied, and thus, there is a possibility that the second gate driver generates noise greater than that of the first gate driver. When the first input signal having a relatively lower voltage than that of the second control signal is influenced by large noise generated by the second gate driver, the accuracy of the first input signal deteriorates, and as a result, the accuracy of the control of the first gate driver and the second gate driver based on the first input signal caused by the first control circuit deteriorates, and the accuracy of the first driving signal deteriorates.

Here, in the liquid discharge apparatus according to the application example, in the integrated circuit device, the shortest distance between the first power source terminal to which the first power source voltage is supplied and the first input terminal to which the first input signal is input is shorter than the shortest distance between the second power source terminal to which the second power source voltage that is higher than the first power source voltage is supplied and the first input terminal, and the shortest distance between the second power source terminal and the first input terminal is shorter than the shortest distance between the third power source terminal to which the third power source voltage that is higher than the second power source voltage is supplied and the first input terminal. In other words, with respect to the first input terminal, the second power source terminal is provided at a position farther than the first power source terminal, and the third power source terminal is provided at a position farther than the second power source terminal. In other words, with respect to the first input terminal, the second gate driver which is connected to the second power source terminal and the third power source terminal and generates relatively large noise is provided at a position farther than the first gate driver connected to the first power source terminal and the second power source terminal. Therefore, according to the liquid discharge apparatus of the application example, since it is possible to reduce the influence of noise from the high-voltage circuit (second gate driver) to the low-voltage circuit (first control circuit) which operates based on the first input signal, and to generate the first driving signal having the driving waveform with less distortion, it is possible to improve the discharge accuracy of the liquid from the discharge unit.

Application Example 2

In the liquid discharge apparatus according to the application example, the first control circuit may include a D/A conversion circuit which converts a digital signal that defines a waveform of the first driving signal into an original driving signal that serves as an origin of the first driving signal, and may control the first gate driver and the second gate driver based on the original driving signal, and the first input signal may be the digital signal.

In the liquid discharge apparatus according to the application example, in the integrated circuit device, with respect to the D/A conversion circuit connected to the first input terminal, the second gate driver which generates relatively large noise is provided at a position farther from the first gate driver. Therefore, according to the liquid discharge apparatus of the application example, since it is possible to reduce the influence of noise from the high-voltage circuit (second gate driver) to the low-voltage circuit (D/A conversion circuit) which operates based on the first input signal, and to generate the first driving signal having the driving waveform with less distortion, it is possible to improve the discharge accuracy of the liquid from the discharge unit.

Application Example 3

In the liquid discharge apparatus according to the application example, the shortest distance between the first power source terminal and a first side of the integrated circuit device may be shorter than the shortest distance between the first power source terminal and a second side of the integrated circuit device, and the shortest distance between the first input terminal and the second side may be shorter than the shortest distance between the first input terminal and the first side.

In the liquid discharge apparatus according to the application example, the first power source terminal is disposed closer to the first side than the second side of the integrated circuit device, and the first input terminal is disposed closer to the second side than the first side of the integrated circuit device. In other words, in the integrated circuit device, since the first power source terminal is provided along the first side and the first input terminal is provided along the second side, although the operation is performed at a lower voltage than that of the second gate driver, it is possible to dispose the first gate driver that operates at a higher voltage than that of the first control circuit and the first control circuit that operates at a low voltage to be apart from each other. Therefore, according to the liquid discharge apparatus of the application example, since it is possible to reduce the influence of noise from the high-voltage circuit (first gate driver) to the low-voltage circuit (first control circuit), and to generate the first driving signal having the driving waveform with less distortion, it is possible to improve the discharge accuracy of the liquid from the discharge unit.

Application Example 4

In the liquid discharge apparatus according to the application example, the shortest distance between the second power source terminal and the first side may be shorter than the shortest distance between the second power source terminal and the second side, and the shortest distance between the third power source terminal and the first side may be shorter than the shortest distance between the third power source terminal and the second side.

In the liquid discharge apparatus according to the application example, the first power source terminal, the second power source terminal, and the third power source terminal are disposed closer to the first side than the second side of the integrated circuit device, and the first input terminal is disposed closer to the second side than the first side of the integrated circuit device. In other words, in the integrated circuit device, since the first power source terminal, the second power source terminal, and the third power source terminal are provided along the first side, the first input terminal is provided along the second side, it is possible to dispose the first gate driver and the second gate driver that operate at a high voltage, and the first control circuit that operates at a low voltage to be apart from each other. Therefore, according to the liquid discharge apparatus of the application example, since it is possible to reduce the influence of noise from the high-voltage circuit (the first gate driver and the second gate driver) to the low-voltage circuit (first control circuit), and to generate the first driving signal having the driving waveform with less distortion, it is possible to improve the discharge accuracy of the liquid from the discharge unit.

Application Example 5

In the liquid discharge apparatus according to the application example, the discharge unit may discharge the liquid by applying the first driving signal or a second driving signal to the piezoelectric element, a second driving circuit which outputs the second driving signal may further be provided, the second driving circuit may include a second output node for outputting the second driving signal, a third transistor pair which includes a fifth transistor and a sixth transistor which are connected to each other in series between a fourth power source voltage supply line for supplying a fourth power source voltage and a fifth power source voltage supply line for supplying a fifth power source voltage that is higher than the fourth power source voltage, a fourth transistor pair which includes a seventh transistor and an eighth transistor which are connected to each other in series between the fifth power source voltage supply line and a sixth power source voltage supply line for supplying a sixth power source voltage that is higher than the fifth power source voltage, a third gate driver to which the fourth power source voltage and the fifth power source voltage are supplied and which generates a third control signal that controls a switching operation of the third transistor pair, a fourth gate driver to which the fifth power source voltage and the sixth power source voltage are supplied and which generates a fourth control signal that controls a switching operation of the fourth transistor pair, and a second control circuit which controls the third gate driver and the fourth gate driver based on a second input signal, an output end of the third transistor pair and an output end of the fourth transistor pair may be connected to the second output node, at least a part of the third gate driver, at least a part of the fourth gate driver, and at least a part of the second control circuit may be integrated in the integrated circuit device, the integrated circuit device may include a fourth power source terminal to which the fourth power source voltage is supplied, a fifth power source terminal to which the fifth power source voltage is supplied, a sixth power source terminal to which the sixth power source voltage is supplied, and a second input terminal to which the second input signal is input, the shortest distance between the fourth power source terminal and the second input terminal may be shorter than the shortest distance between the fifth power source terminal and the second input terminal, the shortest distance between the fifth power source terminal and the second input terminal may be shorter than the shortest distance between the sixth power source terminal and the second input terminal, the shortest distance between the second input terminal and a third side that opposes the second side of the integrated circuit device may be shorter than the shortest distance between the second input terminal and the first side, the shortest distance between the fourth power source terminal and the first side may be shorter than the shortest distance between the fourth power source terminal and the third side, the shortest distance between the fifth power source terminal and the first side may be shorter than the shortest distance between the fifth power source terminal and the third side, and the shortest distance between the sixth power source terminal and the first side may be shorter than the shortest distance between the sixth power source terminal and the third side.

The fourth power source voltage may be the same voltage as the first power source voltage or a different voltage. Similarly, the fifth power source voltage may be the same voltage as the second power source voltage or a different voltage. Similarly, the sixth power source voltage may be the same voltage as the third power source voltage or a different voltage.

In the liquid discharge apparatus according to the application example, since the output end of the third transistor pair and the output end of the fourth transistor pair are connected to the second output node, the signal output from the third transistor pair and the signal output from the fourth transistor pair respectively become a part of the second driving signal. Therefore, the accuracy of the second driving signal depends on the accuracy of the third control signal for controlling the switching operation of the third transistor pair and the fourth control signal for controlling the switching operation of the fourth transistor pair. Here, while the third gate driver which generates the third control signal operates as the fourth power source voltage and the fifth power source voltage are supplied, the fourth gate driver which generates the fourth control signal operates as the fifth power source voltage that is higher than the fourth power source voltage and the sixth power source voltage that is higher than the fifth power source voltage are supplied, and thus, there is a possibility that the fourth gate driver generates noise greater than that of the third gate driver. When the second input signal having a relatively lower voltage than that of the fourth control signal is influenced by large noise generated by the fourth gate driver, the accuracy of the second input signal deteriorates, and as a result, the accuracy of the control of the third gate driver and the fourth gate driver based on the second input signal caused by the second control circuit deteriorates, and the accuracy of the second driving signal deteriorates.

Here, in the liquid discharge apparatus according to the application example, in the integrated circuit device, the shortest distance between the fourth power source terminal to which the fourth power source voltage is supplied and the second input terminal to which the second input signal is input is shorter than the shortest distance between the fifth power source terminal to which the fifth power source voltage that is higher than the fourth power source voltage is supplied and the second input terminal, and the shortest distance between the fifth power source terminal and the second input terminal is shorter than the shortest distance between the sixth power source terminal to which the sixth power source voltage that is higher than the fifth power source voltage is supplied and the second input terminal. In other words, with respect to the second input terminal, the fifth power source terminal is provided at a position farther than the fourth power source terminal, and the sixth power source terminal is provided at a position farther than the fifth power source terminal. In other words, with respect to the second input terminal, the fourth gate driver which is connected to the fifth power source terminal and the sixth power source terminal and generates relatively large noise is provided at a position farther than the third gate driver connected to the fourth power source terminal and the fifth power source terminal. Furthermore, the fourth power source terminal, the fifth power source terminal, and the sixth power source terminal are disposed closer to the first side than the third side of the integrated circuit device, and the second input terminal is disposed closer to the third side than the first side of the integrated circuit device. In other words, in the integrated circuit device, since the fourth power source terminal, the fifth power source terminal, and the sixth power source terminal are provided along the first side, the second input terminal is provided along the third side, it is possible to dispose the third gate driver and the fourth gate driver that operate at a high voltage, and the second control circuit that operates at a low voltage to be apart from each other. Therefore, according to the liquid discharge apparatus of the application example, since it is possible to reduce the influence of noise from the high-voltage circuit (the third gate driver and the fourth gate driver) to the low-voltage circuit (second control circuit) which operates based on the second input signal, and to generate the first driving signal having the driving waveform with less distortion, it is possible to improve the discharge accuracy of the liquid from the discharge unit.

Application Example 6

According to this application example, there is provided a circuit substrate on which an integrated circuit device is mounted including a discharge unit which includes a piezoelectric element and discharges a liquid by applying a first driving signal to the piezoelectric element, and a first driving circuit which outputs the first driving signal, in which the first driving circuit includes a first output node for outputting the first driving signal, a first transistor pair which includes a first transistor and a second transistor which are connected to each other in series between a first power source voltage supply line for supplying a first power source voltage and a second power source voltage supply line for supplying a second power source voltage that is higher than the first power source voltage, a second transistor pair which includes a third transistor and a fourth transistor which are connected to each other in series between the second power source voltage supply line and a third power source voltage supply line for supplying a third power source voltage that is higher than the second power source voltage, a first gate driver to which the first power source voltage and the second power source voltage are supplied and which generates a first control signal that controls a switching operation of the first transistor pair, a second gate driver to which the second power source voltage and the third power source voltage are supplied and which generates a second control signal that controls a switching operation of the second transistor pair, and a first control circuit which controls the first gate driver and the second gate driver based on a first input signal, in which an output end of the first transistor pair and an output end of the second transistor pair are connected to the first output node, in which at least a part of the first gate driver, at least a part of the second gate driver, and at least a part of the first control circuit are integrated in an integrated circuit device, in which a first power source terminal to which the first power source voltage is supplied, a second power source terminal to which the second power source voltage is supplied, a third power source terminal to which the third power source voltage is supplied, and a first input terminal to which the first input signal is input, are provided, the circuit substrate including: a first electrode to which the first power source terminal is connected; a second electrode to which the second power source terminal is connected; a third electrode to which the third power source terminal is connected; and a fourth electrode to which the first input terminal is connected, in which the shortest distance between the first electrode and the fourth electrode is shorter than the shortest distance between the second electrode and the fourth electrode, and in which the shortest distance between the second electrode and the fourth electrode is shorter than the shortest distance between the third electrode and the fourth electrode.

In the circuit substrate according to the application example, the shortest distance between the first electrode which is connected to the first power source terminal of the integrated circuit device to which the first power source voltage is supplied and the fourth electrode which is connected to the first input terminal of the integrated circuit device to which the first input signal is input, is shorter than the shortest distance between the second electrode which is connected to the second power source terminal of the integrated circuit device to which the second power source voltage that is higher than the first power source voltage is supplied and the fourth electrode, and the shortest distance between second electrode and the fourth electrode is shorter than the shortest distance between the third electrode which is connected to the third power source terminal of the integrated circuit device to which the third power source voltage that is higher than the second power source voltage is supplied and the fourth electrode. In other words, with respect to the fourth electrode, the second electrode is provided at a position farther than the first electrode, and the third electrode is provided at a position farther than the second electrode. Therefore, according to the circuit substrate of the application example, it is easy to separate a wiring which is connected to the fourth electrode and through which the first input signal propagates and a wiring which is electrically connected to the second electrode and the third electrode and through which the second control signal having a high voltage and a high frequency output from the second gate driver propagates from each other, and the influence of the noise on the first input signal is reduced. Therefore, in the liquid discharge apparatus using the circuit substrate according to the application example, since the driving circuit can generate the driving signal having the driving waveform with less distortion, it is possible to improve the discharge accuracy of the liquid from the discharge unit.

Application Example 7

In the circuit substrate according to the application example, the first control circuit may include a D/A conversion circuit which converts a digital signal that defines a waveform of the first driving signal into an original driving signal that serves as an origin of the first driving signal, and may control the first gate driver and the second gate driver based on the original driving signal, and the first input signal may be the digital signal.

According to the circuit substrate of the application example, it is easy to separate a wiring through which the first input signal (digital signal) input to the D/A conversion circuit included in the integrated circuit device propagates and a wiring through which the second control signal having a high voltage and a high frequency from each other, and the influence of the noise on the first input signal (digital signal) is reduced. Therefore, in the liquid discharge apparatus using the circuit substrate according to the application example, since the driving circuit can generate the driving signal having the driving waveform with less distortion, it is possible to improve the discharge accuracy of the liquid from the discharge unit.

Application Example 8

In the circuit substrate according to the application example, in a case where the integrated circuit device is mounted thereon, the shortest distance between the first electrode and a first side of the integrated circuit device may be shorter than the shortest distance between the first electrode and a second side of the integrated circuit device, and the shortest distance between the fourth electrode and the second side may be shorter than the shortest distance between the fourth electrode and the first side.

In the circuit substrate according to the application example, the first electrode is disposed closer to the first side than the second side of the integrated circuit device, and the fourth electrode is disposed closer to the second side than the first side of the integrated circuit device. In other words, the first electrode is provided along the first side of the integrated circuit device, and the fourth electrode is provided along the second side of the integrated circuit device. Therefore, according to the circuit substrate of the application example, it is easy to separate the wiring which is connected to the fourth electrode and through which the first input signal propagates and the wiring which is electrically connected to the first electrode and through which the first control signal having a high voltage and a high frequency output from the first gate driver that operates at a higher voltage than that of the first control circuit although the first gate driver operates at a lower voltage than that of the second gate driver propagates, and the influence of the noise on the first input signal is reduced. Therefore, in the liquid discharge apparatus using the circuit substrate according to the application example, since the driving circuit can generate the driving signal having the driving waveform with less distortion, it is possible to improve the discharge accuracy of the liquid from the discharge unit.

Application Example 9

In the circuit substrate according to the application example, in a case where the integrated circuit device is mounted thereon, the shortest distance between the second electrode and the first side may be shorter than the shortest distance between the second electrode and the second side, and the shortest distance between the third electrode and the first side may be shorter than the shortest distance between the third electrode and the second side.

In the circuit substrate according to the application example, the first electrode, the second electrode, and the third electrode are disposed closer to the first side than the second side of the integrated circuit device, and the fourth electrode is disposed closer to the second side than the first side of the integrated circuit device. In other words, the first electrode, the second electrode, and the third electrode are provided along the first side of the integrated circuit device, and the fourth electrode is provided along the second side of the integrated circuit device. Therefore, according to the circuit substrate of the application example, it is easy to separate the wiring which is connected to the fourth electrode and through which the first input signal propagates, the wiring which is electrically connected to the first electrode and the second electrode and through which the first control signal having a high voltage and a high frequency output from the first gate driver propagates, and the wiring which is electrically connected to the second electrode and the third electrode and through which the second control signal having a high voltage and a high frequency output from the second gate driver propagates from each other, and the influence of the noise on the first input signal is reduced. Therefore, in the liquid discharge apparatus using the circuit substrate according to the application example, since the driving circuit can generate the driving signal having the driving waveform with less distortion, it is possible to improve the discharge accuracy of the liquid from the discharge unit.

Application Example 10

According to this application example there is provided an integrated circuit device including a first output node for outputting a first driving signal that drives a capacitive load, a first transistor pair which includes a first transistor and a second transistor which are connected to each other in series between a first power source voltage supply line for supplying a first power source voltage and a second power source voltage supply line for supplying a second power source voltage that is higher than the first power source voltage, a second transistor pair which includes a third transistor and a fourth transistor which are connected to each other in series between the second power source voltage supply line and a third power source voltage supply line for supplying a third power source voltage that is higher than the second power source voltage, a first gate driver to which the first power source voltage and the second power source voltage are supplied and which generates a first control signal that controls a switching operation of the first transistor pair, a second gate driver to which the second power source voltage and the third power source voltage are supplied and which generates a second control signal that controls a switching operation of the second transistor pair, and a first control circuit which controls the first gate driver and the second gate driver based on a first input signal, in which an output end of the first transistor pair and an output end of the second transistor pair are used in the first driving circuit connected to the first output node, the device including: at least a part of the first gate driver; at least a part of the second gate driver; at least a part of the first control circuit; a first power source terminal to which the first power source voltage is supplied; a second power source terminal to which the second power source voltage is supplied; a third power source terminal to which the third power source voltage is supplied; and a first input terminal to which the first input signal is input, in which the shortest distance between the first power source terminal and the first input terminal is shorter than the shortest distance between the second power source terminal and the first input terminal, and in which the shortest distance between the second power source terminal and the first input terminal is shorter than the shortest distance between the third power source terminal and the first input terminal.

In the integrated circuit device according to the application example, the shortest distance between the first power source terminal to which the first power source voltage is supplied and the first input terminal to which the first input signal is input is shorter than the shortest distance between the second power source terminal to which the second power source voltage that is higher than the first power source voltage is supplied and the first input terminal, and the shortest distance between the second power source terminal and the first input terminal is shorter than the shortest distance between the third power source terminal to which the third power source voltage that is higher than the second power source voltage is supplied and the first input terminal. In other words, with respect to the first input terminal, the second power source terminal is provided at a position farther than the first power source terminal, and the third power source terminal is provided at a position farther than the second power source terminal. In other words, with respect to the first input terminal, the second gate driver which is connected to the second power source terminal and the third power source terminal and generates relatively large noise is provided at a position farther than the first gate driver connected to the first power source terminal and the second power source terminal. Therefore, according to the integrated circuit device of the application example, it is possible to reduce the influence of noise from the high-voltage circuit (second gate driver) to the low-voltage circuit (first control circuit) that operates based on the first input signal. Therefore, the driving circuit using the integrated circuit device according to the application example can generate the first driving signal having the driving waveform with less distortion.

Application Example 11

In the integrated circuit device according to the application example, the shortest distance between the first input terminal and the first gate driver may be shorter than the shortest distance between the first input terminal and the second gate driver.

In the integrated circuit device according to the application example, with respect to the first input terminal, the second gate driver which generates relatively large noise is provided at a position farther from the first gate driver. Therefore, according to the integrated circuit device of the application example, it is possible to reduce the influence of noise from the high-voltage circuit (second gate driver) to the low-voltage circuit (first control circuit) that operates based on the first input signal. Therefore, the driving circuit using the integrated circuit device according to the application example can generate the first driving signal having the driving waveform with less distortion.

Application Example 12

In the integrated circuit device according to the application example, the shortest distance between the first power source terminal and a first side of the integrated circuit device may be shorter than the shortest distance between the first power source terminal and a second side of the integrated circuit device, and the shortest distance between the first input terminal and the second side may be shorter than the shortest distance between the first input terminal and the first side.

In the integrated circuit device according to the application example, the first power source terminal is disposed closer to the first side than the second side, and the first input terminal is disposed closer to the second side than the first side. In other words, since the first power source terminal is provided along the first side and the first input terminal is provided along the second side, although the operation is performed at a lower voltage than that of the second gate driver, it is possible to dispose the first gate driver that operates at a higher voltage than that of the first control circuit and the first control circuit that operates at a low voltage to be apart from each other. Therefore, according to the integrated circuit device of the application example, it is possible to reduce the influence of noise from the high-voltage circuit (first gate driver) to the low-voltage circuit (first control circuit). Therefore, the driving circuit using the integrated circuit device according to the application example can generate the first driving signal having the driving waveform with less distortion.

Application Example 13

In the integrated circuit device according to the application example, the shortest distance between the second power source terminal and the first side may be shorter than the shortest distance between the second power source terminal and the second side, and the shortest distance between the third power source terminal and the first side may be shorter than the shortest distance between the third power source terminal and the second side.

In the integrated circuit device according to the application example, the first power source terminal, the second power source terminal, and the third power source terminal are disposed closer to the first side than the second side, and the first input terminal is disposed closer to the second side than the first side. In other words, since the first power source terminal, the second power source terminal, and the third power source terminal are provided along the first side, and the first input terminal is provided along the second side, it is possible to dispose the first gate driver and the second gate driver that operate at a high voltage, and the first control circuit that operates at a low voltage to be apart from each other. Therefore, according to the liquid discharge apparatus of the application example, it is possible to reduce the influence of noise from the high-voltage circuit (the first gate driver and the second gate driver) to the low-voltage circuit (first control circuit). Therefore, the driving circuit using the integrated circuit device according to the application example can generate the first driving signal having the driving waveform with less distortion.

Application Example 14

In the integrated circuit device according to the application example, the first control circuit may include a D/A conversion circuit which converts a digital signal that defines a waveform of the first driving signal into an original driving signal that serves as an origin of the first driving signal, and may control the first gate driver and the second gate driver based on the original driving signal, and the first input signal may be the digital signal.

In the integrated circuit device according to the application example, with respect to the D/A conversion circuit connected to the first input terminal, the second gate driver which generates relatively large noise is provided at a position farther from the first gate driver. Therefore, according to the integrated circuit device of the application example, it is possible to reduce the influence of noise from the high-voltage circuit (second gate driver) to the low-voltage circuit (D/A conversion circuit) that operates based on the first input signal. Therefore, the driving circuit using the integrated circuit device according to the application example can generate the first driving signal having the driving waveform with less distortion.

Application Example 15

In the integrated circuit device according to the application example, the first control circuit may further include a D/A conversion circuit which converts a digital signal that defines a waveform of the first driving signal into an original driving signal that serves as an origin of the first driving signal, and a selector which operates the first gate driver when a voltage of the first driving signal is between the first power source voltage and the second power source voltage, and operates the second gate driver when a voltage of the first driving signal is between the second power source voltage and the third power source voltage, and may control the first gate driver and the second gate driver based on the original driving signal, the integrated circuit device may further include at least a part of the D/A conversion circuit and at least a part of the selector, and the selector may be provided between the first gate driver and the second gate driver and the D/A conversion circuit.

In the integrated circuit device according to the application example, since the D/A conversion circuit generates the original driving signal that is the origin of the first driving signal, when the influence of noise from the first gate driver and the second gate driver on the D/A conversion circuit is large, there is a possibility that the accuracy of the first driving signal deteriorates. In contrast, a selector selects a period during which the first gate driver is operable and a period during which the second gate driver is operable, and the influence of the noise on the selector on the accuracy of the first driving signal is relatively small. According to the integrated circuit device of the application example, since the selector is provided between the first gate driver and the second gate driver and the D/A conversion circuit, propagation of noise having a high voltage and a high frequency generated by the first gate driver and the second gate driver to the D/A conversion circuit is reduced. Therefore, the driving circuit using the integrated circuit device according to the application example can generate the driving signal having the driving waveform with less distortion.

Application Example 16

In the integrated circuit device according to the application example, the first driving circuit may further include a linear amplifier which amplifies a voltage of an original driving signal that serves as the first driving signal by predetermined times and outputs the voltage, in a first period, a switching operation of the first transistor pair and the second transistor pair may be stopped, and the voltage output from the linear amplifier may be applied to the first output node, the integrated circuit device may further include at least a part of the linear amplifier and a first output terminal to which a signal generated by the linear amplifier is output, the shortest distance between the first output terminal and the second side may be shorter than the shortest distance between the first output terminal and the first side, and the linear amplifier may be provided between the second side and the first gate driver.

In the integrated circuit device according to the application example, since the voltage output from the linear amplifier is applied to the first output node in the first period, the voltage becomes a part of the first driving signal. In other words, a part of the linear amplifier operates at a high voltage, and a high-voltage signal generated by the linear amplifier is output from the first output terminal. According to the integrated circuit device of the application example, since the first output terminal is provided at a position closer to the second side than the first side and the linear amplifier is positioned between the second side and the first gate driver, the wiring through which the signal having a high voltage output from the linear amplifier propagates to the first output terminal becomes shorter and the wiring does not intersect with the first control circuit, and thus, propagation of noise having a high voltage to the first control circuit is reduced. Furthermore, in the integrated circuit device according to this application example, the linear amplifier is provided between the second side and the first gate driver, that is, with respect to the linear amplifier, the second gate driver is provided at a position farther than the first gate driver. Therefore, according to the integrated circuit device of the application example, the influence of large noise from the second gate driver that operates at a voltage that is higher than that of the first gate driver on the linear amplifier is reduced. Therefore, the driving circuit using the integrated circuit device according to the application example can generate the driving signal having the driving waveform with less distortion.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
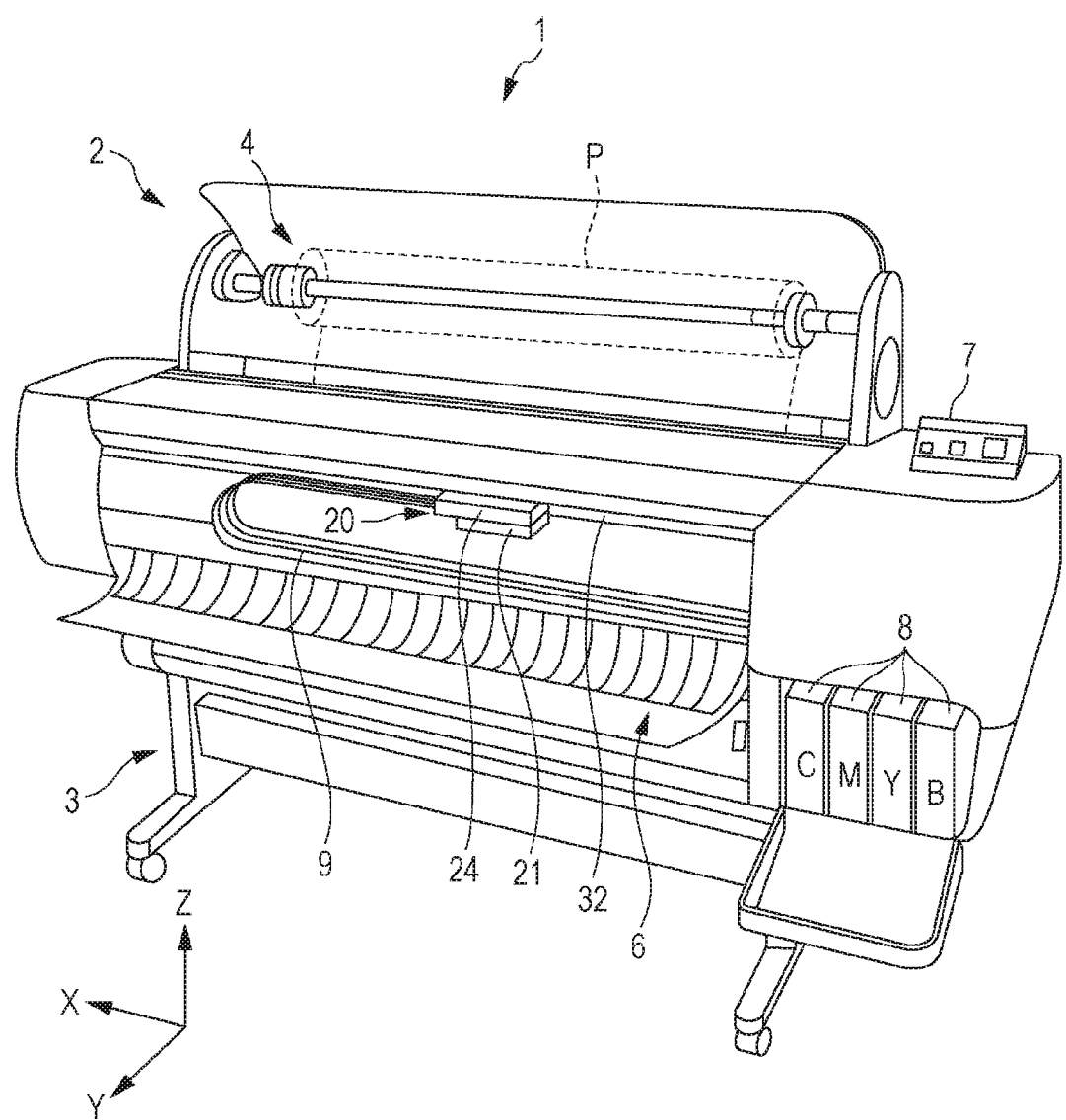
FIG. 1 is a schematic external view of a liquid discharge apparatus.

Hereinafter, appropriate embodiments of the invention will be described in detail with reference to the drawings. The drawing used is for convenience of description. In addition, the embodiments which will be described below do not inappropriately limit the contents of the invention described in the claims. In addition, not all of the configurations which will be described below are necessarily essential components of the invention.

1. Outline of Liquid Discharge Apparatus

The liquid discharge apparatus according to the embodiment is an ink jet printer which forms an ink dot group on a printing medium, such as a paper sheet, by discharging ink in accordance with image data supplied from an external host computer, and accordingly, prints an image (including letters, figures, and the like) that corresponds to the image data.

FIG. 1 is a schematic external view of a liquid discharge apparatus 1 according to the embodiment. As illustrated in FIG. 1, the liquid discharge apparatus 1 according to the embodiment is a serial scan type (serial printing type) liquid discharge apparatus, and includes a main body 2 and a support stand 3 that supports the main body 2. The liquid discharge apparatus 1 according to the embodiment is a large format printer (large format printer) which can perform serial printing on a medium (printing medium) having a width of A3 short side width (297 mm) or more, that is, can perform serial printing with a printing width of A3 short side width (297 mm) or more. However, the liquid discharge apparatus 1 may not necessarily a large format printer. In addition, in the embodiment, in the liquid discharge apparatus 1, a moving direction of a carriage 24 is defined as a main scanning direction X, a transport direction of a printing medium P is defined as an auxiliary scanning direction Y, and a perpendicular direction is defined as Z. In addition, the main scanning direction X, the auxiliary scanning direction Y, and the perpendicular direction Z are described in the drawings as three axes orthogonal to each other, but the arrangement relationship of each configuration is not necessarily limited to those orthogonal to each other.

As illustrated in FIG. 1, the main body 2 of the liquid discharge apparatus 1 includes: a supply unit 4 which supplies the printing medium P (for example, roll paper); a head unit 20 which discharges ink droplets onto the printing medium P, and performs printing on the printing medium P; a discharge unit 6 which discharges the printing medium P printed by the head unit 20 to the outside of the main body 2; an operating unit 7 which performs operations, such as execution and stopping of printing; and an ink storage unit 8 which stores the discharged ink (liquid). In addition, although not illustrated, a USB port and a power source port are disposed on a rear surface of the liquid discharge apparatus 1. In other words, the liquid discharge apparatus is configured to be capable of being connected to a computer or the like via the USB port.

The head unit 20 is configured to include a carriage 24 and a head 21 loaded on the carriage 24 so as to oppose the printing medium (roll paper) P.

The head 21 is a liquid discharge head for discharging the ink droplets (liquid droplets) from a large number of nozzles. More specifically, the head 21 includes a piezoelectric element 60 (refer to FIGS. 4 and 5) which is a driving element, and a driving signal is applied to the piezoelectric element 60 to drive the piezoelectric element 60, and accordingly, the ink (liquid) is discharged.

Figure 2:
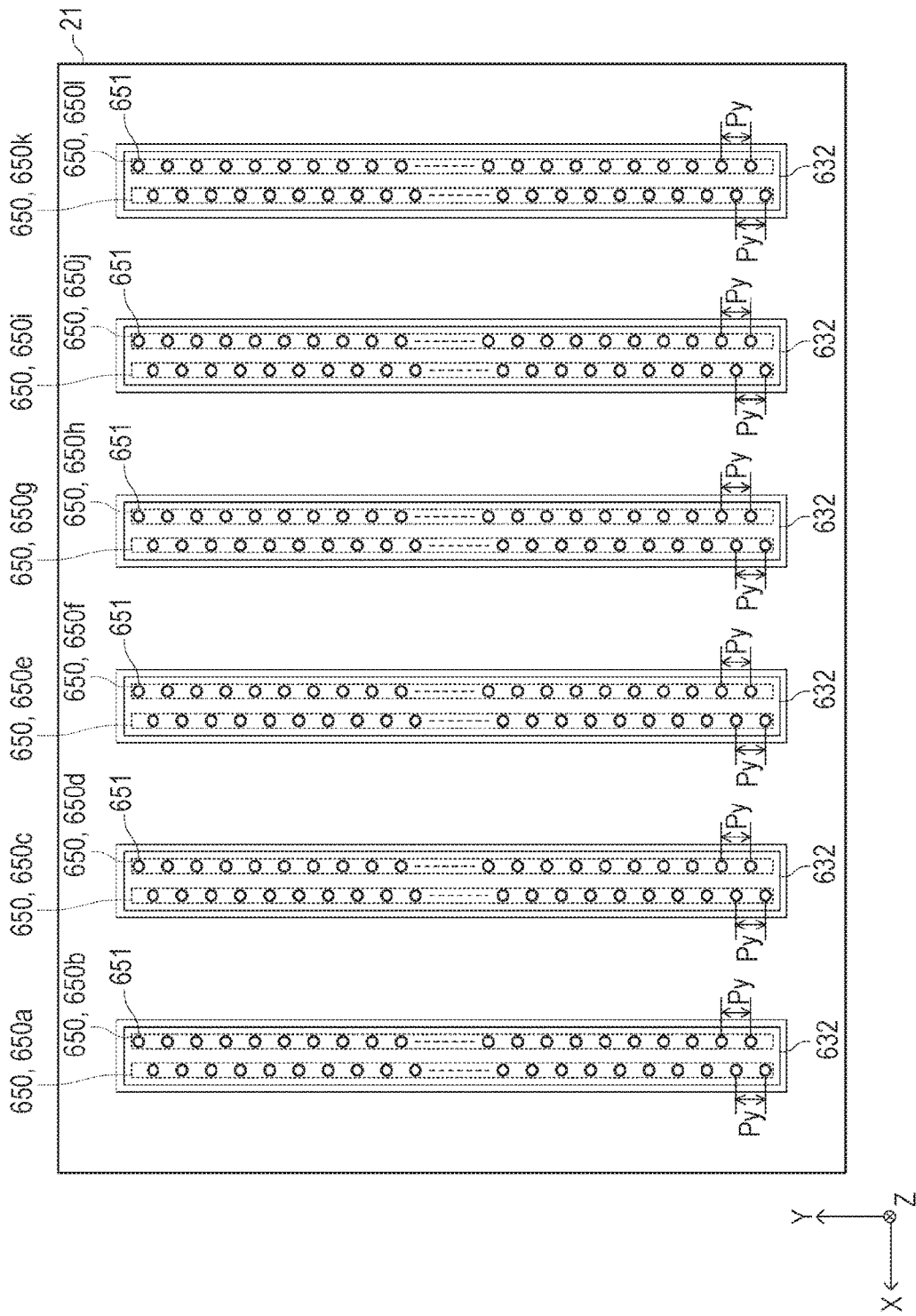
FIG. 2 is a view illustrating a lower surface (ink discharge surface) of a head.

FIG. 2 is a view illustrating a lower surface (ink discharge surface) of the head 21. As illustrated in FIG. 2, on the ink discharge surface of the head 21, six nozzle plates 632 respectively having two nozzle rows 650 in which a large number of nozzles 651 are arranged at a predetermined pitch Py along the auxiliary scanning direction Y are provided to be arranged along the main scanning direction X. Between the two nozzle rows 650 provided in each of the nozzle plates 632, each of the nozzles 651 is shifted by half of the pitch Py in the auxiliary scanning direction Y. In this manner, in the embodiment, 12 nozzle rows 650 (first nozzle row 650*a* to twelfth nozzle row 650*l*) are provided on the ink discharge surface of the head 21.

The carriage 24 is supported by a carriage guide shaft 32 and moves (reciprocates) in the main scanning direction X, and at this time, the printing medium P is transported in the auxiliary scanning direction Y. In other words, in the liquid discharge apparatus 1 according to the embodiment, the head unit 20 provided with the carriage 24 on which the head 21 that discharges the ink droplets is loaded performs serial printing in which the head unit 20 moves (reciprocates) in the main scanning direction X and performs printing.

A plurality of ink cartridges 22 are attached to the ink storage unit 8, and each of the ink cartridges 22 is filled with the ink having a corresponding color. In FIG. 1, four ink cartridges 22 that correspond to four colors, such as C (cyan), M (magenta), Y (yellow), and B (black), are illustrated, but the ink cartridge 22 is not limited to the configuration, and for example, five or more ink cartridges may be provided in the ink storage unit 8, and ink cartridges 22 that correspond to colors, such as gray, green, and violet may be provided. The ink contained in each of the ink cartridges 22 is supplied to the head 21 via an ink tube 9. In addition, the liquid discharge apparatus 1 may have a configuration in which the plurality of ink cartridges 22 are attached to the carriage 24.

Figure 3:
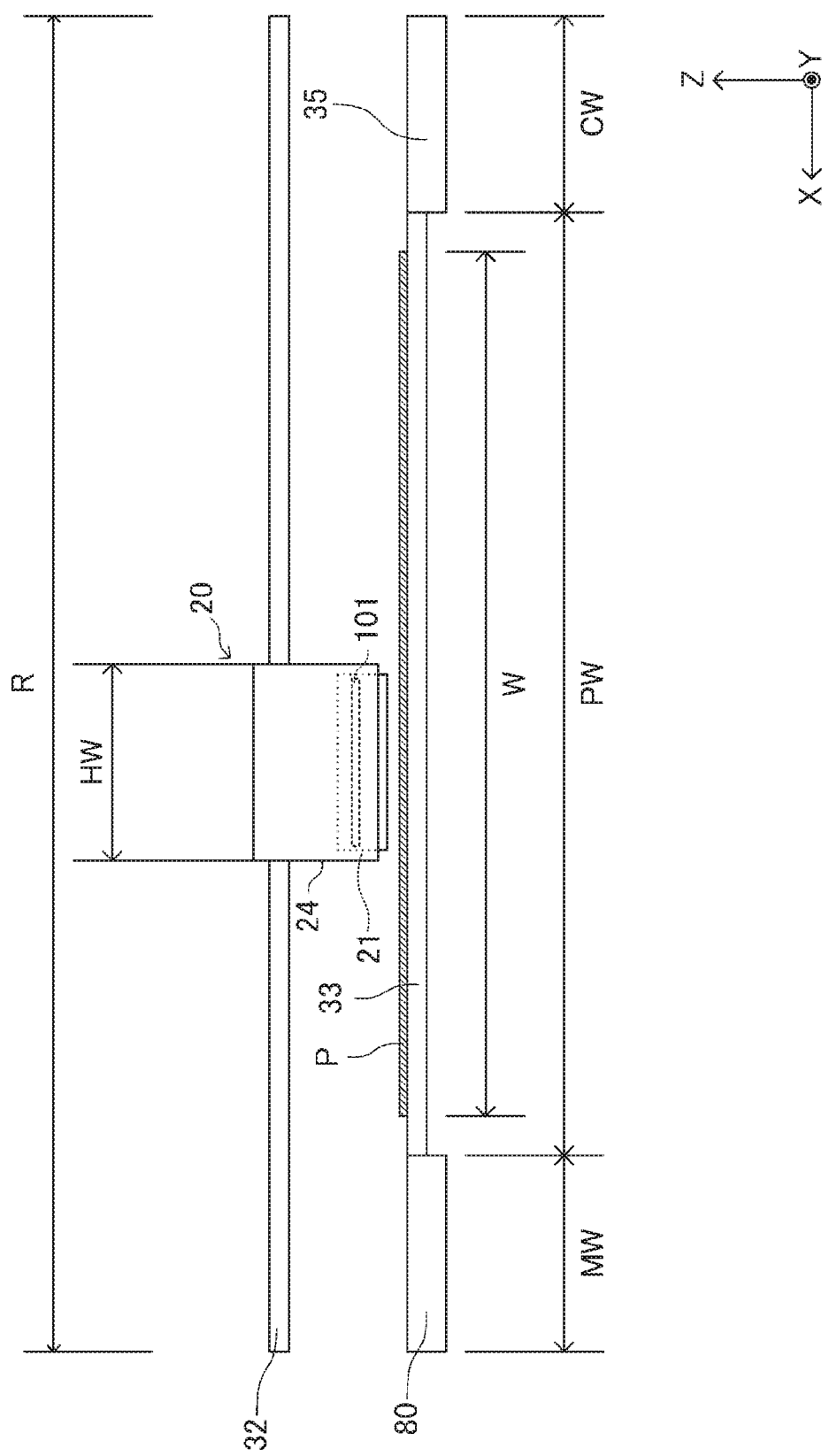
FIG. 3 is a view schematically illustrating an internal configuration of the liquid discharge apparatus.

FIG. 3 is a view schematically illustrating an internal configuration when the liquid discharge apparatus 1 is viewed in a negative direction of the auxiliary scanning direction Y (a direction opposite to a direction in which the printing medium P is transported from the upstream side to the downstream side). As illustrated in FIG. 3, the liquid discharge apparatus 1 includes the head unit 20, the carriage guide shaft 32, a platen 33, a capping mechanism 35, and a maintenance mechanism 80.

The head unit 20 moves (reciprocates) within the range of a movable region R along the carriage guide shaft 32 based on the control of a carriage moving mechanism (not illustrated). A head substrate 101 is loaded on the head 21, and the ink discharge surface of the head 21 opposes the printing medium P.

A roller (not illustrated) for transporting the printing medium P is provided on the platen 33 to transport the printing medium P in the auxiliary scanning direction Y and holds the printing medium P when the ink droplets are discharged onto the printing medium P. In other words, the maximum width (hereinafter, referred to as "maximum printing width") by which the serial printing by the head unit 20 of the liquid discharge apparatus 1 is possible is equivalent to a platen width PW which is a width of the platen 33 in the main scanning direction X. The platen width PW is set to be wider than a standard dimension Ws of a medium width W which is a width of the printing medium P in the main scanning direction X in order to stably hold and transport the printing medium P.

The capping mechanism 35 which seals a nozzle forming surface (ink discharge surface) of the head 21 is provided at a home position which is a starting point of movement (reciprocating movement) of the head unit 20. The home position is also a position at which the head unit 20 is caused to stand by when the liquid discharge apparatus 1 is not executing the printing. In other words, it is preferable that a capping mechanism width CW which is a width of the home position (capping mechanism 35) in the main scanning direction X be equal to or greater than a head unit width HW which is a width of the head unit 20 in the main scanning direction X.

In addition, in the movable region R of the head unit 20, the maintenance mechanism 80 is provided at a position farthest from the home position. As maintenance processing, the maintenance mechanism 80 performs cleaning processing (pumping processing) for suctioning thickened ink, air bubbles or the like in a discharge unit 600 with a tube pump (not illustrated), or wiping processing for wiping foreign matters, such as paper dust adhering to the vicinity of the nozzle with a wiper. During the execution of the maintenance processing, it is preferable that the head unit 20 and the platen 33 that serves as a printing region do not overlap each other when viewed from the perpendicular direction Z. In other words, it is preferable that a maintenance mechanism width MW which is a width of the maintenance mechanism 80 in the main scanning direction X be equal to or greater than the head unit width HW which is a width of the head unit 20 in the main scanning direction X.

2. Electric Configuration of Liquid Discharge Apparatus

Figure 4:
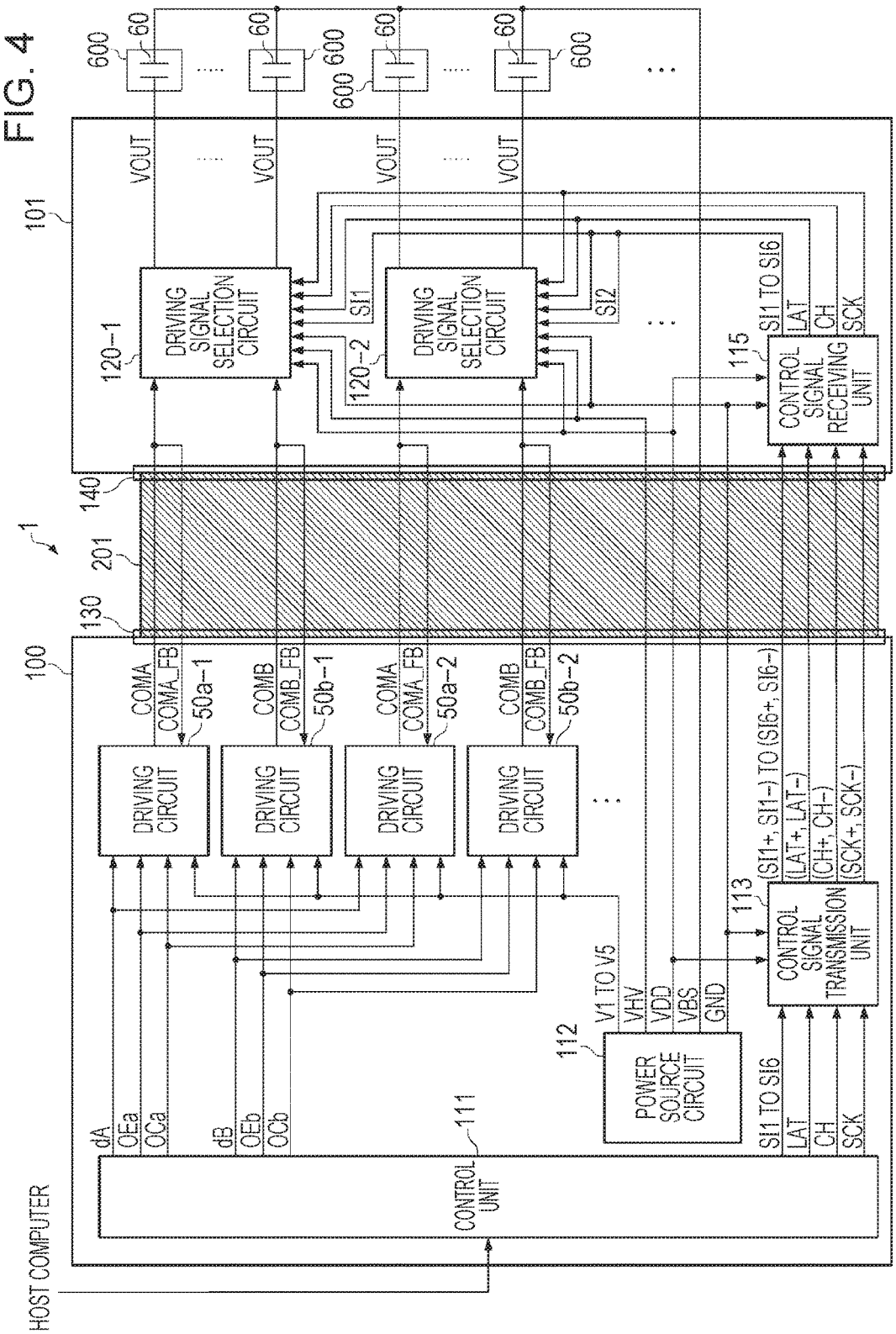
FIG. 4 is a block diagram illustrating an electric configuration of the liquid discharge apparatus.

FIG. 4 is a block diagram illustrating an electric configuration of the liquid discharge apparatus 1 according to the embodiment. As illustrated in FIG. 4, the liquid discharge apparatus 1 includes a control substrate 100 and a head substrate 101. The control substrate 100 is fixed at a predetermined position on the inside of the main body 2 (refer to FIG. 1), and the head substrate 101 is loaded on the carriage 24 of the head unit 20.

In the control substrate 100, a control unit 111, a power source circuit 112, a control signal transmission unit 113, and a plurality of (here, 12) driving circuits 50a-1 to 50a-6 and 50b-1 to 50b-6 are provided (mounted). In addition, in FIG. 4, only four driving circuits 50a-1, 50a-2, 50b-1, and 50b-2 among the 12 driving circuits are illustrated. In addition, the control substrate 100 is provided with a connector 130 to which one end of a cable 201 is connected.

The control unit 111 is realized by a processor, such as a microcontroller, and generates various types of data and signals based on various signals, such as image data supplied from the host computer.

Specifically, based on various signals from the host computer, respectively, the control unit 111 generates driving data dA and dB which are digital data that serve as an original of the driving signals COMA and COMB for driving each of the discharge units 600 included in the head 21. The driving data dA is supplied to the driving circuits 50a-to 50a-6, and the driving data dB is supplied to the driving circuits 50b-1 to 50b-6. The driving data dA is digital data that defines the waveform of the driving signal COMA, and the driving data dB is digital data that defines the waveform of the driving signal COMB.

In addition, the control unit 111 generates control signals OEa and OCa based on the driving data dA and generates control signals OEb and OCb based on the driving data dB. The control signals OEa and OCa are signals which are logic levels that correspond to a voltage change of the waveform of the driving signal COMA defined by the driving data dA, and the details thereof will be described later. Similarly, the control signals OEb and OCb are signals which are logic levels that correspond to a voltage change of the waveform of the driving signal COMB defined by the driving data dB, and the details thereof will be described later.

In addition, the control unit 111 generates six printing data signals SI1 to SI6, a latch signal LAT, a change signal CH, and a clock signal SCK as the plural kinds of control signals for controlling the discharge of liquid from each of the discharge units 600 based on various signals from the host computer, and outputs the signals to the control signal transmission unit 113.

In addition to the above-described processing, the control unit 111 performs processing for grasping a scanning position (current position) of the carriage 24 (head unit 20) and driving a carriage motor (not illustrated) based on a scanning position of the carriage 24. Accordingly, the movement of the carriage 24 in the main scanning direction X is controlled. Further, the control unit 111 performs processing for driving a transport motor (not illustrated). Accordingly, the movement of the printing medium P in the auxiliary scanning direction Y is controlled.

Furthermore, the control unit 111 causes the maintenance mechanism 80 (refer to FIG. 3) to execute maintenance processing (cleaning processing (pumping processing) or wiping processing) for correctly recovering a discharge state of the ink of the head 21.

The power source circuit 112 generates a constant high power source voltage VHV (for example, 42 V), a constant low power source voltage VDD (for example, 3.3 V), a constant offset voltage VBS (for example, 6 V), and a ground voltage GND (0 V). Furthermore, the power source circuit 112 generates 5 kinds of power source voltages V1 to V5 which are different from each other. The power source voltage V2 is higher than the power source voltage V1, the power source voltage V3 is higher than the power source voltage V2, the power source voltage V4 is higher than the power source voltage V3, and the power source voltage V5 is higher than the power source voltage V4. The power source voltage V1 is equal to or higher than the ground voltage GND, and the power source voltage V5 is equal to or lower than the high power source voltage VHV. Hereinafter, the power source voltage V1 is assumed to be the same as the ground voltage GND (0 V), and the power source voltage V5 is assumed to be the same as the high power source voltage VHV (for example, 42 V). Further, the power source voltages V2 to V4 are respectively voltages (for example, 10.5 V, 21 V, and 31.5 V, respectively) obtained by dividing the voltage of the difference between the high power source voltage VHV and the ground voltage GND into four equal parts.

The control signal transmission unit 113 operates as the low power source voltage VDD and the ground voltage GND are supplied, and converts the 6 printing data signals SI1 to SI6 output from the control unit 111 respectively into differential signals (SI1+, SI1−) to (SI6+, SI6−). In addition, the control signal transmission unit 113 outputs the latch signal LAT, the change signal CH, and the clock signal SCK which are output from the control unit 111 respectively as differential signals (LAT+, LAT−), (CH+, CH−), (SCK+, SCK−). The control signal transmission unit 113 generates a differential signal of, for example, a low voltage differential signaling (LVDS) transfer system. Since the amplitude of the differential signal of the LVDS transfer system is approximately 350 mV, high-speed data transfer can be realized. In addition, the control signal transmission unit 113 may generate differential signals of various high-speed transfer systems, such as low voltage positive emitter coupled logic (LVPECL) or current mode logic (CML), other than LVDS.

The driving circuits 50a-1 to 50a-6 respectively operate as the power source voltages V1 to V5 are supplied, and generate the driving signal COMA based on the driving data dA and the control signals OEa and OCa which are output from the control unit 111. In addition, the driving circuits 50b-1 to 50b-6 respectively operate as the power source voltages V1 to V5 are supplied, and generate the driving signal COMB based on the driving data dB and the control signals OEb and OCb which are output from the control unit 111.

In addition, the driving circuits 50a-1 to 50a-6 and 50b-1 to 50b-6 may differ only in the input driving data and the driving signal to be output, the circuit configuration may be the same as each other, and the details thereof will be described later.

The driving signals COMA generated by each of the driving circuits 50a-1 to 50a-6 and the driving signal COMB generated by each of the driving circuits 50b-1 to 50b-6 are transferred from the control substrate 100 to the head substrate 101 by the cable 201. Further, the high power source voltage VHV, the low power source voltage VDD, the offset voltage VBS, the ground voltage GND, and the differential signals (SI1+, SI1−) to (SI6+, SI6−), (LAT+, LAT−), (CH+, CH−), and (SCK+, SCK−) are also transferred from the control substrate 100 to the head substrate 101 by the cable 201. The cable 201 may be, for example, a flexible flat cable (FFC).

On the head substrate 101, a control signal receiving unit 115 and 6 driving signal selection circuits 120-1 to 120-6 are provided (mounted). In addition, the head substrate 101 is provided with a connector 140 to which the other end of the cable 201 is connected.

The control signal receiving unit 115 operates as the low power source voltage VDD and the ground voltage GND are supplied, receives the differential signals (SI1+, SI1−) to (SI6+, SI6−), (LAT+, LAT−), (CH+, CH−), and (SCK+, SCK−) of the LVDS transfer system and differentially amplifies the signals, and converts the signals into single-ended printing data signals SI1 to SI6, the latch signal LAT, the change signal CH, and the clock signal SCK. In addition, the control signal receiving unit 115 may receive differential signals of various high-speed transfer systems, such as LVPECL and CML, other than LVDS.

In addition, the printing data signals SI1 to SI6 are supplied to the driving signal selection circuits 120-1 to 120-6, respectively. Further, the latch signal LAT, the change signal CH, and the clock signal SCK are supplied in common to the driving signal selection circuits 120-1 to 120-6.

The driving signal selection circuits 120-1 to 120-6 operate as the high power source voltage VHV, the low power source voltage VDD, and the ground voltage GND are supplied, and output driving signals VOUT respectively to any of the plurality of discharge units 600 that discharge the ink from a plurality of nozzles in the head 21. Specifically, the driving signal selection circuits 120-1 to 120-6 respectively select any of the driving signal COMA and the driving signal COMB and output the selected signal as the driving signal VOUT based on the clock signal SCK, the printing data signals SI1 to SI6, the latch signal LAT, and the change signal CH, or the output is set to high impedance without selecting any of the driving signal COMA and the driving signal COMB. In addition, the circuit configurations of the driving signal selection circuits 120-1 to 120-6 may be the same as each other, and details thereof will be described later.

The driving signal VOUT output from the driving signal selection circuit 120-1 is applied to one end of the piezoelectric element 60 of each discharge unit 600 provided corresponding to the first nozzle row 650*a* and the second nozzle row 650*b*. In addition, the driving signal VOUT output from the driving signal selection circuit 120-2 is applied to one end of the piezoelectric element 60 of each of the discharge units 600 provided corresponding to the third nozzle row 650*c* and the fourth nozzle row 650*d*. In addition, the driving signal VOUT output from the driving signal selection circuit 120-3 is applied to one end of the piezoelectric element 60 of each of the discharge units 600 provided corresponding to the fifth nozzle row 650*e* and the sixth nozzle row 650*f*. In addition, the driving signal VOUT output from the driving signal selection circuit 120-4 is applied to one end of the piezoelectric element 60 of each of the discharge units 600 provided corresponding to the seventh nozzle row 650*g* and the eighth nozzle row 650*h*. In addition, the driving signal VOUT output from the driving signal selection circuit 120-5 is applied to one end of the piezoelectric element 60 of each of the discharge units 600 provided corresponding to the ninth nozzle row 650*i* and the tenth nozzle row 650*j*. In addition, the driving signal VOUT output from the driving signal selection circuit 120-6 is applied to one end of the piezoelectric element 60 of each of the discharge units 600 provided corresponding to the eleventh nozzle row 650*k* and the twelfth nozzle row 650*l*.

The offset voltage VBS transferred by the cable 201 is supplied to each of the other ends of the piezoelectric elements 60 of all the discharge units 600.

Each of the piezoelectric elements 60 is provided corresponding to each of the discharge units 600, and is displaced when the driving signal VOUT (driving signals COMA and COMB) is applied. In addition, each of the piezoelectric elements 60 is displaced in accordance with a potential difference between the driving signal VOUT (driving signals COMA and COMB) and the offset voltage VBS to discharge the liquid (ink). In this manner, the driving signals COMA and COMB are signals for driving each of the discharge units 600 to discharge the liquid, and the head unit 20 (head 21) discharges the liquid (ink) in accordance with the driving signals COMA and COMB.

In addition, in the embodiment, each of the driving signals COMA transferred from the control substrate 100 to the head substrate 101 by the cable 201 are transferred from the head substrate 101 to the control substrate 100 by the cable 201, and is respectively fed back to the driving circuits 50*a*-1 to 50*a*-6 as a feedback driving signal COMA_FB. Similarly, each of the driving signals COMB transferred from the control substrate 100 to the head substrate 101 by the cable 201 are transferred from the head substrate 101 to the control substrate 100 by the cable 201, and is respectively fed back to the driving circuits 50*b*-1 to 50*b*-6 as a feedback driving signal COMB_FB. In addition, as will be described later, the driving circuits 50*a*-1 to 50*a*-6 use the feedback driving signal COMA_FB to generate the driving signal COMA, and the driving circuits 50*b*-1 to 50*b*-6 use the feedback driving signal COMB_FB to generate the driving signal COMB.

3. Configuration of Discharge Unit

Figure 5:
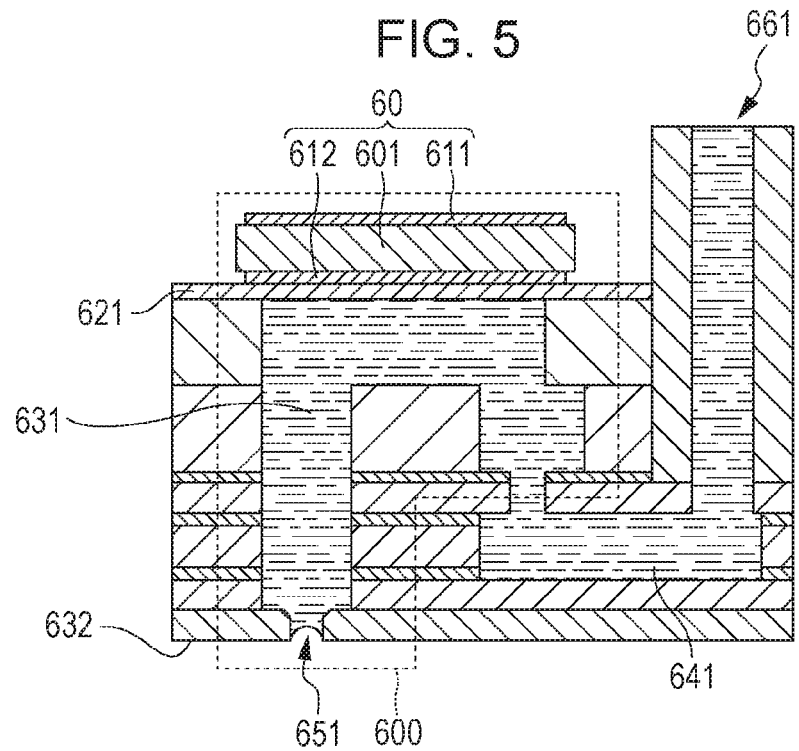
FIG. 5 is a view illustrating a schematic configuration that corresponds to one discharge unit.

FIG. 5 is a view illustrating a schematic configuration that corresponds to one discharge unit 600 included in the head 21. As illustrated in FIG. 5, the head 21 includes the discharge unit 600 and a reservoir 641.

The reservoir 641 is provided for each color of ink, and the ink is introduced into the reservoir 641 from a supply port 661. In addition, the ink is supplied from the ink storage unit 8 to the supply port 661 via the ink tube 9.

The discharge unit 600 includes the piezoelectric element 60, a diaphragm 621, a cavity (pressure chamber) 631, and a nozzle 651. Among the members, the diaphragm 621 functions as a diaphragm that is displaced (bending vibration) by the piezoelectric element 60 provided on the upper surface in the drawing, and enlarges and reduces the internal volume of the cavity 631 filled with ink. The nozzle 651 is an opening portion which is provided on the nozzle plate 632 and communicates with the cavity 631. The inside of the cavity 631 is filled with the liquid (for example, ink), and the internal volume changes due to the displacement of the piezoelectric element 60. The nozzle 651 communicates with the cavity 631 and discharges the liquid in the cavity 631 as the liquid droplets in accordance with the change in internal volume of the cavity 631.

The piezoelectric element 60 illustrated in FIG. 5 has a structure in which a piezoelectric body 601 is sandwiched between one pair of electrodes 611 and 612. In the piezoelectric body 601 having the structure, in accordance with the voltage applied by the electrodes 611 and 612, the central part in FIG. 5 together with the electrodes 611 and 612 and the diaphragm 621 is bent in a vertical direction with respect to both end parts. Specifically, the driving signal VOUT is applied to the electrode 611 which is one end of the piezoelectric element 60, and the offset voltage VBS is applied to the electrode 612 which is the other end of the piezoelectric element 60. In addition, while the piezoelectric element 60 is bent in an upward direction when the voltage of the driving signal VOUT decreases, the piezoelectric element 60 is bent in a downward direction when the voltage of the driving signal VOUT increases. In the configuration, since the internal volume of the cavity 631 expands when the piezoelectric element 60 bends in the upward direction, the ink is drawn from the reservoir 641. Meanwhile, when piezoelectric element 60 is bent in the downward direction, the internal volume of the cavity 631 is reduced, and thus, the ink is discharged from the nozzle 651 as much as the reduction of the internal volume.

In addition, the piezoelectric element 60 is not limited to the illustrated structure and may be of any type as long as the piezoelectric element 60 can be deformed and the liquid, such as ink, can be discharged. Further, the piezoelectric element 60 is not limited to bending vibration, and may employ a configuration in which so-called longitudinal vibration is used.

In addition, the piezoelectric element 60 is provided corresponding to the cavity 631 and the nozzle 651 in the head 21, and is also provided corresponding to a selection unit 230 (refer to FIG. 8) which will be described later. Therefore, a set of the piezoelectric element 60, the cavity 631, the nozzle 651, and the selection unit 230 is provided for each of the nozzles 651.

4. Configuration of Driving Signal

As a method of forming dots on the printing medium P, in addition to a method of discharge the ink droplet one time to form one dot, as a method in which the ink droplets can be discharged two or more times in a unit period, there are a method (second method) of forming one dot by causing one or more ink droplets discharged in the unit period to land and combining the one or more ink droplets that have landed, or a method (third method) of forming two or more dots without combining the two or more ink droplets.

In the embodiment, according to the second method, by discharging the ink two times at most for one dot, 4 gradations of "large dot", "medium dot", "small dot", and "non-recording (no dot)" are expressed. In order to express the four gradations, in the embodiment, two types of driving signals COMA and COMB are prepared, and each has a first half pattern and a second half pattern in one cycle. The driving signals COMA and COMB are selected (or not selected) in accordance with the gradation to be expressed in the first half and the second half of one cycle and are supplied to the piezoelectric element 60.

Figure 6:
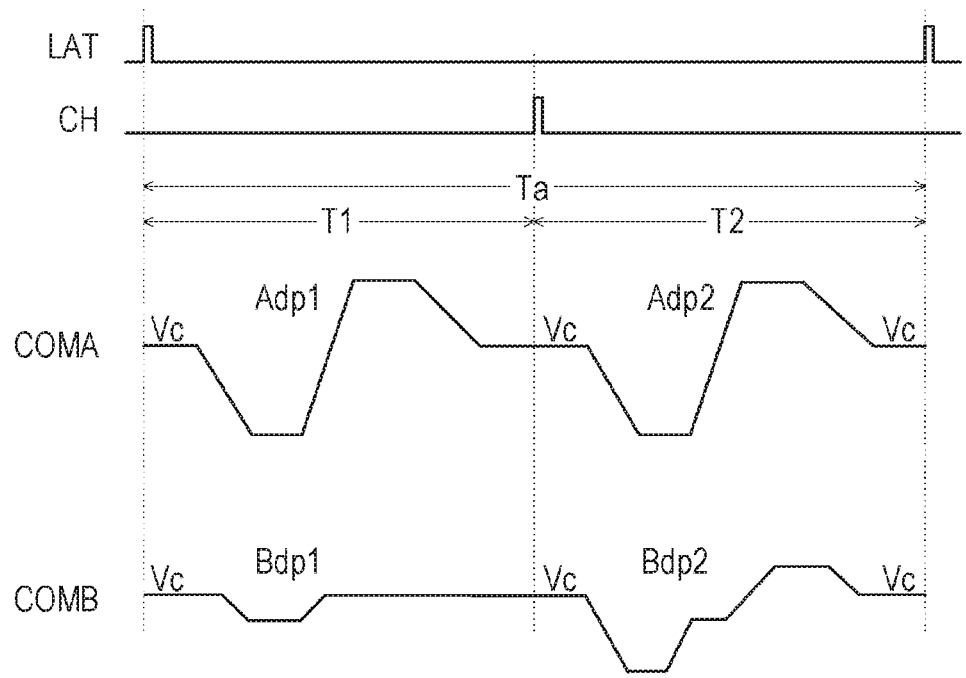
FIG. 6 is a view illustrating waveforms of driving signals.

FIG. 6 is a view illustrating waveforms of driving signals COMA and COMB. As illustrated in FIG. 6, the driving signal COMA has a waveform in which a trapezoidal waveform Adp1 disposed in a period T1 from the rise of the latch signal LAT to the rise of the change signal CH, and a trapezoid waveform Adp2 disposed in a period T2 from the rise of the change signal CH to the rise of the next latch signal LAT are continuous to each other. A new dot is formed on the printing medium P every cycle Ta, with a period including the period T1 and the period T2 as a cycle Ta.

In the embodiment, the trapezoidal waveforms Adp1 and Adp2 are substantially the same waveform, and when each of the waveforms is supplied to one end of the piezoelectric element 60, the trapezoidal waveforms Adp1 and Adp2 are waveforms that respectively discharge a predetermined amount of ink from the nozzle 651 that corresponds to the piezoelectric element 60, specifically, a moderate amount.

The driving signal COMB has a waveform in which a trapezoidal waveform Bdp1 disposed in the period T1 and a trapezoid waveform Bdp2 disposed in the period T2 are continuous to each other. In the embodiment, the trapezoidal waveforms Bdp1 and Bdp2 are waveforms different from each other. Among the waveforms, the trapezoidal waveform Bdp1 is a waveform for slightly vibrating the ink in the vicinity of the opening portion of the nozzle 651 to prevent an increase in viscosity of the ink. Therefore, even when the trapezoidal waveform Bdp1 is supplied to one end of the piezoelectric element 60, no ink droplet is discharged from the nozzle 651 that corresponds to the piezoelectric element 60. Further, the trapezoidal waveform Bdp2 has a waveform different from the trapezoidal waveform Adp1 (Adp2). When the trapezoidal waveform Bdp2 is supplied to one end of the piezoelectric element 60, the trapezoidal waveform Bdp2 is a waveform which discharges the ink having an amount that is smaller than the above-described predetermined amount from the nozzle 651 that corresponds to the piezoelectric element 60.

In addition, both the voltage at the start timing of the trapezoidal waveforms Adp1, Adp2, Bdp1, and Bdp2 and the voltage at the end timing are common to the voltage Vc. In other words, the trapezoidal waveforms Adp1, Adp2, Bdp1, and Bdp2 respectively have a waveform that starts at the voltage Vc and ends at the voltage Vc.

Figure 7:
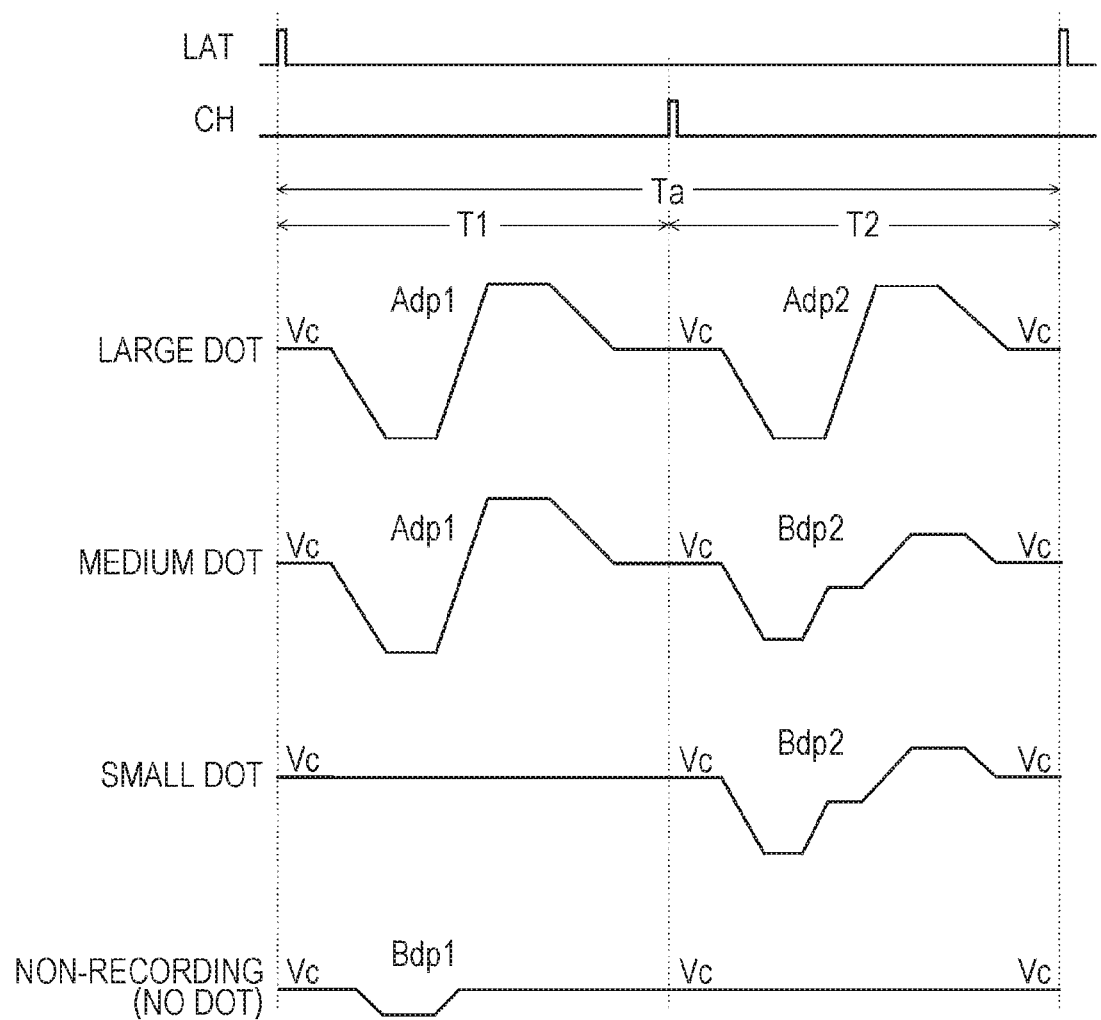
FIG. 7 is a view illustrating a waveform of the driving signal.

FIG. 7 is a view illustrating waveforms of driving signals VOUT that correspond to "large dot", "medium dot", "small dot", and "non-recording", respectively.

As illustrated in FIG. 7, the driving signal VOUT that corresponds to the "large dot" has a waveform in which the trapezoidal waveform Adp1 of the driving signal COMA in the period T1 and the trapezoidal waveform Adp2 of the driving signal COMA in the period T2 are continuous to each other. When the driving signal VOUT is supplied to one end of the piezoelectric element 60, in the cycle Ta, a medium amount of ink is discharged two times from the nozzle 651 that corresponds to the piezoelectric element 60. Therefore, the ink respectively land on the printing medium P and are integrated with each other, and a large dot is formed.

The driving signal VOUT that corresponds to the "medium dot" has a waveform in which the trapezoidal waveform Adp1 of the driving signal COMA in the period T1 and the trapezoidal waveform Bdp2 of the driving signal COMB in the period T2 are continuous to each other. When the driving signal VOUT is supplied to one end of the piezoelectric element 60, in the cycle Ta, medium and small amounts of ink are discharged two times from the nozzle 651 that corresponds to the piezoelectric element 60. Therefore, the ink respectively land on the printing medium P and are integrated with each other, and a medium dot is formed.

The driving signal VOUT that corresponds to the "small dot" is the voltage Vc immediately before being held by the capacitive properties of the piezoelectric element 60 in the period T1, and has the trapezoidal waveform Bdp2 of the driving signal COMB in the period T2. When the driving signal VOUT is supplied to one end of the piezoelectric element 60, in the cycle Ta, a small amount of ink is discharged only in the period T2 from the nozzle 651 that corresponds to the piezoelectric element 60. Therefore, the ink lands on the printing medium P, and a small dot is formed.

The driving signal VOUT that corresponds to "non-recording" is the trapezoidal waveform Bdp1 of the driving signal COMB in the period T1 and is the voltage Vc immediately before being held by the capacitive properties of the piezoelectric element 60 in the period T2. When the driving signal VOUT is supplied to one end of the piezoelectric element 60, in the cycle Ta, the nozzle 651 that corresponds to the piezoelectric element 60 only slightly vibrates in the period T2, and no ink is discharged. Therefore, the ink does not land on the printing medium P, and no dot is formed.

5. Configuration of Driving Signal Selection Circuit

Figure 8:
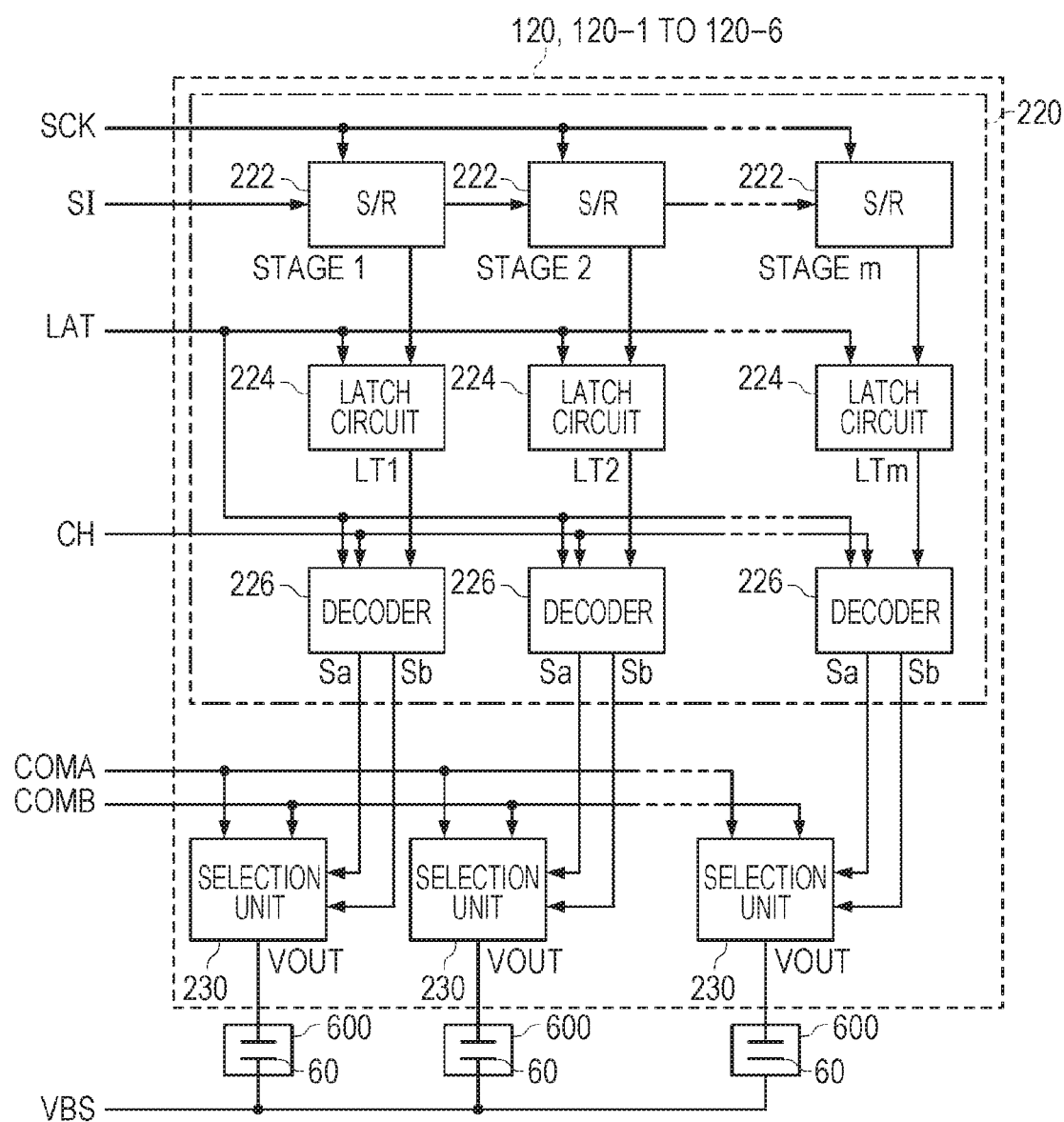
FIG. 8 is a view illustrating a configuration of a driving signal selection circuit.

FIG. 8 is a view illustrating a configuration of the driving signal selection circuits 120 (120-1 to 120-6). As illustrated in FIG. 8, the driving signal selection circuit 120 includes a selection control unit 220 and a plurality of selection units 230.

The clock signal SCK, the printing data signals SI (SI1 to SI6), the latch signal LAT, and the change signal CH are supplied to the selection control unit 220. In the selection control unit 220, a set of a shift register (S/R) 222, a latch circuit 224, and a decoder 226 is provided corresponding to each of the piezoelectric elements 60 (nozzles 651). In other words, the number of sets of the shift register (S/R) 222, the latch circuit 224, and the decoder 226 included in one driving signal selection circuit 120 is the same as the total number m of the nozzles 651 included in the two nozzle rows 650.

The printing data signal SI is a signal of 2 m bits in total including 2 bits of printing data (SIH, SIL) for selecting one of "large dot", "medium dot", "small dot", and "non-recording" with respect to each of m discharge units 600 (piezoelectric elements 60).

The printing data signal SI is a signal synchronized with the clock signal SCK, and corresponding to the nozzle 651, for each piece of the printing data (SIH, SIL) for 2 bits included in the printing data signal SI, a configuration for temporarily holding the data is the shift register 222.

Specifically, the shift register 222 having the number of stages that corresponds to the piezoelectric element 60 (nozzle 651) is continuously connected to each other, and the printing data signal SI which is serially supplied is sequentially transferred to the subsequent stage according to the clock signal SCK.

In addition, in order to distinguish the shift register 222, the shift register 222 is denoted as stage 1, stage 2, . . . , stage m in order from the upstream side to which the printing data signal SI is supplied.

Each of the m latch circuits 224 latches the 2-bit printing data (SIH, SIL) held by each of the m shift registers 222 at the rise of the latch signal LAT.

Each of the m decoders 226 defines the selection by the selection unit 230 by decoding the 2-bit printing data (SIH, SIL) latched by each of the m latch circuits 224, and by outputting selection signals Sa and Sb for each of the periods T1 and T2 defined by the latch signal LAT and the change signal CH.

Figures 9, 10:
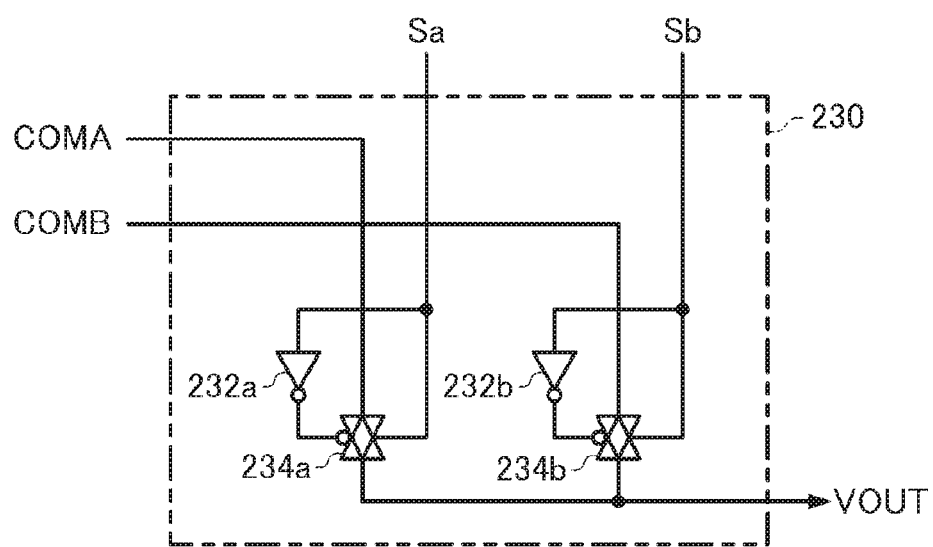
FIG. 9 is a table illustrating decode contents in a decoder.
FIG. 10 is a view illustrating a configuration of a selection unit.

FIG. 9 is a table illustrating decode contents in a decoder 226. For example, a case where the latched 2-bit printing data (SIH, SIL) is (1, 0), the decoder 226 means a case where the logic levels of the selection signals Sa and Sb are set to H and L levels in the period T1 and the logic levels are output as L and H levels in the period T2, respectively.

In addition, the logic levels of the selection signals Sa and Sb are level-shifted to high amplitude logic by a level shifter (not illustrated) than the logic levels of the clock signal SCK, the printing data signal SI, the latch signal LAT, and the change signal CH.

The selection unit 230 is provided corresponding to each of the piezoelectric elements 60 (nozzles 651). In other words, the number of selection units 230 of one driving signal selection circuit 120 is the same as the total number m of the nozzles 651 included in the two nozzle rows 650.

FIG. 10 is a view illustrating the configuration of the selection unit 230 that corresponds to one piezoelectric element 60 (nozzle 651).

As illustrated in FIG. 10, the selection unit 230 includes inverters (NOT circuits) 232a and 232b and transfer gates 234a and 234b.

While the selection signal Sa from the decoder 226 is supplied to a positive control end not marked with a circle at the transfer gate 234a, the selection signal Sa is logically inverted by the inverter 232a and is supplied to a negative control end marked with a circle at the transfer gate 234a. Similarly, while the selection signal Sb is supplied to the positive control end of the transfer gate 234b, the selection signal Sb is logically inverted by the inverter 232b, and is supplied to the negative control end of the transfer gate 234b.

The driving signal COMA is supplied to an input end of the transfer gate 234a, and the driving signal COMB is supplied to an input end of the transfer gate 234b. Output ends of the transfer gates 234a and 234b are commonly connected to each other, and the driving signal VOUT is output to the discharge unit 600 via the common connection terminal.

When the selection signal Sa is at the H level, the transfer gate 234a conducts (ON) between the input end and the output end, and when the selection signal Sa is at the L level, the transfer gate 234a makes the connection between the input end and the output end nonconductive (OFF). Similarly, the transfer gate 234b is turned on and off between the input end and the output end in accordance with the selection signal Sb.

Next, the operation of the driving signal selection circuit 120 (120-1 to 120-6) will be described with reference to FIG. 11.

The printing data signals SI (SI1 to SI6) are serially supplied in synchronization with the clock signal SCK and sequentially transferred in the shift register 222 that corresponds to the nozzles. In addition, when the supply of the clock signal SCK is stopped, a state where 2-bit printing data (SIH, SIL) that corresponds to the nozzle 651 is held in each of the shift registers 222 is achieved. Further, the printing data signal SI is supplied in order that corresponds to the nozzles on the last m stages, . . . , stage 2, and stage 1 in the shift register 222.

Here, when the latch signal LAT rises, each of the latch circuits 224 latches the 2-bit printing data (SIH, SIL) held in the shift register 222 all at once. In FIG. 11, LT1, LT2, . . . , and LTm indicate 2-bit printing data (SIH, SIL) latched by the latch circuit 224 that corresponds to the shift register 222 on stage 1, stage 2, . . . , and stages m.

The decoder 226 outputs the logic levels of the selection signals Sa and Sb in each of the periods T1 and T2 by the contents illustrated in FIG. 9, in accordance with the size of the dot defined by the latched 2-bit printing data (SIH, SIL).

In other words, in a case where the printing data (SIH, SIL) is (1, 1) and defines the size of the large dot, the decoder 226 sets the selection signals Sa and Sb to H and L levels in the period T1 and to H and L levels in the period T2. In addition, in a case where the printing data (SIH, SIL) is (1, 0) and defines the size of the medium dot, the decoder 226 sets the selection signals Sa and Sb to H and L levels in the period T1 and to L and H levels in the period T2. In addition, in a case where the printing data (SIH, SIL) is (0, 1) and defines the size of the small dot, the decoder 226 sets the selection signals Sa and Sb to L and L levels in the period T1 and to L and H levels in the period T2. In addition, in a case where the printing data (SIH, SIL) is (0, 0) and defines the non-recording, the decoder 226 sets the selection signals Sa and Sb to L and H levels in the period T1 and to L and L levels in the period T2.

When the printing data (SIH, SIL) is (1, 1), the selection signals Sa and Sb are H and L levels in the period T1, and thus, the selection unit 230 selects the driving signal COMA (trapezoidal waveform Adp1) and selects the driving signal COMA (trapezoidal waveform Adp2) since Sa and Sb are H and L levels in the period T2. As a result, the driving signal VOUT that corresponds to the "large dot" illustrated in FIG. 7 is generated.

In addition, when the printing data (SIH, SIL) is (1, 0), the selection signals Sa and Sb are H and L levels in the period T1, and thus, the selection unit 230 selects the driving signal COMA (trapezoidal waveform Adp1) and selects the driving signal COMB (trapezoidal waveform Bdp2) since Sa and Sb are L and H levels in the period T2. As a result, the driving signal VOUT that corresponds to the "medium dot" illustrated in FIG. 7 is generated.

In addition, when the printing data (SIH, SIL) is (0, 1), the selection signals Sa and Sb are L and L levels in the period T1, and thus, the selection unit 230 does not select either the driving signal COMA or COMB, and selects the driving signal COMB (trapezoidal waveform Bdp2) since Sa and Sb are L and H levels in the period T2. As a result, the driving signal VOUT that corresponds to the "small dot" illustrated in FIG. 7 is generated. In addition, in the period T1, neither the driving signal COMA nor COMB is selected, and thus, one end of the piezoelectric element 60 is open, but due to the capacitive properties of the piezoelectric element 60, the driving signal VOUT is held at the immediately previous voltage Vc.

In addition, when the printing data (SIH, SIL) is (0, 0), the selection signals Sa and Sb are L and H levels in the period T1, and thus, the selection unit 230 selects the driving signal COMB (trapezoidal waveform Bdp1) and does not select either the driving signal COMA or COMB since the selection signal Sa and Sb are L and L levels in the period T2. As a result, the driving signal VOUT that corresponds to the "non-recording" illustrated in FIG. 7 is generated. In addition, since neither the driving signals COMA nor COMB is selected in the period T2, one end of the piezoelectric element 60 is open, but due to the capacitive properties of the piezoelectric element 60, the driving signal VOUT is held at the immediately previous voltage Vc.

Figure 11:
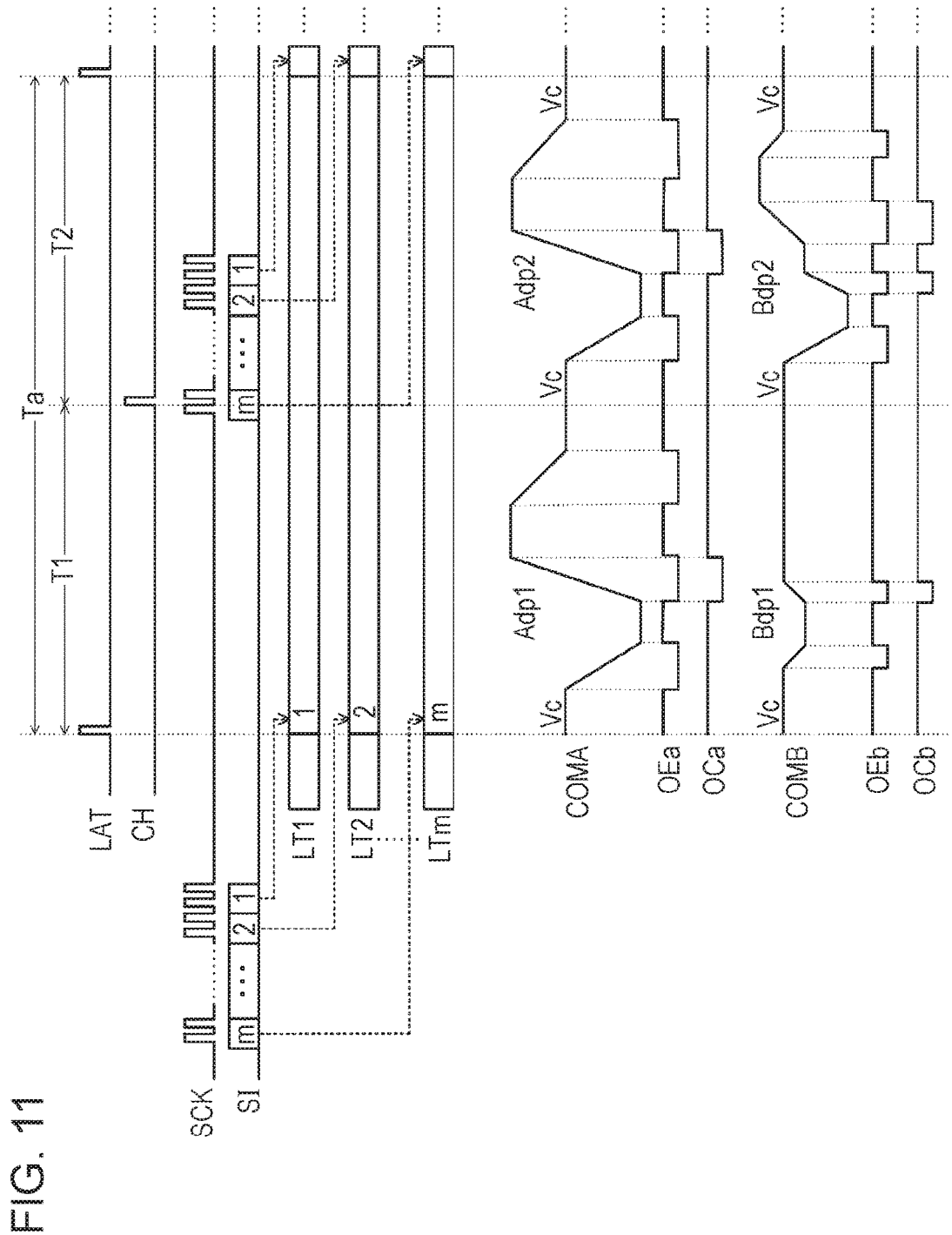
FIG. 11 is a view for describing an operation of the driving signal selection circuit.

As illustrated in FIG. 11, the control signal OEa is at a low level during a period in which the voltage decreases and a period in which the voltage increases with respect to the driving signal COMA, and is at a high level during a period (a period in which the voltage of the driving signal COMA is made constant) other than the period. Similarly, the control signal OEb is at a low level during a period in which the voltage decreases and a period in which the voltage increases with respect to the driving signal COMB, and is at a high level during a period (a period in which the voltage of the driving signal COMB is made constant) other than the period. In addition, during a period in which the voltage of the driving signal COMA changes (that is, a period in which the control signal OEa is at a low level), the control signal OCa is at a high level during a period in which the voltage decreases, and is at a low level during a period in which the voltage increases. Similarly, during a period in which the voltage of the driving signal COMB changes (that is, a period in which the control signal OEb is at a low level), the control signal OCb is at a high level during a period in which the voltage decreases, and is at a low level during a period in which the voltage increases. Conversely, the driving circuits 50a-1 to 50a-6 generate the driving signal COMA according to the control signals OEa and OCa, and the driving circuits 50b-1 to 50b-6 generate the driving signal COMB according to the control signals OEb and OCb.

In addition, the driving signals COMA and COMB illustrated in FIGS. 6 and 11 are merely examples. Actually, various combinations of waveforms prepared in advance are used in accordance with a moving speed of the head unit 20, the properties of the printing medium P, or the like.

In addition, here, an example in which the piezoelectric element 60 is bent in the upward direction as the voltage decreases is described, but, when the voltage supplied to the electrodes 611 and 612 is reversed, the piezoelectric element 60 is bent in the downward direction as the voltage decreases. Therefore, in the configuration in which the piezoelectric element 60 is bent in the downward direction as the voltage decreases, the driving signals COMA and COMB illustrated in FIGS. 6 and 11 have inverted waveforms with respect to the voltage Vc.

6. Configuration of Driving Circuit

Figure 12:
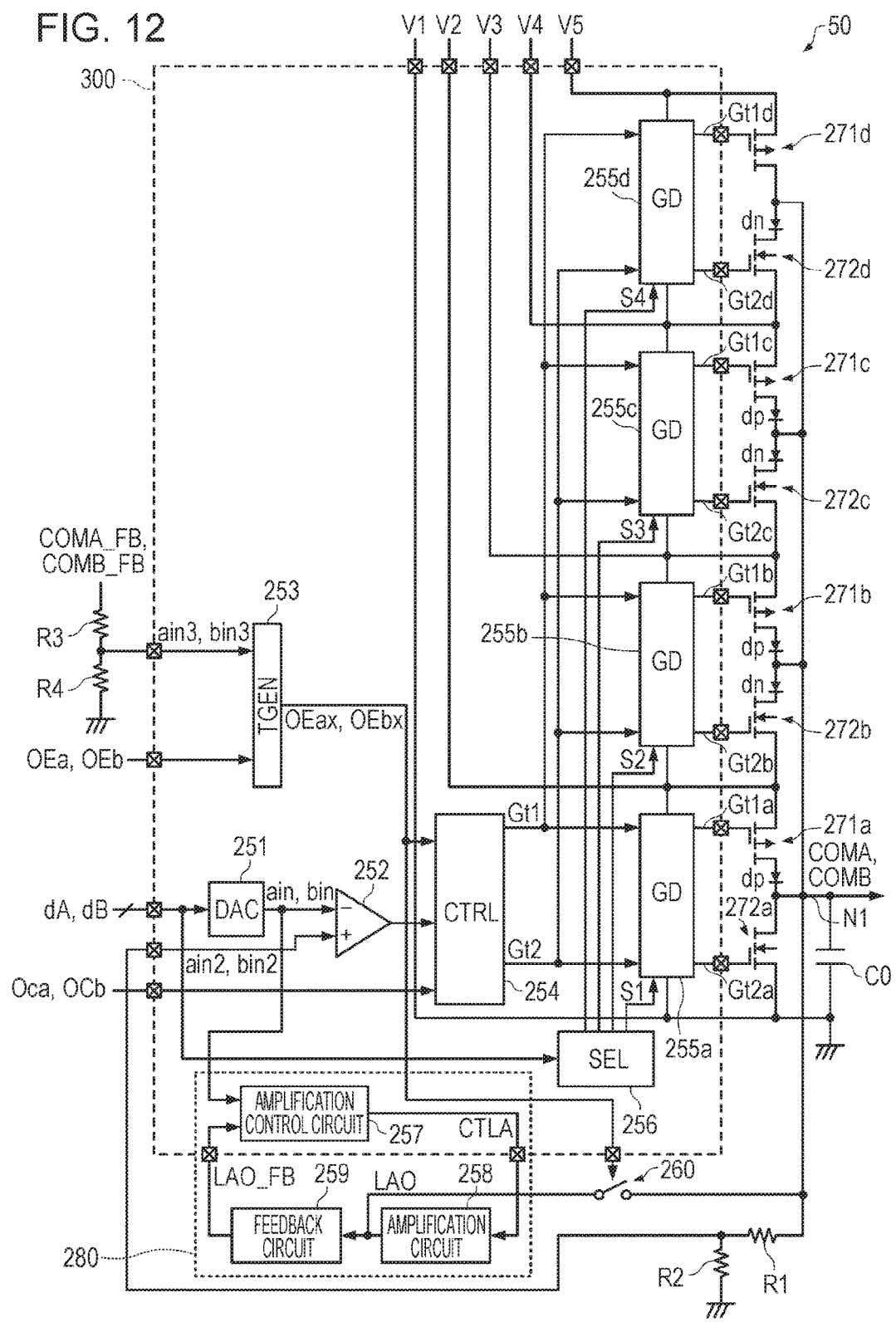
FIG. 12 is a view illustrating a configuration of a driving circuit.

Hereinafter, the driving circuits 50a-1 to 50a-6 and 50b-1 to 50b-6 are assumed to have the same configuration, and the configuration thereof will be described in detail. FIG. 12 is a view illustrating the configuration of the driving circuit 50 (50a-1 to 50a-6, 50b-1 to 50b-6). As illustrated in FIG. 12, the driving circuit 50 includes a D/A conversion circuit (DAC: Digital To Analog Converter) 251, a comparator 252, a timing signal generation circuit 253, a linear amplifier 280, a gate driver control circuit 254, gate drivers 255a, 255b, 255c, and 255d, a selector 256, a switch 260, a transistor 271a, 272a, 271b, 272b, 271c, 272c, 271d, and 272d, a capacitor C0, and resistance elements R1, R2, R3, and R4.

As described above, five types of power source voltages V1 to V5 are supplied to the driving circuit 50. Hereinafter, it is assumed that the power source voltage V1 is 0 V, the power source voltage V2 is 10.5 V, the power source voltage V3 is 21 V, the power source voltage V4 is 31.5 V, and the power source voltage V5 is 42 V.

In the embodiment, a range which is equal to or greater than the power source voltage V1 (0 V) and less than the power source voltage V2 (10.5 V) is defined as a first range, a range which is equal to or greater than the power source voltage V2 (10.5 V) and less than the power source voltage V3 (21 V) is defined as a second range, a range which is equal to or greater than the power source voltage V3 (21 V) and less than the power source voltage V4 (31.5 V) is defined as a third range, and a range which is equal to or greater than the power source voltage V4 (31.5 V) and less than the power source voltage V5 (42 V) is defined as a fourth range.

The D/A conversion circuit 251 converts the driving data dA (dB) which is a digital signal that defines the waveform of the driving signal COMA (COMB), into an original driving signal ain (bin) which is an analog signal that serves as an origin of the driving signal COMA (COMB).

The original driving signal ain (bin) is supplied to the negative input end (−) of the comparator 252, a feedback signal ain2 (bin2) is supplied to the positive input end (+), and the voltage of the original driving signal ain (bin) and the voltage of the feedback signal ain2 (bin2) are compared to each other. The feedback signal ain2 (bin2) is a signal fed back from the driving signal COMA (COMB), and more specifically, the driving signal COMA (COMB) is a signal of which the voltage is divided in accordance with a resistance ratio between a resistance element R1 and a resistance element R2. The comparator 252 outputs a high-level signal when the voltage of the feedback signal ain2 (bin2) is higher than the voltage of the original driving signal ain (bin), and outputs a low-level signal in other cases.

The timing signal generation circuit 253 generates a control signal OEax (OEbx) based on the control signal OEa (OEb) and a feedback signal ain3 (bin3). The feedback signal ain3 (bin3) is a signal which is obtained as the driving signal COMA (COMB) propagates through the cable 201 and is fed back from the head substrate 101 to the control substrate 100, and more specifically, is a signal which is obtained as the voltage of the feedback driving signal COMA_FB (COMB_FB) (refer to FIG. 4) which propagates through the cable 201 and is fed back is divided in accordance with a resistance ratio between a resistance element R3 and a resistance element R4. As described above, the control signal OEa (OEb) is a signal at a low level during a period in which the voltage of the driving signal COMA (COMB) decreases or increases, and at a high level during a period (a period in which the voltage is made constant) other than the period. In other words, the control signal OEax (OEbx) is a timing signal for controlling the period (an example of the "first period") in which the voltage of the driving signal COMA (COMB) is made constant. However, based on the driving data dA (dB), the control unit 111 (refer to FIG. 4) determines a period in which the voltage of the driving signal COMA (COMB) decreases or increases and a period other than the period, and generates the control signal OEa (OEb), and meanwhile, the driving signal COMA (COMB) applied to the piezoelectric element 60 is delayed by propagating through the cable 201 (refer to FIG. 4). Therefore, a deviation occurs between a period in which the voltage of the driving signal COMA (COMB) actually decreases or increases and a period in which the control signal OEa (OEb) is at the low level. Here, the timing signal generation circuit 253 generates a control signal OEax (OEbx) obtained by adjusting the control signal OEa (OEb) such that the voltage waveform of the driving signal COMA (COMB) and the logic level of the control signal OEa (OEb) has an appropriate relationship, based on the feedback signal ain3 (bin3) in which the feedback driving signal COMA_FB (COMB_FB) which propagates through the cable 201 and is fed back is attenuated.

The gate driver control circuit 254 outputs control signals Gt1 and Gt2 for controlling the gate drivers 255a to 255d based on the output signal of the comparator 252, the control signal OEax (OEbx), and the control signal OCa (OCb). Specifically, when the control signal OEax (OEbx) is at the low level and the control signal OCa (OCb) is at the low level, the gate driver control circuit 254 selects the output signal of the comparator 252 as the control signal Gt1 and selects the low level as the control signal Gt2. Meanwhile, when the control signal OEax (OEbx) is at the low level and the control signal OCa (OCb) is at the high level, the gate driver control circuit 254 selects the high level as the control signal Gt1 and selects the output signal of the comparator 252 as the control signal Gt2. In addition, when the control signal OEax (OEbx) is at the high level, the gate driver control circuit 254 selects the high level as the control signal Gt1 regardless of the logic level of the control signal OCa (OCb), and selects the low level as the control signal Gt2.

The selector 256 makes the gate driver 255a operable when the voltage of the driving signal COMA (COMB) is between the power source voltage V1 and the power source voltage V2 (the first range), makes the gate driver 255b operable when the voltage of the driving signal COMA (COMB) is between the power source voltage V2 and the power source voltage V3 (second range), makes the gate driver 255c operable when the voltage of the driving signal COMA (COMB) is between the power source voltage V3 and the power source voltage V4 (third range), and makes the gate driver 255d operable when the voltage of the driving signal COMA (COMB) is between the power source voltage V4 and the power source voltage V5 (fourth range). Specifically, based on the driving data dA (dB) supplied from the control unit 111 (refer to FIG. 4), the selector 256 determines whether or not the voltage of the driving signal COMA (COMB) in any one of the first range to the fourth range, and based on the determination result, the selector 256 outputs selection signals S1 to S4 for selecting and operating one of the gate drivers 255a to 255d.

More specifically, in a case where it is determined that the voltage of the driving signal COMA (COMB) is in the first range (equal to or greater than the power source voltage V1 (0 V) and less than the power source voltage V2 (10.5 V)), the selector 256 selects only the selection signal S1 to the high level and sets the selection signals S2, S3, and S4 to the low level. In addition, in a case where it is determined that the voltage of the driving signal COMA (COMB) is in the second range (equal to or greater than the power source voltage V2 (10.5 V) and less than the power source voltage V3 (21 V)), the selector 256 selects only the selection signal S2 to the high level and sets the selection signals S1, S3, and S4 to the low level. In addition, in a case where it is determined that the voltage of the driving signal COMA (COMB) is in the third range (equal to or greater than the power source voltage V3 (21 V) and less than the power source voltage V4 (31.5 V)), the selector 256 selects only the selection signal S3 to the high level and sets the selection signals S1, S2, and S4 to the low level. In addition, in a case where it is determined that the voltage of the driving signal COMA (COMB) is in the fourth range (equal to or greater than the power source voltage V4 (31.5 V) and less than the power source voltage V5 (42 V)), the selector 256 selects only the selection signal S4 to the high level and sets the selection signals S1, S2, and S3 to the low level.

In this manner, the selector 256 makes the gate driver 255a operable when the voltage of the driving signal COMA (COMB) is between the power source voltage V1 and the power source voltage V2, makes the gate driver 255b operable when the voltage of the driving signal COMA (COMB) is between the power source voltage V2 and the power source voltage V3, makes the gate driver 255c operable when the voltage of the driving signal COMA (COMB) is between the power source voltage V3 and the power source voltage V4, and makes the gate driver 255d operable when the voltage of the driving signal COMA (COMB) is between the power source voltage V4 and the power source voltage V5.

In addition, based on the voltage of the signal (for example, the feedback signal ain2 (bin2) or the feedback signal ain3 (bin3)) fed back from the driving signal COMA (COMB), the selector 256 may determine whether or not the voltage of the driving signal COMA (COMB) is in any one of the first range to the fourth range, and may output the selection signals S1 to S4 based on the determination result. Otherwise, based on both of the driving data dA (dB) and the signal fed back from the driving signal COMA (COMB), the selector 256 may determine whether or not the voltage of the driving signal COMA (COMB) is in any one of the first range to the fourth range, and may output the selection signals S1 to S4 based on the determination result.

Above, the D/A conversion circuit 251, the comparator 252, the timing signal generation circuit 253, the gate driver control circuit 254, and the selector 256 functions as a control circuit (one example of "first control circuit" or "second control circuit") which generates the control signals Gt1 and Gt2 and the selection signals S1 to S4 and controls operations of the gate drivers 255a to 255d based on the control signal OEa (OEb), the control signal OCa (OCb), the driving data dA (dB), the feedback signal ain2 (bin2), and the feedback signal ain3 (bin3).

The gate driver 255a (one example of "first gate driver" or "third gate driver") operates as the lower power source voltage V1 and the higher power source voltage V2 are supplied, and generates control signals Gt1a and Gt2a (one example of "first control signal" or "third control signal") for controlling the switching operation of the transistor pair configured with the transistors 271a and 272a in accordance with the signal to be output from the comparator 252. Specifically, when the selection signal S1 is at the high level, the gate driver 255a level-shifts the control signal Gt1 and the control signal Gt2 generated based on the output signal of the comparator 252 in the range (first range) respectively from the power source voltage V1 to the power source voltage V2, and supplies the signals respectively to the gate terminal of the transistor 271a and the gate terminal of the transistor 272a as the control signal Gt1a and the control signal Gt2a. However, in a case where the range from the lowest voltage to the highest voltage of the control signals Gt1 and Gt2 matches the first range, a level shift amount of the control signals Gt1 and Gt2 may be 0 V (the level shift may not be performed). In addition, when the selection signal S1 is at the low level, the gate driver 255a supplies the control signal Gt1a of a high level voltage (voltage in the vicinity of the power source voltage V2) to the gate terminal of the transistor 271a, supplies the control signal Gt2a of a low level voltage (voltage in the vicinity of the power source voltage V1) to gate terminal of the transistor 272a, and offsets the transistors 271a and 272a.

Similarly, the gate driver 255b (one example of "second gate driver" or "fourth gate driver") operates as the lower power source voltage V2 and the higher power source voltage V3 are supplied, and generates control signals Gt1b and Gt2b (one example of "second control signal" or "fourth control signal") for controlling the switching operation of the transistor pair configured with the transistors 271b and 272b in accordance with the signal to be output from the comparator 252. Specifically, when the selection signal S2 is at the high level, the gate driver 255b level-shifts the control signal Gt1 and the control signal Gt2 in the range (second range) respectively from the power source voltage V2 to the power source voltage V3, and supplies the signals respectively to the gate terminal of the transistor 271b and the gate terminal of the transistor 272b as the control signal Gt1b and the control signal Gt2b. In addition, when the selection signal S2 is at the low level, the gate driver 255b supplies the control signal Gt1b of a high level voltage (voltage in the vicinity of the power source voltage V3) to the gate terminal of the transistor 271b, supplies the control signal Gt2b of a low level voltage (voltage in the vicinity of the power source voltage V2) to gate terminal of the transistor 272b, and offsets the transistors 271b and 272b.

Similarly, the gate driver 255c operates as the lower power source voltage V3 and the higher power source voltage V4 are supplied, and generates control signals Gt1c and Gt2c for controlling the switching operation of the transistor pair configured with the transistors 271c and 272c in accordance with the signal to be output from the comparator 252. Specifically, when the selection signal S3 is at the high level, the gate driver 255c level-shifts the control signal Gt1 and the control signal Gt2 in the range (third range) respectively from the power source voltage V3 to the power source voltage V4, and supplies the signals respectively to the gate terminal of the transistor 271c and the gate terminal of the transistor 272c as the control signal Gt1c and the control signal Gt2c. In addition, when the selection signal S3 is at the low level, the gate driver 255c supplies the control signal Gt1c of a high level voltage (voltage in the vicinity of the power source voltage V4) to the gate terminal of the transistor 271c, supplies the control signal Gt2c of a low level voltage (voltage in the vicinity of the power source voltage V3) to gate terminal of the transistor 272c, and offsets the transistors 271c and 272c.

Similarly, the gate driver 255d operates as the power source voltage V4 on the lower side and the power source voltage V5 on the higher side are supplied, and when the selection signal S4 is at the high level, level-shifts the control signal Gt1 and the control signal Gt2 in a range (fourth range) respectively from the power source voltage V4 to the power source voltage V5, and supplies the signals respectively to the gate terminal of the transistor 271d and the gate terminal of the transistor 272d as the control signal Gt1d and the control signal Gt2d. In addition, when the selection signal S4 is at the low level, the gate driver 255d supplies the control signal Gt1d of a high level voltage (voltage in the vicinity of the power source voltage V5) to the gate terminal of the transistor 271d, supplies the control signal Gt2d of a low level voltage (voltage in the vicinity of the power source voltage V4) to gate terminal of the transistor 272d, and offsets the transistors 271d and 272d.

The transistors 271a and 272a, the transistors 271b and 272b, the transistors 271c and 272c, and the transistors 271d and 272d perform paired switching operations, respectively. Specifically, the transistor 271a (one example of "second transistor" or "sixth transistor") and the transistor 272a (one example of "first transistor" or "fifth transistor") are connected to each other in series between a power source voltage supply line (one example of "first power source voltage supply line" or "fourth power source voltage supply line") to which the power source voltage V1 (one example of "first power source voltage" or "fourth power source voltage") is supplied and the power source voltage supply line (one example of "second power source voltage supply line" or "fifth power source voltage supply line") to which the power source voltage V2 (one example of "second power source voltage" or "fifth power source voltage") higher than the power source voltage V1, and configure one transistor pair (one example of "first transistor pair" or "third transistor pair"). In addition, the transistor 271b (one example of "fourth transistor" or "eighth transistor") and the transistor 272b (one example of "third transistor" or "seventh transistor") are connected to each other in series between a power source voltage supply line to which the power source voltage V2 is supplied and the power source voltage supply line (one example of "third power source voltage supply line" or "sixth power source voltage supply line") to which the power source voltage V3 (one example of "third power source voltage" or "sixth power source voltage") higher than the power source voltage V2 is supplied, and configure one transistor pair (one example of "second transistor pair" or "fourth transistor pair"). In addition, transistors 271c and 272c are connected to each other in series between the power source voltage supply line to which power source voltage V3 is supplied and the power source voltage supply line to which power source voltage V4 higher than power source voltage V3 is supplied, and configure one transistor pair. In addition, transistors 271d and 272d are connected to each other in series between the power source voltage supply line to which power source voltage V4 is supplied and the power source voltage supply line to which power source voltage V5 higher than power source voltage V4 is supplied, and configure one transistor pair.

In the four transistor pairs, the high side transistors 271a, 271b, 271c, and 271d are transistors that turn on when the gate terminal is at a low level and turn off at a high level, for example, a P-channel type field effect transistor. In addition, the low side transistors 272a, 272b, 272c, and 272d are transistors that turn on when the gate terminal is at a high level and turn off at a low level, for example, a N-channel type field effect transistor.

In the transistor pair configured with the transistors 271a and 272a, the power source voltage V2 is applied to a source terminal of the high side transistor 271a, the power source voltage V1 is applied to the source terminal of the low side transistor 272a, a drain terminal of the transistor 271a and a drain terminal of the transistor 272a are connected to each other via a diode dp. Control signals Gt1a and Gt2a output from the gate driver 255a are respectively supplied to each of the gate terminals of the transistors 271a and 272a. In addition, a connection node between the cathode terminal of the diode dp and the drain terminal of the transistor 272a serve as an output end of a transistor pair including the transistors 271a and 272a.

Similarly, in the transistor pair configured with the transistors 271b and 272b, the power source voltage V3 is applied to a source terminal of the high side transistor 271b, the power source voltage V2 is applied to the source terminal of the low side transistor 272b, a drain terminal of the transistor 271b and a drain terminal of the transistor 272b are connected to each other via the diode dp and the diode dn. The control signals Gt1b and Gt2b output from the gate driver 255b are respectively supplied to each of the gate terminals of the transistors 271b and 272b. In addition, a connection node between the cathode terminal of the diode dp and the anode terminal of the diode dn is an output end of the transistor pair including the transistor 271b and 272b.

Similarly, in the transistor pair configured with the transistors 271c and 272c, the power source voltage V4 is applied to a source terminal of the high side transistor 271c, the power source voltage V3 is applied to the source terminal of the low side transistor 272c, the drain terminal of the transistor 271c and the drain terminal of the transistor 272c are connected to each other via the diode dp and the diode dn. The control signals Gt1c and Gt2c output from the gate driver 255c are respectively supplied to each of the gate terminals of the transistors pairs 271c and 272c. In addition, a connection node between the cathode terminal of the diode dp and the anode terminal of the diode dn is an output end of the transistor pair including the transistors 271c and 272c.

Similarly, in the transistor pair configured with the transistors 271d and 272d, the power source voltage V5 is applied to a source terminal of the high side transistor 271d, the power source voltage V4 is applied to the source terminal of the low side transistor 272d, a drain terminal of the transistor 271d and a drain terminal of the transistor 272d are connected to each other via the diode dn. The control signals Gt1d and Gt2d output from the gate driver 255d are respectively supplied to each of the gate terminals of the transistors 271d and 272d. In addition, a connection node between the drain terminal of the transistor 271d and the anode terminal of the diode dn is an output end of the transistor pair including the transistors 271d and 272d.

The output end of the transistor pair including the transistors 271a and 272a, the output end of the transistor pair including the transistors 271b and 272b, the output end of the transistor pair including the transistors 271c and 272c, and the output end of the transistor pair including the transistors 271d and 272d are connected to each other, and the connection node becomes an output node N1 (one example of "first output node" or "second output node") of the driving circuit 50, and the signal output from the output node N1 becomes the driving signal COMA (COMB).

The diode dp is a diode for preventing a current (reverse flow) that flows from the output node N1 to each of the supply lines of the power source voltages V2, V3, and V4 via the transistors 271a, 271b, and 271c, and the forward direction thereof is a direction from each of the drain terminals of the transistor 271a, 271b, and 271c toward the output node N1. In addition, the diode do is a diode for preventing a current (reverse flow) that flows from each of the supply line of the power source voltages V2, V3, and V4 to the output node N1 via the transistors 272b, 272c, and 272d, and the forward direction thereof is a direction from the output node N1 toward each of the drain terminals of the transistors 272b, 272c, and 272d. In addition, since the voltage (the voltage of the driving signal COMA (COMB)) of the output node N1 does not become higher than the power source voltage V5, the current (reverse flow) that flows from the output node N1 to the supply line of the power source voltage V5 is not generated. Therefore, the diode dp is not provided for the transistor 271d. Similarly, since the voltage (the voltage of the driving signal COMA (COMB)) of the output node N1 does not become lower than the power source voltage V1, the current (reverse flow) that flows from the common supply line of the power source voltage V1 to the output node N1 is not generated. Therefore, the diode do is not provided for the transistor 272a.

The linear amplifier 280 amplifies the voltage of the original driving signal ain (bin) by a predetermined times based on a linear amplification feedback signal LAO_FB which is an output signal thereof and is fed back from a linear amplification signal LAO, and outputs the voltage. In the embodiment, the linear amplifier 280 includes an amplification control circuit 257, an amplification circuit 258, and a feedback circuit 259.

The amplification control circuit 257 compares the voltage of the original driving signal ain (bin) with the voltage of the linear amplification feedback signal LAO_FB, and outputs an amplification control signal CTLA based on the comparison result. Based on the amplification control signal CTLA output from the amplification control circuit 257, the amplification circuit 258 controls the operation of an internal transistor (not illustrated) and outputs the linear amplification signal LAO that becomes a voltage in the range from the power source voltage V1 to the power source voltage V5. The linear amplification signal LAO is an output signal of the linear amplifier 280. The feedback circuit 259 outputs a linear amplification feedback signal LAO_FB obtained by attenuating the voltage of the linear amplification signal LAO output from the amplification circuit 258 with a constant ratio (attenuation factor α).

In the linear amplifier 280 configured in this manner, feedback is performed such that the voltage of the original driving signal ain (bin) and the voltage of the linear amplification feedback signal LAO_FB match each other, and the linear amplification signal LAO becomes a signal in which the voltage of the original driving signal ain (bin) is amplified by α times.

The switch 260 connects the output end of the linear amplifier 280 (the output end of the amplification circuit 258) and the output node N1 to each other, is turned on when the control signal OEax (OEbx) is at the high level, and is turned off when the control signal OEax (OEbx) is at a low level. In addition, as described above, when the control signal OEax (OEbx) is at the high level, the gate driver control circuit 254 selects the high level as the control signal Gt1, selects the low level as the control signal Gt2, and as a result, turns off any of the transistors 271a to 271d and 272a to 272d. Therefore, during the period in which the control signal OEax (OEbx) is at the high level, the switching operation of the four transistor pairs is stopped, the switch 260 is turned on, and accordingly, the voltage of the linear amplification signal LAO output from the linear amplifier 280 is applied to the output node N1, and the voltage of the output node N1 is forced to match the voltage of the linear amplification signal LAO.

Next, the operation of the driving circuit 50 will be described. Hereinafter, the operation of the driving circuits 50a-1 to 50a-6 which outputs the driving signal COMA will be described, but the operation of the driving circuits 50b-1 to 50b-6 which output the driving signal COMB is also the same.

Figure 13:
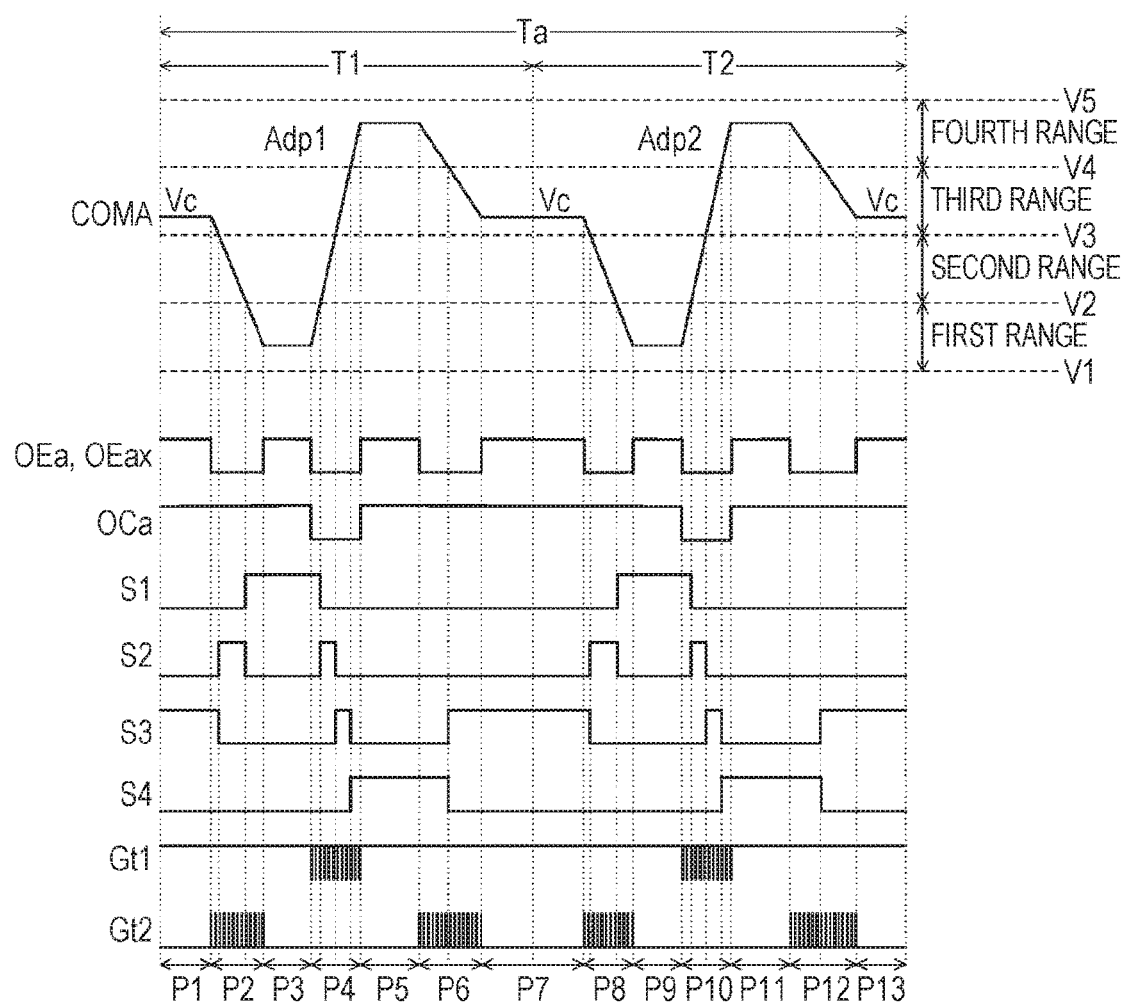
FIG. 13 is a view for describing an operation of the driving circuit.

FIG. 13 is a view for describing an operation of the driving circuit 50 (50a-1 to 50a-6). As illustrated in FIG. 13, in the period T1 of the cycle Ta, in the first period P1, the control signal OEa (control signal OEax) is at the high level and the control signal OCa is at the high level. Therefore, the control signal Gt1 is at the high level and the control signal Gt2 is at the low level. Further, since the voltage of the driving signal COMA that corresponds to the driving data dA is in the third range, the selection signal S3 is at the high level, and the selection signals S1, S2, and S4 are at the low level. Since the selection signals S1, S2, and S4 are at the low level, the control signals Gt1a, Gt1b, and Gt1d are at the high level, the control signals Gt2a, Gt2b, and Gt2d are at the low level, and any of the transistors 271a, 271b, 271d, 272a, 272b, and 272d is turned off. Meanwhile, since the selection signal S3 is at the high level, the logic level of the control signal Gt1c matches the logic level (high level) of the control signal Gt1 and the logic level of the control signal Gt2c matches the logic level (low level) of the control signal Gt2, and thus, the transistors 271c and 272c are also turned off. At this time, since the control signal OEa (control signal OEax) is at the high level, the switch 260 is turned on, and the linear amplification signal LAO having the voltage that corresponds to the driving data dA is supplied to the output node N1. Accordingly, the voltage of the driving signal COMA becomes the constant voltage Vc.

In the period P2 following the period P1, the control signal OEa (control signal OEax) is at the low level and the control signal OCa is at the high level. At this time, since the voltage of the original driving signal ain decreases based on the driving data dA and becomes lower than the voltage of the feedback signal ain2, the output signal of the comparator 252 is at the high level. Since the control signal OCa is at the high level, the control signal Gt1 is at the high level, and the logic level of the control signal Gt2 matches the logic level (high level) of the output signal of the comparator 252. In addition, since the voltage of the driving signal COMA is in the third range, the control signals Gt1a, Gt1b, and Gt1d are at the high level, the control signals Gt2a, Gt2b, and Gt2d are at the low level, and any of the transistors 271a, 271b, 271d, 272a, 272b, and 272d is turned off. Meanwhile, since the selection signal S3 is at the high level, the logic level of the control signal Gt1c matches the logic level (high level) of the control signal Gt1 and the logic level of the control signal Gt2c matches the logic level (high level) of the control signal Gt2, and thus, the transistor 271c is turned off and the transistor 272c is turned on. Accordingly, a part of the charge stored in the capacitor C0 is discharged to the supply line of the power source voltage V3, and the voltage of the driving signal COMA decreases.

When the voltage of the driving signal COMA decreases, since the voltage of the feedback signal ain2 also decreases and the voltage of the original driving signal ain decreases, the output signal of the comparator 252 is at the low level. Therefore, the control signal Gt2 is at the low level, the control signal Gt2a is also at the low level, and the transistor 272c is turned off. Accordingly, the discharge from the capacitor C0 is stopped, and the voltage of the driving signal COMA stops decreasing.

In a state where the decrease in voltage of the driving signal COMA is stopped, since the voltage of the original driving signal ain decreases based on the driving data dA and becomes lower than the voltage of the feedback signal ain2, the output signal of the comparator 252 is at the high level again. Accordingly, the transistor 272c is turned on again, the discharge from the capacitor C0 resumes, and the voltage of the driving signal COMA decreases. In this manner, the voltage of the driving signal COMA decreases while the on and off state (switching operation) of the transistor 272c is repeated based on the driving data dA.

In addition, since the voltage of the driving signal COMA decreases until entering the second range, the selection signal S2 is at the high level, and the selection signals S1, S3, and S4 are at the low level. Since the selection signals S1, S3, and S4 are at the low level, the control signals Gt1a, Gt1c, and Gt1d are at the high level, the control signals Gt2a, Gt2c, Gt2d are at the low level, and any of the transistors 271a, 271c, 271d, 272a, 272c, and 272d is turned off. Meanwhile, since the selection signal S2 is at the high level, the logic level of the control signal Gt1b matches the logic level (high level) of the control signal Gt1 and the logic level of the control signal Gt2b matches the logic level (low level or high level) of the control signal Gt2, and thus, the transistor 271b is turned off and the on and off state (switching operation) of the transistor 272b is repeated. Accordingly, a part of the charge stored in the capacitor C0 is discharged to the supply line of the power source voltage V2, and the voltage of the driving signal COMA also decreases after entering the second range.

Furthermore, when the voltage of the driving signal COMA decreases until entering the first range, the selection signal S1 is at the high level, and the selection signals S2, S3, and S4 are at the low level. Since the selection signals S2, S3, and S4 are at the low level, the control signals Gt1b, Gt1c, and Gt1d are at the high level, the control signals Gt2b, Gt2c, Gt2d are at the low level, and any of the transistors 271b, 271c, 271d, 272b, 272c, and 272d is turned off. Meanwhile, since the selection signal S1 is at the high level, the logic level of the control signal Gt1a matches the logic level (high level) of the control signal Gt1 and the logic level of the control signal Gt2a matches the logic level (low level or high level) of the control signal Gt2, and thus, the transistor 271a is turned off and the on and off state (switching operation) of the transistor 272a is repeated. Accordingly, a part of the charge stored in the capacitor C0 is discharged to the supply line of the power source voltage V1, and the voltage of the driving signal COMA also decreases after entering the first range.

In the period P3 following the period P2, the control signal OEa (control signal OEax) is at the high level and the control signal OCa is at the high level. Therefore, the control signal Gt1 is at the high level and the control signal Gt2 is at the low level. Further, since the voltage of the driving signal COMA is in the first range, the selection signal S1 is at the high level, and the selection signals S2, S3, and S4 are at the low level. Since the selection signals S2, S3, and S4 are at the low level, the control signals Gt1$b$, Gt1$c$, and Gt1$d$ are at the high level, the control signals Gt2$b$, Gt2$c$, Gt2$d$ are at the low level, and any of the transistors 271$b$, 271$c$, 271$d$, 272$b$, 272$c$, and 272$d$ is turned off. Meanwhile, since the selection signal S1 is at the high level, the logic level of the control signal Gt1$a$ matches the logic level (high level) of the control signal Gt1 and the logic level of the control signal Gt2$a$ matches the logic level (low level) of the control signal Gt2, and thus, the transistors 271$a$ and 272$a$ are also turned off. At this time, since the control signal OEa (control signal OEax) is at the high level, the switch 260 is turned on, and the linear amplification signal LAO having the voltage that corresponds to the driving data dA is supplied to the output node N1. Accordingly, the voltage of the driving signal COMA becomes the constant voltage.

In the period P4 following the period P3, the control signal OEa (control signal OEax) is at the low level and the control signal OCa is at the low level. At this time, since the voltage of the original driving signal ain increases based on the driving data dA and becomes higher than the voltage of the feedback signal ain2, the output signal of the comparator 252 is at the low level. Since the control signal OCa is at the low level, the control signal Gt2 is at the low level, and the logic level of the control signal Gt1 matches the logic level (low level) of the output signal of the comparator 252. In addition, since the voltage of the driving signal COMA is in the first range, the control signals Gt1$b$, Gt1$c$, and Gt1$d$ are at the high level, the control signals Gt2$b$, Gt2$c$, Gt2$d$ are at the low level, and any of the transistors 271$b$, 271$c$, 271$d$, 272$b$, 272$c$, and 272$d$ is turned off. Meanwhile, since the selection signal S1 is at the high level, the logic level of the control signal Gt1$a$ matches the logic level (low level) of the control signal Gt1 and the logic level of the control signal Gt2$a$ matches the logic level (low level) of the control signal Gt2, and thus, the transistor 271$a$ is turned on and the transistor 272$a$ is turned off. Accordingly, the charge is charged from the supply line of the power source voltage V2 to the capacitor C0, and the voltage of the driving signal COMA increases.

When the voltage of the driving signal COMA decreases, since the voltage of the feedback signal ain2 also increases and the voltage of the original driving signal ain also increases, the output signal of the comparator 252 is at the high level. Therefore, the control signal Gt1 is at the high level, the control signal Gt1$a$ is also at the high level, and the transistor 271$a$ is turned off. Accordingly, the discharge to the capacitor C0 is stopped, and the voltage of the driving signal COMA stops increasing.

In a state where the increase in voltage of the driving signal COMA is stopped, since the voltage of the original driving signal ain increases based on the driving data dA and becomes higher than the voltage of the feedback signal ain2, the output signal of the comparator 252 is at the low level again. Accordingly, the transistor 271$a$ is turned on again, the charge to the capacitor C0 resumes, and the voltage of the driving signal COMA increases. In this manner, the voltage of the driving signal COMA increases while the on and off state (switching operation) of the transistor 271$a$ is repeated based on the driving data dA.

In addition, since the voltage of the driving signal COMA increases until entering the second range, the selection signal S2 is at the high level, and the selection signals S1, S3, and S4 are at the low level. Since the selection signals S1, S3, and S4 are at the low level, the control signals Gt1$a$, Gt1$c$, and Gt1$d$ are at the high level, the control signals Gt2$a$, Gt2$c$, Gt2$d$ are at the low level, and any of the transistors 271$a$, 271$c$, 271$d$, 272$a$, 272$c$, and 272$d$ is turned off. Meanwhile, since the selection signal S2 is at the high level, the logic level of the control signal Gt1$b$ matches the logic level (low level or high level) of the control signal Gt1 and the logic level of the control signal Gt2$b$ matches the logic level (low level) of the control signal Gt2, and thus, the transistor 272$b$ is turned off and the on and off state (switching operation) of the transistor 271$b$ is repeated. Accordingly, the charge is charged from the supply line of the power source voltage V3 to the capacitor C0, and the voltage of the driving signal COMA also increases after entering the second range.

Furthermore, when the voltage of the driving signal COMA increases until entering the third range, the selection signal S3 is at the high level, and the selection signals S1, S2, and S4 are at the low level. Since the selection signals S1, S2, and S4 are at the low level, the control signals Gt1$a$, Gt1$b$, and Gt1$d$ are at the high level, the control signals Gt2$a$, Gt2$b$, and Gt2$d$ are at the low level, and any of the transistors 271$a$, 271$b$, 271$d$, 272$a$, 272$b$, and 272$d$ is turned off. Meanwhile, since the selection signal S3 is at the high level, the logic level of the control signal Gt1$c$ matches the logic level (low level or high level) of the control signal Gt1 and the logic level of the control signal Gt2$c$ matches the logic level (low level) of the control signal Gt2, and thus, the transistor 272$c$ is turned off and the on and off state (switching operation) of the transistor 271$c$ is repeated. Accordingly, the charge is charged from the supply line of the power source voltage V4 to the capacitor C0, and the voltage of the driving signal COMA also increases after entering the third range.

Furthermore, when the voltage of the driving signal COMA increases until entering the fourth range, the selection signal S4 is at the high level, and the selection signals S1, S2, and S3 are at the low level. Since the selection signals S1, S2, and S3 are at the low level, the control signals Gt1$a$, Gt1$b$, and Gt1$c$ are at the high level, the control signals Gt2$a$, Gt2$b$, and Gt2$c$ are at the low level, and any of the transistors 271$a$, 271$b$, 271$c$, 272$a$, 272$b$, and 272$c$ is turned off. Meanwhile, since the selection signal S4 is at the high level, the logic level of the control signal Gt1$d$ matches the logic level (low level or high level) of the control signal Gt1 and the logic level of the control signal Gt2$d$ matches the logic level (low level) of the control signal Gt2, and thus, the transistor 272$d$ is turned off and the on and off state (switching operation) of the transistor 271$d$ is repeated. Accordingly, the charge is charged from the supply line of the power source voltage V5 to the capacitor C0, and the voltage of the driving signal COMA also increases after entering the fourth range.

In the period P5 following the period P4, the control signal OEa (control signal OEax) is at the high level and the control signal OCa is at the high level. Therefore, the control signal Gt1 is at the high level and the control signal Gt2 is at the low level. Further, since the voltage of the driving signal COMA is in the fourth range, the selection signal S4 is at the high level, and the selection signals S1, S2, and S3 are at the low level. Since the selection signals S1, S2, and S3 are at the low level, the control signals Gt1$a$, Gt1$b$, and Gt1$c$ are at the high level, the control signals Gt2$a$, Gt2$b$, and Gt2$c$ are at the low level, and any of the transistors 271$a$, 271$b$, 271$c$, 272$a$, 272$b$, and 272$c$ is turned off. Meanwhile, since the selection signal S4 is at the high level, the logic level of the control signal Gt1$d$ matches the logic level (high level) of the control signal Gt1 and the logic level of the control signal Gt2$d$ matches the logic level (low level) of the control signal Gt2, and thus, the transistors 271$d$ and 272$d$ are also turned off. At this time, since the control signal OEa (control signal OEax) is at the high level, the switch 260 is turned on, and the linear amplification signal LAO having the voltage that corresponds to the driving data dA is supplied to the output node N1. Accordingly, the voltage of the driving signal COMA becomes the constant voltage.

In the period P6 following the period P5, the control signal OEa (control signal OEax) is at the low level and the control signal OCa is at the high level. At this time, since the voltage of the original driving signal ain decreases based on the driving data dA and becomes lower than the voltage of the feedback signal ain2, the output signal of the comparator 252 is at the high level. Since the control signal OCa is at the high level, the control signal Gt1 is at the high level, and the logic level of the control signal Gt2 matches the logic level (high level) of the output signal of the comparator 252. In addition, since the voltage of the driving signal COMA is in the fourth range, the control signals Gt1a, Gt1b, and Gt1c are at the high level, the control signals Gt2a, Gt2b, and Gt2c are at the low level, and any of the transistors 271a, 271b, 271c, 272a, 272b, and 272c is turned off. Meanwhile, since the selection signal S4 is at the high level, the logic level of the control signal Gt1d matches the logic level (high level) of the control signal Gt1 and the logic level of the control signal Gt2d matches the logic level (high level) of the control signal Gt2, and thus, the transistor 271d is turned off and the transistor 272d is turned on. Accordingly, a part of the charge stored in the capacitor C0 is discharged to the supply line of the power source voltage V4, and the voltage of the driving signal COMA decreases.

When the voltage of the driving signal COMA decreases, since the voltage of the feedback signal ain2 also decreases and the voltage of the original driving signal ain decreases, the output signal of the comparator 252 is at the low level. Therefore, the control signal Gt2 is at the low level, the control signal Gt2d is also at the low level, and the transistor 272d is turned off. Accordingly, the discharge from the capacitor C0 is stopped, and the voltage of the driving signal COMA stops decreasing.

In a state where the decrease in voltage of the driving signal COMA is stopped, since the voltage of the original driving signal ain decreases based on the driving data dA and becomes lower than the voltage of the feedback signal ain2, the output signal of the comparator 252 is at the high level again. Accordingly, the transistor 272d is turned on again, the discharge from the capacitor C0 resumes, and the voltage of the driving signal COMA decreases. In this manner, the voltage of the driving signal COMA decreases while the on and off state (switching operation) of the transistor 272d is repeated based on the driving data dA.

In addition, since the voltage of the driving signal COMA decreases until entering the third range, the selection signal S3 is at the high level, and the selection signals S1, S2, and S4 are at the low level. Since the selection signals S1, S2, and S4 are at the low level, the control signals Gt1a, Gt1b, and Gt1d are at the high level, the control signals Gt2a, Gt2b, and Gt2d are at the low level, and any of the transistors 271a, 271b, 271d, 272a, 272b, and 272d is turned off. Meanwhile, since the selection signal S3 is at the high level, the logic level of the control signal Gt1c matches the logic level (high level) of the control signal Gt1 and the logic level of the control signal Gt2c matches the logic level (low level or high level) of the control signal Gt2, and thus, the transistor 271c is turned off and the on and off state (switching operation) of the transistor 272c is repeated. Accordingly, a part of the charge stored in the capacitor C0 is discharged to the supply line of the power source voltage V3, and the voltage of the driving signal COMA also decreases after entering the third range.

In the period P7 following the period P6, the control signal OEa (control signal OEax) is at the high level and the control signal OCa is at the high level. Therefore, the control signal Gt1 is at the high level and the control signal Gt2 is at the low level. Further, since the voltage of the driving signal COMA is in the third range, the selection signal S3 is at the high level, and the selection signals S1, S2, and S4 are at the low level. Since the selection signals S1, S2, and S4 are at the low level, the control signals Gt1a, Gt1b, and Gt1d are at the high level, the control signals Gt2a, Gt2b, and Gt2d are at the low level, and any of the transistors 271a, 271b, 271d, 272a, 272b, and 272d is turned off. Meanwhile, since the selection signal S3 is at the high level, the logic level of the control signal Gt1c matches the logic level (high level) of the control signal Gt1 and the logic level of the control signal Gt2c matches the logic level (low level) of the control signal Gt2, and thus, the transistors 271c and 272c are also turned off. At this time, since the control signal OEa (control signal OEax) is at the high level, the switch 260 is turned on, and the linear amplification signal LAO having the voltage that corresponds to the driving data dA is supplied to the output node N1. Accordingly, the voltage of the driving signal COMA becomes the constant voltage Vc.

In addition, the operation of the driving circuit in the period P8 to the period P13 of the period T2 shifts from the period T1 to the period T2 in the middle of the period P7 is the same as the period P2 to the period P7 of the period T1.

In this manner, in the driving circuit 50 of the embodiment, when the control signal OEa (control signal OEb) is at the low level, by the switching operation of the transistors 271a to 271d and 272a to 272d that correspond to the driving data dA (dB), the charge and discharge of the capacitor C0 is performed and the voltage of the driving signal COMA (COMB) increases or decreases. At this time, the transistor which performs the switching operation is one of the transistors on the high side and on the low side in any one of the transistor pair configured with the transistors 271a and 272a, the transistor pair configured with the transistors 271b and 272b, the transistor pair configured with the transistors 271c and 272c, and the transistor pair configured with the transistors 271d and 272d, and the other transistors are turned off. In addition, the voltages applied to both ends of each of the four transistor pairs are respectively V5-V4, V4-V3, V3-V2, and V2-V1 (both of which are 10.5 V) regardless of the decrease in voltage of the diode dp and the diode dn, compared to a configuration in which one transistor pair performs the switching operation at V5-V1 (42 V), the current at the time of switching is substantially reduced. Furthermore, when the control signal OEa (control signal OEb) is at the high level, all four transistor pairs are turned off. As described above, according to the driving circuit 50 of the embodiment, since the current that flows through the four transistor pairs is reduced, low power consumption can be achieved.

In addition, when the control signal OEa (control signal OEb) is at the high level, regarding the voltage at the output node N1, the voltage of the original driving signal ain (bin) forcedly becomes the voltage amplified by the linear amplifier 280. Therefore, during the period in which the voltage of the driving signal COMA (COMB) is held constant, the high frequency noise generated by the switching operation of the transistors 271a to 271d and 272a to 272d is not superimposed on the driving signal COMA (COMB), and the accuracy of the driving signal COMA (COMB) is improved.

As illustrated in FIG. 12, in the embodiment, in each of the driving circuits 50 (50a-1 to 50a-6, 50b-1 to 50b-6), the D/A conversion circuit 251, the comparator 252, the timing signal generation circuit 253, the gate driver control circuit 254, the gate drivers 255a, 255b, 255c, and 255d, the selector 256, and the amplification control circuit 257 which configure a part thereof are integrated in the integrated circuit device 300 (integrated circuit). In contrast, the switch 260, the transistors 271a to 271d and 272a to 272d, the amplification circuit 258, the feedback circuit 259, the capacitor C0, and the resistor elements R1, R2, R3, and R4 which configure the other part of each of the driving circuits 50 are not integrated in the integrated circuit device 300 and loaded (mounted) on the control substrate 100.

The reason why the amplification circuit 258 which configures a part of the linear amplifier 280 is not integrated in the integrated circuit device 300 is that, since the linear amplification signal LAO which is a constant voltage in the range from the power source voltage V1 to the power source voltage V5 is output and since the voltage of the maximum V5-V1 is applied to the transistor to be embedded, a high-voltage resistant manufacturing process is necessary to be integrated in the integrated circuit device 300 and an increase in costs is caused. However, a high-voltage resistant manufacturing process may be adopted, and the amplification circuit 258 may be integrated in the integrated circuit device 300.

In addition, the reason why the feedback circuit 259 which configures a part of the linear amplifier 280 is not integrated in the integrated circuit device 300 is that, when the feedback circuit 259 is integrated in the integrated circuit device 300, since the attenuation factor of the feedback circuit 259 varies for each chip of the integrated circuit device 300 due to the manufacturing variation, and since it is necessary to add a circuit for finely adjusting the attenuation factor on the inside of the integrated circuit device 300, the costs of the integrated circuit device 300 increase. However, the feedback circuit 259 may be integrated in the integrated circuit device 300.

Furthermore, in the embodiment, each part of the four driving circuits 50a-1, 50b-1, 50a-2, and 50b-2 which configure one driving circuit unit is included in one integrated circuit device 300, each part of four driving circuits 50a-3, 50b-3, 50a-4, and 50b-4 which configure the other one driving circuit unit is included in the other one integrated circuit device 300, and each part of four driving circuits 50a-5, 50b-5, 50a-6, and 50b-6 which configure the other driving circuit unit is included in the other one integrated circuit device 300. In other words, in the liquid discharge apparatus 1 of the embodiment, three integrated circuit devices 300 having the same configuration are loaded (mounted) on the control substrate 100.

7. Terminal Disposition and Layout of Integrated Circuit Device

Figure 14:
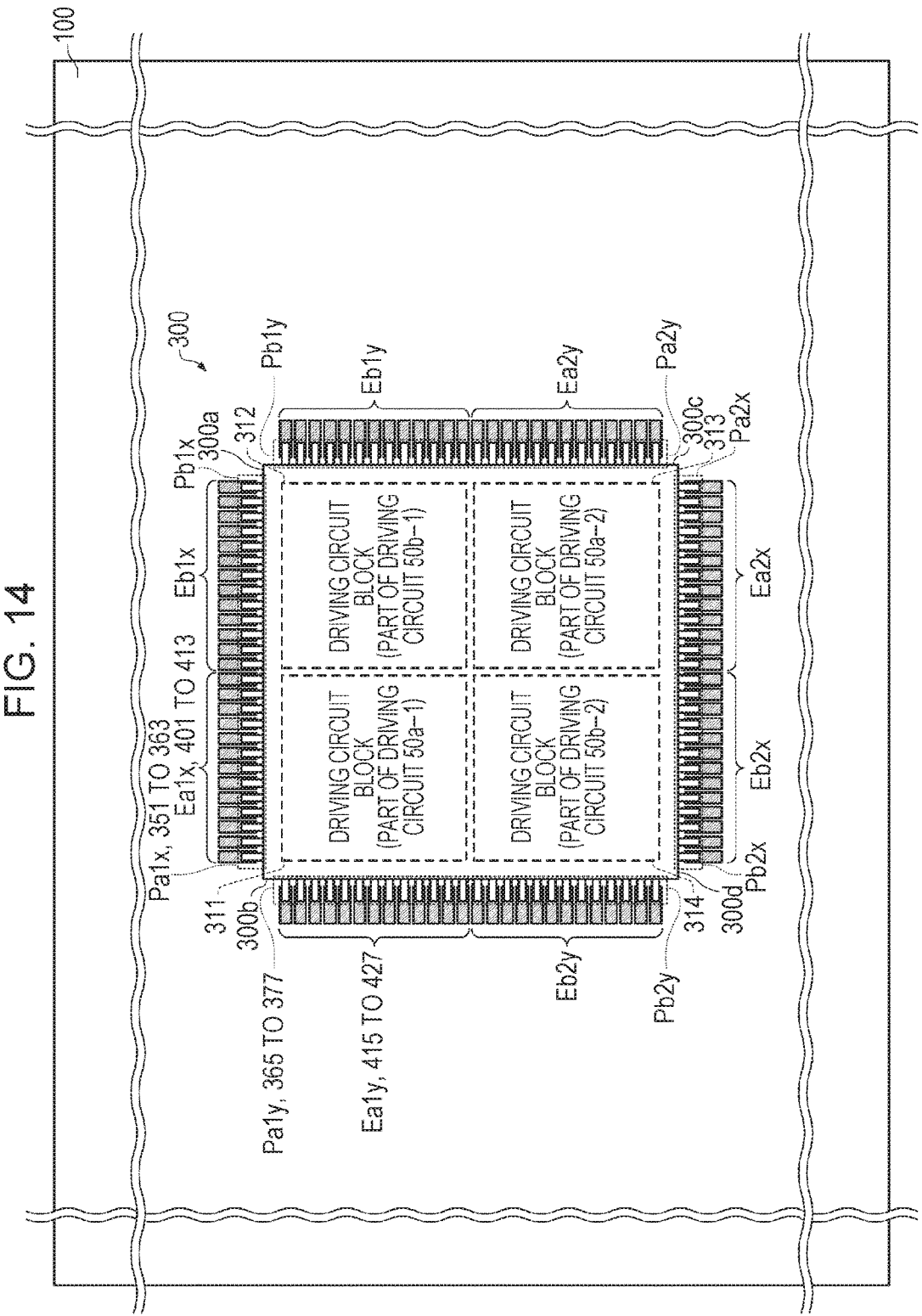
FIG. 14 is a view illustrating an integrated circuit device mounted on a control substrate.
Figure 15:
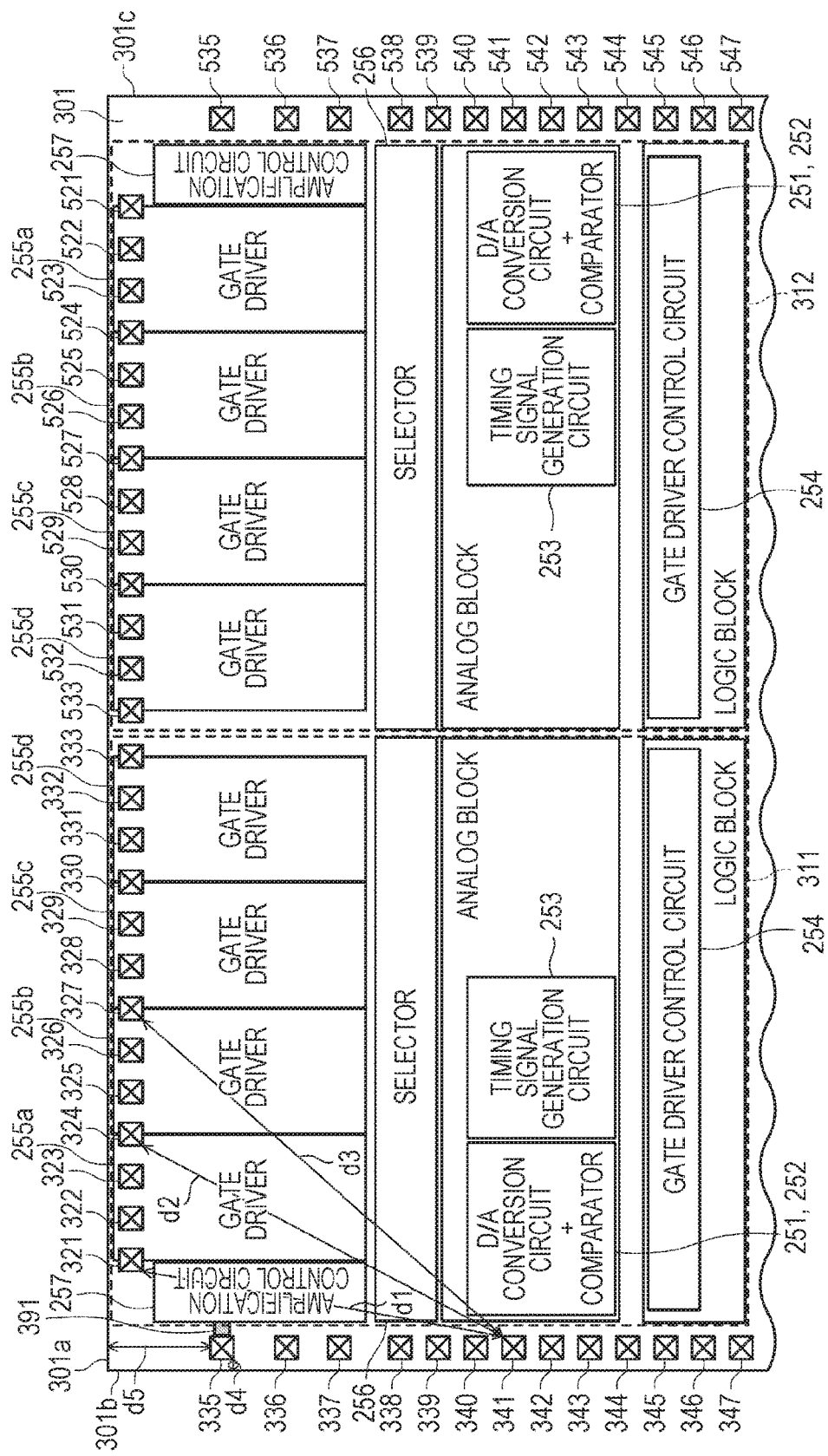
FIG. 15 is a view simply illustrating a part of a layout on a semiconductor substrate of an integrated circuit device.

Next, the terminal disposition and layout of the integrated circuit device 300 will be described. FIG. 14 is a view illustrating the integrated circuit device 300 mounted on the control substrate 100, and is a view when the control substrate 100 and the integrated circuit device 300 are viewed from a loading surface side of the integrated circuit device 300 in a plan view. In addition, FIG. 15 is a view simply illustrating a part of a layout on a semiconductor substrate of the integrated circuit device 300 illustrated in FIG. 14. Further, in FIG. 14, among the three integrated circuit devices 300 loaded on the control substrate 100, only the integrated circuit device 300 including each part of the four driving circuits 50a-1, 50b-1, 50a-2, and 50b-2 is illustrated. In addition, in FIG. 15, among the four driving circuits 50a-1, 50b-1, 50a-2, and 50b-2, only each part of the driving circuits 50a-1 and 50b-1 is illustrated.

As illustrated in FIG. 14, the integrated circuit device 300 has a rectangular shape in a plan view, and a driving circuit block 311 that corresponds to a part of the driving circuit 50a-1 (one example of "first driving circuit"), a driving circuit block 312 that corresponds to a part of the driving circuit 50b-1 (one example of "second driving circuit"), a driving circuit block 313 that corresponds to a part of the driving circuit 50a-2, and a driving circuit block 314 that corresponds to a part of the driving circuit 50b-2 are disposed on the semiconductor substrate 301 (refer to FIG. 15). Specifically, the driving circuit block 311 is disposed to be adjacent to the driving circuit block 312 and the driving circuit block 314, the driving circuit block 312 is disposed to be adjacent to the driving circuit block 311 and the driving circuit block 313, the driving circuit block 313 is disposed to be adjacent to the driving circuit block 312 and the driving circuit block 314, and the driving circuit block 314 is disposed to be adjacent to the driving circuit block 311 and the driving circuit block 313.

More specifically, the driving circuit block 311 is disposed in a region along a first side 300a and a second side 300b intersecting with the first side 300a in the integrated circuit device 300 among four regions in which the semiconductor substrate 301 (refer to FIG. 15) of the integrated circuit device 300 is divided into four. The driving circuit block 312 is disposed in a region along the first side 300a and a third side 300c intersecting with the first side 300a in the integrated circuit device 300. The driving circuit block 313 is disposed in a region along the third side 300c and a fourth side 300d intersecting with the third side 300c in the integrated circuit device 300. The driving circuit block 314 is disposed in a region along the second side 300b and the fourth side 300d in the integrated circuit device 300. In other words, the four driving circuit blocks 311, 312, 313, and 314 are disposed in a matrix of two rows and two columns, the driving circuit block 311 and the driving circuit block 313 are at diagonal positions, and the driving circuit block 312 and the driving circuit block 314 are at diagonal positions.

In addition, as an operation method of the integrated circuit device 300, the driving circuit block 311 generates the control signals Gt1a to Gt1d and Gt2a to Gt2d for controlling the waveform of the driving signal COMA (one example of "first driving signal") for driving the piezoelectric element 60 of each of the discharge units 600 provided corresponding to the first nozzle row 650a and the second nozzle row 650b (refer to FIG. 2). In addition, the driving circuit block 312 generates the control signals Gt1a to Gt1d and Gt2a to Gt2d for controlling the waveform of the driving signal COMB (one example of "second driving signal") for driving the piezoelectric element 60 of each of the discharge units 600 provided corresponding to the first nozzle row 650a and the second nozzle row 650b (refer to FIG. 2). In addition, the driving circuit block 313 generates the control signals Gt1a to Gt1d and Gt2a to Gt2d for controlling the waveform of the driving signal COMA for driving the piezoelectric element 60 of each of the discharge units 600 provided corresponding to the third nozzle row 650c and the fourth nozzle row 650d (refer to FIG. 2). The driving circuit block 314 generates the control signals Gt1a to Gt1d and Gt2a to Gt2d for controlling the waveform of the driving signal COMB for driving the piezoelectric element 60 of each of the discharge units 600 provided corresponding to the third nozzle row 650c and the fourth nozzle row 650d (refer to FIG. 2).

Here, since the maximum amplitude of the driving signal COMA is a difference between the maximum voltage and the minimum voltage of the trapezoidal waveform Adp1 (or trapezoidal waveform Adp2) (refer to FIG. 6), and the maximum amplitude of the driving signal COMB is a difference between the maximum voltage and the minimum voltage of the trapezoidal waveform Bdp2 (refer to FIG. 6), the maximum amplitude of the driving signal COMA is greater than the maximum amplitude of the driving signal COMB. Conversely, the maximum amplitude of the driving signal COMB is smaller than the maximum amplitude of the driving signal COMA. Therefore, the frequency at which the logic levels of the control signals Gt1$a$ to Gt1$d$ and Gt2$a$ to Gt2$d$ generated by each of the driving circuit blocks 311 and 313, are inverted is higher than the frequency at which the logic levels of the control signals Gt1$a$ to Gt1$d$ and Gt2$a$ to Gt2$d$ generated by each of the driving circuit blocks 312 and 314 are inverted. Therefore, the power consumed in the driving circuit block 311 is greater than the power consumed in the driving circuit blocks 312 and 314, and the power consumed in the driving circuit block 313 is the power consumed in the driving circuit blocks 312 and 314. Therefore, the heating value of the driving circuit block 311 is greater than the heating values of the driving circuit blocks 312 and 314, and the heating value of the driving circuit block 313 is greater than the heating values of the driving circuit blocks 312 and 314. In contrast, in the embodiment, as described above, since the driving circuit block 311 and the driving circuit block 313 which have a relatively large heating value are at diagonal positions not adjacent to each other, and the driving circuit block 312 and the driving circuit block 314 which have a relatively small heating value are at diagonal positions not adjacent to each other, on the inside of the integrated circuit device 300, the generated heat is dispersed and the bias of the temperature distribution is reduced. As a result, the possibility that the operation of a part of the driving circuit blocks 311 to 314 becomes unstable can be reduced by increasing the bias of the temperature distribution, and the distortion of the driving signal COMA output from the driving circuits 50$a$-1 and 50$a$-2 and the driving signal COMB output from the driving circuits 50$b$-1 and 50$b$-2 is reduced.

On the first side 300$a$ of the integrated circuit device 300, an external connection terminal group Pa1$x$ configured with a plurality of external connection terminals 351 to 363 electrically connected to the driving circuit block 311 is provided at a position opposing the driving circuit block 311, and an external connection terminal group Pb1$x$ configured with a plurality of external connection terminals electrically connected to the driving circuit block 312 is provided at a position opposing the driving circuit block 312. On the second side 300$b$ of the integrated circuit device 300, an external connection terminal group Pa1$y$ configured with a plurality of external connection terminals 365 to 377 electrically connected to the driving circuit block 311 is provided at a position opposing the driving circuit block 311, and an external connection terminal group Pb2$y$ configured with a plurality of external connection terminals electrically connected to the driving circuit block 314 is provided at a position opposing the driving circuit block 314. On the third side 300$c$ of the integrated circuit device 300, an external connection terminal group Pb1$y$ configured with a plurality of external connection terminals electrically connected to the driving circuit block 312 is provided at a position opposing the driving circuit block 312, and an external connection terminal group Pa2$y$ configured with a plurality of external connection terminals electrically connected to the driving circuit block 313 is provided at a position opposing the driving circuit block 313. On the fourth side 300$d$ of the integrated circuit device 300, an external connection terminal group Pa2$x$ configured with a plurality of external connection terminals electrically connected to the driving circuit block 313 is provided at a position opposing the driving circuit block 313, and an external connection terminal group Pb2$x$ configured with a plurality of external connection terminals electrically connected to the driving circuit block 314 is provided at a position opposing the driving circuit block 314.

The control substrate 100 is provided with an electrode group Ea1$x$ configured with a plurality of electrodes 401 to 413 at a position opposing the external connection terminal group Pa1$x$, and the plurality of electrodes 401 to 413 included in the electrode group Ea1$x$ are respectively connected to the plurality of external connection terminals 351 to 363 included in the external connection terminal group Pa1$x$. Similarly, electrode groups Ea1$y$, Eb1$x$, Eb1$y$, Ea2$x$, Ea2$y$, Eb2$x$, and Eb2$y$ are provided at positions respectively opposing the external connection terminal groups Pa1$y$, Pb1$x$, Pb1$y$, Pa2$x$, Pa2$y$, Pb2$x$, and Pb2$y$.

As illustrated in FIG. 15, the driving circuit block 311 includes the D/A conversion circuit 251, the comparator 252, the timing signal generation circuit 253, the amplification control circuit 257 which is a part of the linear amplifier 280, the gate driver control circuit 254, the gate drivers 255$a$, 255$b$, 255$c$, and 255$d$, and the selector 256, which are formed on the semiconductor substrate 301.

The semiconductor substrate 301 has a rectangular shape, and the first side 301$a$, the second side 301$b$, the third side 301$c$, and the fourth side 301$d$ respectively oppose the first side 300$a$, the second side 300$b$, the third side 300$c$, and the fourth side 300$d$ of the integrated circuit device 300. In addition, in FIG. 15, the fourth side 301$d$ of the semiconductor substrate 301 is not illustrated.

On the semiconductor substrate 301, pads 321 to 333 connected to each of the plurality of external connection terminals 351 to 363 included in the external connection terminal group Pa1$x$ by wire bonding or the like are formed. The shortest distance between each of the pads 321 to 333 and the first side 301$a$ (the first side 300$a$ of the integrated circuit device 300) of the semiconductor substrate 301 is shorter than the shortest distance between each of the pads 321 to 333 and the second side 301$b$ (the second side 300$b$ of the integrated circuit device 300) of the semiconductor substrate 301. In other words, the pads 321 to 333 are formed along the first side 301$a$ (the first side 300$a$ of the integrated circuit device 300) of the semiconductor substrate 301. More specifically, the pads 321 to 333 are disposed in the order from the side close to the second side 301$b$ along the first side 301$a$ of the semiconductor substrate 301. Pads 321, 324, 327, 330, and 333 are pads supplied with the power source voltages V1, V2, V3, V4, and V5, respectively. In addition, the pads 322, 325, 328, and 331 are pads that output the control signals Gt2$a$, Gt2$b$, Gt2$c$, and Gt2$d$, respectively, and the pads 323, 326, 329, and 332 pads that output the control signals Gt1$a$, Gt1$b$, Gt1$c$, and Gt1$d$, respectively.

In addition, on the semiconductor substrate 301, pads 335 to 347 connected to each of the plurality of external connection terminals 365 to 377 included in the external connection terminal group Pa1$y$ by wire bonding or the like are formed. The shortest distance between each of the pads 335 to 347 and the second side 301$b$ (the second side 300$b$ of the integrated circuit device 300) of the semiconductor substrate 301 is shorter than the shortest distance between each of the pads 335 to 347 and the first side 301*a* (the first side 300*a* of the integrated circuit device 300) of the semiconductor substrate 301. In other words, the pads 335 to 347 are formed along the second side 301*b* (the second side 300*b* of the integrated circuit device 300) of the semiconductor substrate 301. More specifically, the pads 335 to 347 are disposed in the order from the side close to the first side 301*a* along the second side 301*b* of the semiconductor substrate 301. The pad 335 is a pad that outputs the amplification control signal CTLA output from the amplification control circuit 257 which is a part of the linear amplifier 280. In addition, pads 338, 339, and 340 are pads to which the linear amplification feedback signal LAO_FB, the feedback signal ain3, and the feedback signal ain2 are input, respectively. Further, pads 341 to 345 are pads to which each bit of the driving data dA are input, respectively. In addition, pads 346 and 347 are pads to which the control signals OEa and OCa are input, respectively. Further, the pads 336 and 337 are, for example, pads to which the power source voltage or the like of an analog circuit is input.

The amplification control circuit 257 and the gate drivers 255*a*, 255*b*, 255*c*, and 255*d* included in the driving circuit block 311 are arranged in the order from the side close to the second side 301*b* along the first side 301*a* of the semiconductor substrate 301. In addition, the selector 256 included in the driving circuit block 311 is disposed at a position farther from the first side 301*a* than the amplification control circuit 257 and the gate drivers 255*a*, 255*b*, 255*c*, and 255*d*. In addition, analog blocks which operate at a low voltage, such as the D/A conversion circuit 251, the comparator 252, the timing signal generation circuit 253 and the like included in the driving circuit block 311 are disposed at a position farther from the first side 301*a* than the selector 256. In other words, the selector 256 is provided between the amplification control circuit 257 and the gate drivers 255*a*, 255*b*, 255*c*, and 255*d* and the analog block. In addition, the logic block configured by the gate driver control circuit 254 and the like included in the driving circuit block 311 is disposed at a position farther from the first side 301*a* than the analog block.

Here, in the embodiment, as illustrated in FIG. 15, a shortest distance d1 between the pad 321 (one example of "first power source terminal") to which the power source voltage V1 is supplied and the pad 341 (one example of "first input terminal") into which 1-bit (one example of "first input signal") of the driving data dA is input, is shorter than a shortest distance d2 between the pad 324 (one example of "second power source terminal") to which the power source voltage V2 is supplied and the pad 341. In addition, the shortest distance d2 between the pad 324 and the pad 341 is shorter than a shortest distance d3 between the pad 327 (one example of "third power source terminal") to which the power source voltage V3 is supplied and the pad 341. Similarly, the shortest distance between the pad 330 to which the power source voltage V4 is supplied and the pad 341 is shorter than the shortest distance d3 between the pad 327 and the pad 341, and the shortest distance between the pad 333 to which the power source voltage V5 is supplied and the pad 341 is shorter than the shortest distance between the pad 330 and the pad 341.

In other words, the pads 321, 324, 327, 330, and 333 to which the power source voltages V1, V2, V3, V4, and V5 are supplied are arranged such that the pad to which the lower power source voltage is supplied is closer to the pad 341. As a result, the shortest distance between the pad 341 and the gate driver 255*a* is shorter than the shortest distance between the pad 341 and the gate driver 255*b*, the shortest distance between the pad 341 and the gate driver 255*b* is shorter than the shortest distance between the pad 341 and the gate driver 255*c*, and the shortest distance between the pad 341 and the gate driver 255*c* is shorter than the shortest distance between the pad 341 and the gate driver 255*d*. In other words, with respect to the pad 341, the gate driver 255*a* which operates as the power source voltage V1 and the power source voltage V2 are supplied thereto is the closest, the gate driver 255*b* which operates as the power source voltage V2 and the power source voltage V3 are supplied thereto is the closest, the gate driver 255*c* which operates as the power source voltage V3 and the power source voltage V4 are supplied thereto is next close thereto, and the gate driver 255*d* which operates as the power source voltage V4 and the power source voltage V5 are supplied is the farthest. The positional relationship is also similar with respect to the pads 338 to 340 and 342 to 347 (another example of "first input terminal") to which other control input signals (the linear amplification feedback signal LAO_FB, the feedback signal ain3, the feedback signal ain2, other 4 bits of the driving data dA, the control signal OEa, the control signal OCa) (one example of "first input signal") which are necessary for generating the control signals Gt1 and Gt2 and the selection signals S1 to S4 that are supplied to the gate drivers 255*a*, 255*b*, 255*c*, and 255*d*, are input.

In this manner, with respect to the pads 338 to 347 to which various control input signals (the linear amplification feedback signal LAO_FB, the feedback signal ain3, the feedback signal ain2, the driving data dA, the control signal OEa, the control signal OCa) which are necessary for generating the control signals Gt1 and Gt2 and the selection signals S1 to S4 are input, the gate driver 255*d* which operates at the highest voltage among the gate drivers 255*a* to 255*d* is disposed to be the farthest and the gate driver 255*a* which operates at the lowest voltage is disposed to be the closest, and the influence of noise having a high voltage and a high frequency on the various control input signals is reduced. In addition, the gate drivers 255*a*, 255*b*, 255*c*, and 255*d* are arranged along the first side 301*a* of the semiconductor substrate 301, and accordingly, the gate drivers 255*a*, 255*b*, 255*c*, and 255*d* which operate at a high voltage and the analog block (the D/A conversion circuit 251, the comparator 252, the timing signal generation circuit 253, and the like) which operate at a low voltage are disposed to be apart from each other. Therefore, with respect to the analog block (the D/A conversion circuit 251, the comparator 252, the timing signal generation circuit 253, and the like) which operate at a low voltage, the influence of noise having a high voltage and a high frequency generated by the gate driver 255*a* to 255*d* is reduced, and the distortion of the driving waveform of the driving signal COMA output from the driving circuit 50*a*-1 is reduced.

In addition, as illustrated in FIG. 15, the driving circuit block 311 and the driving circuit block 312 are disposed bisymmetrically (symmetrically with respect to a line segment that links a midpoint of the first side 301*a* and a midpoint of the fourth side 301*d* of the semiconductor substrate 301), and each of the pads 321 to 333 and 335 to 347 connected to the driving circuit block 311 and each of the pads 521 to 533 and 535 to 547 connected to the driving circuit block 312 are arranged bisymmetrically. Therefore, in the driving circuit block 312, the shortest distance between the pad 521 (one example of "fourth power source terminal") to which the power source voltage V1 (one example of "fourth power source voltage") is supplied and each of the pads 538 to 547 (one example of "second input terminal") to which various control input signals (one example of "second input signal") necessary for generating the control signals Gt1 and Gt2 and the selection signals S1 to S4 are input, is shorter than the shortest distance between the pad 524 (one example of "fifth power source terminal") to which the power source voltage V2 (one example of "fifth power source voltage") is supplied and each of the pads 538 to 547. In addition, the shortest distance between the pad 524 and each of the pads 538 to 547 is shorter than the shortest distance between the pad 527 (one example of "sixth power source terminal") to which the power source voltage V3 (one example of "sixth power source voltage") is supplied and each of the pads 538 to 547. Similarly, the shortest distance between the pad 527 and each of the pads 538 to 547 is shorter than the shortest distance between the pad 530 to which the power source voltage V4 is supplied and each of the pads 538 to 547, and the shortest distance between the pad 530 and each of the pads 538 to 547 is shorter than the shortest distance between the pad 533 to which the power source voltage V5 is supplied and each of the pads 538 to 547.

Therefore, similar to the driving circuit block 311, in the driving circuit block 312, with respect to the pads 538 to 547 to which various control input signals are input, the gate driver 255d which operates at the highest voltage becomes the farthest among the gate drivers 255a to 255d, the gate driver 255a which operates at the lowest voltage is disposed to be the closest, and the influence of noise having a high voltage and a high frequency on the various control input signals is reduced. In addition, the gate drivers 255a, 255b, 255c, and 255d are arranged along the first side 301a of the semiconductor substrate 301, and accordingly, the gate drivers 255a, 255b, 255c, and 255d which operate at a high voltage and the analog block (the D/A conversion circuit 251, the comparator 252, the timing signal generation circuit 253, and the like) which operate at a low voltage are disposed to be apart from each other. Therefore, with respect to the analog block (the D/A conversion circuit 251, the comparator 252, the timing signal generation circuit 253, and the like) which operate at a low voltage, the influence of noise having a high voltage and a high frequency generated by the gate driver 255a to 255d is reduced, and the distortion of the driving waveform of the driving signal COMB output from the driving circuit 50b-1 is reduced.

In addition, in FIG. 15, although not illustrated in the drawing, the driving circuit block 311 and the driving circuit block 314 are disposed vertically symmetrically (symmetrically with respect to a line segment that links a midpoint of the second side 301b and a midpoint of the third side 301c of the semiconductor substrate 301), and each of the pads connected to the driving circuit block 311 and each of the pads connected to the driving circuit block 314 are arranged vertically symmetrically. Similarly, although not illustrated in the drawing, the driving circuit block 312 and the driving circuit block 313 are disposed vertically symmetrically (the driving circuit block 314 and the driving circuit block 313 are disposed bisymmetrically), and each of the pads connected to the driving circuit block 312 and each of the pads connected to the driving circuit block 313 are disposed vertically symmetrically (each of the pads connected to the driving circuit block 314 and each of the pads connected to the driving circuit block 313 are disposed bisymmetrically). Therefore, the distortion of the driving waveform of the driving signal COMA output from the driving circuit 50a-2 or the distortion of the driving waveform of the driving signal COMB output by the driving circuit 50b-2 are similarly reduced. In addition, there is a case where the pads and the external connection terminals necessary for testing the integrated circuit device 300 exist, but even in this case, the above-described relationship between the arrangement order of each of the pads and the external connection terminals and the shortest distance is maintained.

In addition, in the embodiment, as illustrated in FIG. 15, in the integrated circuit device 300, since the analog block (the D/A conversion circuit 251, the comparator 252, the timing signal generation circuit 253, and the like) generates the control signals Gt1a to Gt1d and Gt2a to Gt2d for controlling the switching operation of the four transistor pairs, there is a possibility that the accuracy of the driving signal COMA deteriorates when the influence of the noise from the gate drivers 255a, 255b, 255c, and 255d on the analog block is large. In contrast, since the selector 256 selects a period in which the gate drivers 255a, 255b, 255c, and 255d are respectively operable, the influence of the noise on the selector 256 on the accuracy of the driving signal COMA is relatively small. Here, in the embodiment, the selector 256 is provided between the gate drivers 255a, 255b, 255c, and 255d which operate at a high voltage and at a high frequency and the analog block (the D/A conversion circuit 251, the comparator 252, the timing signal generation circuit 253, and the like) which operate at a low voltage, and the propagation of noise having a high voltage and a high frequency generated by the gate drivers 255a, 255b, 255c, and 255d to the analog block is reduced.

Further, in the embodiment, a shortest distance d4 between the pad 335 (one example of "first output terminal") from which the amplification control signal CTLA generated by the amplification control circuit 257 which is a part of the linear amplifier 280 is output and the second side 301b (the second side 300b of the integrated circuit device 300) of the semiconductor substrate 301, is shorter than a shortest distance d5 between the pad 335 and the first side 301a (the first side 300a of the integrated circuit device 300) of the semiconductor substrate 301. Furthermore, the amplification control circuit 257 is provided between the second side 301b (the second side 300b of the integrated circuit device 300) of the semiconductor substrate 301 and the gate driver 255a. In other words, the pad 335 and the amplification control circuit 257 from which the amplification control signal CTLA is output are disposed close to the second side 301b (the second side 300b of the integrated circuit device 300) of the semiconductor substrate 301 and the gate driver 255a. Therefore, the amplification control circuit 257 which outputs the high-voltage amplification control signal CTLA and the analog block which operates at a low voltage are disposed to be apart from each other, and further, since a wiring 291 through which the high-voltage amplification control signal CTLA propagates to the pad 335 becomes short and the wiring 291 does not intersect with the analog block, the propagation to the high-voltage analog block is reduced.

In addition, in the embodiment, the shortest distance between each of the external connection terminals 351 to 363 to which the pads 321 to 333 are respectively connected and the first side 300a of the integrated circuit device 300 is shorter than the shortest distance between each of the external connection terminals 351 to 363 and the second side 300b of the integrated circuit device 300. Similarly, the shortest distance between each of the external connection terminals 365 to 377 to which the pads 335 to 347 are respectively connected and the second side 300b of the integrated circuit device 300 is shorter than the shortest distance between each of the external connection terminals 365 to 377 and the first side 300a of the integrated circuit device 300. Further, on the control substrate 100 (one example of "circuit substrate"), in a case where the integrated circuit device 300 is mounted, the shortest distance between each of the electrodes 401 to 413 to which the external connection terminals 351 to 363 are respectively connected and the first side 300a of the integrated circuit device 300, is shorter than the shortest distance between each of the electrodes 401 to 413 and the second side 300b of the integrated circuit device 300. Similarly, on the control substrate 100, in a case where the integrated circuit device 300 is mounted, the shortest distance between each of the electrodes 415 to 427 to which the external connection terminals 365 to 377 are respectively connected and the second side 300b of the integrated circuit device 300, is shorter than the shortest distance between each of the electrodes 415 to 427 and the first side 300a of the integrated circuit device 300.

In addition, in the integrated circuit device 300, the external connection terminals 351 to 363 included in the external connection terminal group Pa1x are arranged in the order from the side close to the second side 300b, and the external connection terminals 365 to 377 included in the external connection terminal group Pa1y are arranged in the order from the side close to the first side 300a. Therefore, the shortest distance between the external connection terminal 351 (another example of "first power source terminal") to which the pad 321 is connected and the external connection terminals 368 to 377 (another example of "first input terminal") to which the pads 338 to 347 are respectively connected, is shorter than the shortest distance between the external connection terminal 354 (another example of "second power source terminal") to which the pad 324 is connected and the external connection terminals 368 to 377. In addition, the shortest distance between the external connection terminal 354 and the external connection terminals 368 to 377 is shorter than the shortest distance between the external connection terminal 357 (another example of "third power source terminal") to which the pad 327 is connected and the external connection terminals 368 to 377. In addition, the shortest distance between the external connection terminal 360 to which the pad 330 is connected and the external connection terminals 368 to 377 is shorter than the shortest distance between the external connection terminal 357 and the external connection terminals 368 to 377, and the shortest distance between the external connection terminal 363 to which the pad 333 is connected and the external connection terminals 368 to 377 is shorter than the shortest distance between the external connection terminal 360 and the external connection terminals 368 to 377.

In addition, in the control substrate 100, the shortest distance between the electrodes 401 (one example of "first electrode") to which the external connection terminal 351 is connected and electrodes 418 to 427 (one example of "fourth electrode") to which the external connection terminals 368 to 377 are respectively connected, is shorter than the shortest distance between an electrode 404 (one example of "second electrode") to which the external connection terminal 354 is connected and the electrodes 418 to 427. In addition, the shortest distance between the electrode 404 and the electrodes 418 to 427 is shorter than the shortest distance between the electrode 407 (one example of "third electrode") to which the external connection terminal 357 is connected and the electrodes 418 to 427. In addition, the shortest distance between the electrode 410 to which the external connection terminal 360 is connected and the electrodes 418 to 427 is shorter than the shortest distance between the electrode 407 and the electrodes 418 to 427, and the shortest distance between the electrode 413 to which the external connection terminal 363 is connected and the electrodes 418 to 427 is shorter than the shortest distance between the electrode 410 and the electrodes 418 to 427.

In this manner, in the embodiment, since the disposition of the external connection terminals of the integrated circuit device 300 and the disposition of the electrodes formed on the control substrate 100 are the same as the disposition of the pads of the integrated circuit device 300, in the control substrate 100, it is easy to separate the wiring through which various control input signals input to the integrated circuit device 300 propagate and the wiring through which the control signals Gt1a to Gt1d and Gt2a to Gt2d having a high voltage and a high frequency output from the integrated circuit device 300 propagate from each other, the influence of noise on various control input signals is reduced, and the distortion of the driving waveform of the driving signal COMA output from the driving circuit 50a-1 is reduced.

8. Operational Effect

As described above, according to the liquid discharge apparatus 1 of the embodiment, in each of the integrated circuit devices 300, the influence of noise from the circuits (the gate drivers 255a to 255d, the amplification control circuit 257, and the like) which operate at a high voltage and at a high frequency on various control input signals (the linear amplification feedback signal LAO_FB, the feedback signal ain3, the feedback signal ain2, the driving data dA, the control signal OEa, the control signal OCa, and the like) and the analog block which operates at a low voltage. Furthermore, in the control substrate 100, the influence of noise based on the signals (the control signals Gt1a to Gt1d, Gt2a to Gt2d and the like) having a high voltage and a high frequency on various control input signals to the integrated circuit device 300 is reduced. Therefore, according to the liquid discharge apparatus 1 of the embodiment, since the driving circuits 50a-1 to 50a-6 and 50b-1 to 50b-6 can generate the driving signals COMA and COMB having the driving waveforms with less distortion, it is possible to improve the discharge accuracy of the liquid from each of the discharge units 600.

Further, according to the liquid discharge apparatus 1 of the embodiment, in each of the three integrated circuit devices 300, since two driving circuit blocks having a relatively large heating value are at diagonal positions and other two driving circuit blocks having a relatively small heating value are at diagonal positions, the generated heat is dispersed from the four driving circuit blocks, the bias of the temperature distribution is reduced, and thus, the operation of the four driving circuit blocks is stabilized. Therefore, according to the liquid discharge apparatus 1 of the embodiment, since the driving circuits 50a-1 to 50a-6 and 50b-1 to 50b-6 can generate the driving signals COMA and COMB having the driving waveforms with less distortion, it is possible to improve the discharge accuracy of the liquid from each of the discharge units 600.

Furthermore, according to the liquid discharge apparatus 1 of the embodiment, since each of the three integrated circuit devices 300 has four driving circuit blocks loaded thereon, the necessary number of integrated circuit devices is reduced compared to a case where one or two driving circuit blocks are loaded on separate integrated circuit device, and thus, it is possible to reduce the total disposition area of the driving circuits 50a-1 to 50a-6 and 50b-1 to 50b-6 and to reduce the costs.

9. Modification Example

In the above-described embodiment, the driving circuits 50a-1 to 50a-6 and 50b-1 to 50b-6 are provided on the control substrate 100, but may be provided on a head substrate 101 or a substrate (relay substrate) different from the control substrate 100 and the head substrate 101.

In addition, in the above-described embodiment, although the driving circuits 50a-1 to 50a-6 generate the driving signal COMA having the same waveform, the waveform of the driving signals COMA generated by at least one of the driving circuits 50a-1 to 50a-6 and the waveform of the driving signal COMA generated by at least another one of the driving circuits 50a-1 to 50a-6 may be different from each other. Similarly, in the above-described embodiment, although the driving circuits 50b-1 to 50b-6 generate the driving signal COMB having the same waveform, the waveform of the driving signals COMB generated by at least one of the driving circuits 50b-1 to 50b-6 and the waveform of the driving signal COMB generated by at least another one of the driving circuits 50b-1 to 50b-6 may be different from each other. For example, in a case where the color of ink discharged by each of the discharge units 600 provided corresponding to the first nozzle row 650a and the second nozzle row 650b (refer to FIG. 2) and the color of ink discharged by each of the discharge units 600 provided corresponding to the third nozzle row 650c and the fourth nozzle row 650d (refer to FIG. 2) are different from each other, in accordance with the difference in viscosity of the ink for each color, the waveform of the driving signal COMA generated by the driving circuit 50a-1 and the waveform of the driving signal COMA generated by the driving circuit 50a-2 may be different from each other, and the waveform of the driving signal COMB generated by the driving circuit 50b-1 and the waveform of the driving signal COMB generated by the driving circuit 50b-2 may be different from each other.

Further, in the above-described embodiment, there are 12 driving circuits (driving circuits 50a-1 to 50a-6 and 50b-1 to 50b-6), there are 3 integrated circuit devices 300, and there are 4 driving circuits included in one integrated circuit device 300, but the number of the members is not limited to those exemplified in the above-described embodiments.

In addition, in the above-described embodiment, in each of the driving circuits 50a-1 to 50a-6 and 50b-1 to 50b-6, the range between the maximum power source voltage V5 and the minimum power source voltage V1 is divided into the first range to the fourth range and the four gate drivers 255a to 255d are operated, but the number of ranges for dividing the power source voltage (the number of gate drivers) is not limited to four, may be three or less, or may be five or more.

In addition, in the above-described embodiment, the waveform of the driving signal COMA and the waveform of the driving signal COMB are combined with each other to generate the driving signal VOUT having the driving waveform that corresponds to the large dot, the medium dot, the small dot, and the non-recording and to apply the driving signal VOUT to each of the piezoelectric elements 60, but the generation method of the driving signal VOUT applied to each of the piezoelectric elements 60 is not limited thereto, and various known methods can be applied. For example, in each printing cycle, the driving signal VOUT having the driving waveform that corresponds to the large dot, the medium dot, the small dot, and the non-recording may be generated by selecting any one of the driving signal COMA having a driving waveform for the large dot, the driving signal COMB having the driving waveform for the medium dot, a driving signal COMC having a driving waveform for the small dot, and a driving signal COMD having a driving waveform for non-recording (for slightly vibration). Further, for example, in each printing cycle, the driving signal VOUT having a driving waveform that corresponds to the large dot, the medium dot, the small dot, and the non-recording may be generated by selecting two driving waveforms for the medium dot, two driving waveforms for the medium dot from one driving signal COM having one driving waveform for the small dot and one driving waveform for the non-recording (slight vibration), the driving waveform for one medium dot, and one driving waveform for the small dot or one driving waveform for the non-recording (slight vibration).

In addition, in the above-described embodiment, each of the driving circuits is a capacitive load driving circuit that generates a driving signal for driving the piezoelectric element 60 which is a capacitive load. However, the driving circuit in the invention can also be employed in the capacitive load driving circuit that drives the capacitive load other than the piezoelectric element.

In addition, in the above-described embodiment, the piezo type liquid discharge apparatus in which the driving circuit drives the piezoelectric element (capacitive load) that serves as a driving element has been described as an example. However, the invention can also be employed in a liquid discharge apparatus in which the driving circuit drives a driving element other than the capacitive load. An example of the liquid discharge apparatus includes a thermal type (bubble type) liquid discharge apparatus or the like in which the driving circuit drives a heat generating element (for example, a resistor) that serves as a driving element, and a liquid (ink) is discharged using a bubble generated by heating the heat generating element.

In addition, in the above-described embodiment, a serial scan type (serial printing type) ink jet printer which performs printing on a printing medium by moving a liquid discharge head has been described as an example of the liquid discharge apparatus. However, the invention can also be employed in a line head type ink jet printer in which printing is performed on a printing medium without moving the liquid discharge head.

In addition, in the above-described embodiment, a printer (printing apparatus) has been exemplified as a liquid discharge apparatus, but the invention can also be employed in a color material discharge apparatus which is used in manufacturing a color printer, such as a liquid crystal display, an electrode material discharge apparatus which is used in forming an electrode, such as an organic EL display or an FED (a surface light emission display), a bioorganic material discharge apparatus which is used in manufacturing a biochip, a stereolithography device (so-called 3D printer), a textile printing device, and the like.

Above, the embodiments or the modification examples have been described above, but the invention is not limited to the embodiments or modification examples, and can be implemented in various modes without departing from the gist thereof. For example, the above-described embodiment and each of the modification examples can also be appropriately combined with each other.

The invention includes substantially the same configuration as the configuration described in the embodiment (for example, a configuration having the same function, method, and result, or a configuration having the same object and effect). Further, the invention includes a configuration in which non-essential parts of the configuration described in the embodiments are replaced. In addition, the invention includes a configuration that achieves the same operation and effect as the configuration described in the embodiment, or a configuration that can achieve the same object. Further, the invention includes a configuration in which a known technology is added to the configuration described in the embodiment.

What is claimed is:

1. A liquid discharge apparatus comprising:
a discharge device including a piezoelectric element, the discharge device being configured to discharge a liquid by applying a first driving signal to the piezoelectric element; and
a first driving circuit which outputs the first driving signal, wherein the first driving circuit includes;
a first output node configured to output the first driving signal;
a first transistor pair which includes a first transistor and a second transistor which are connected to each other in series between a first power source voltage supply line for supplying a first power source voltage and a second power source voltage supply line for supplying a second power source voltage that is higher than the first power source voltage;
a second transistor pair which includes a third transistor and a fourth transistor which are connected to each other in series between the second power source voltage supply line and a third power source voltage supply line for supplying a third power source voltage that is higher than the second power source voltage;
a first gate driver to which the first power source voltage and the second power source voltage are supplied and which generates a first control signal that controls a switching operation of the first transistor pair;
a second gate driver to which the second power source voltage and the third power source voltage are supplied and which generates a second control signal that controls a switching operation of the second transistor pair; and
a first control circuit which controls the first gate driver and the second gate driver based on a first input signal,
wherein an output end of the first transistor pair and an output end of the second transistor pair are connected to the first output node,
wherein at least a part of the first gate driver, at least a part of the second gate driver, and at least a part of the first control circuit are integrated in an integrated circuit device,
wherein the integrated circuit device includes a first power source terminal to which the first power source voltage is supplied, a second power source terminal to which the second power source voltage is supplied, a third power source terminal to which the third power source voltage is supplied, and a first input terminal to which the first input signal is input,
wherein the first power source terminal is spaced away from the first input terminal by a first linear distance, the second power source terminal is spaced away from the first input terminal by a second linear distance, and the third power source terminal is spaced away from the first input terminal by a third linear distance, and
the first linear distance is shorter than the second linear distance, and the second linear distance is shorter than the third linear distance.

2. The liquid discharge apparatus according to claim 1, wherein the first control circuit includes a D/A conversion circuit which converts a digital signal that defines a waveform of the first driving signal into an original driving signal that serves as an origin of the first driving signal, and controls the first gate driver and the second gate driver based on the original driving signal, and wherein the first input signal is the digital signal.

3. The liquid discharge apparatus according to claim 1, wherein the first power source terminal is spaced away from a first side of the integrated circuit device by a fourth linear distance, and the first power source terminal is spaced away from a second side of the integrated circuit device by a fifth linear distance,
the first side is different from the second side, and the fourth linear distance is shorter than the fifth linear distance, and
wherein the first input terminal is spaced apart from the second side by a sixth linear distance, and the first input terminal is spaced away from the first side by a seventh linear distance, and
the sixth linear distance is shorter than the seventh linear distance.

4. The liquid discharge apparatus according to claim 3, wherein the second power source terminal is spaced away from the first side by an eighth linear distance, and the second power source terminal is spaced away from the second side by a ninth linear distance,
the eighth linear distance is shorter than the ninth linear distance, and
wherein the third power source terminal is spaced away from the first side by a tenth linear distance, and the third power source terminal is spaced away from the second side by an eleventh linear distance, and
the tenth linear distance is shorter than the eleventh linear distance.

5. The liquid discharge apparatus according to claim 3, wherein the discharge device is configured to discharged the liquid by applying one of the first driving signal or a second driving signal to the piezoelectric element,
wherein a second driving circuit which outputs the second driving signal is further provided, the second driving circuit includes:
a second output node configured to output the second driving signal;
a third transistor pair which includes a fifth transistor and a sixth transistor which are connected to each other in series between a fourth power source voltage supply line for supplying a fourth power source voltage and a fifth power source voltage supply line for supplying a fifth power source voltage that is higher than the fourth power source voltage;
a fourth transistor pair which includes a seventh transistor and an eighth transistor which are connected to each other in series between the fifth power source voltage supply line and a sixth power source voltage supply line for supplying a sixth power source voltage that is higher than the fifth power source voltage;
a third gate driver to which the fourth power source voltage and the fifth power source voltage are supplied and which generates a third control signal that controls a switching operation of the third transistor pair;
a fourth gate driver to which the fifth power source voltage and the sixth power source voltage are supplied and which generates a fourth control signal that controls a switching operation of the fourth transistor pair; and
a second control circuit which controls the third gate driver and the fourth gate driver based on a second input signal, wherein an output end of the third transistor pair and an output end of the fourth transistor pair are connected to the second output node, wherein at least a part of the third gate driver, at least a part of the fourth gate driver, and at least a part of the second control circuit are integrated in the integrated circuit device, wherein the integrated circuit device includes a fourth power source terminal to which the fourth power source voltage is supplied, a fifth power source terminal to which the fifth power source voltage is supplied, a sixth power source terminal to which the sixth power source voltage is supplied, and a second input terminal to which the second input signal is input, wherein the fourth power source terminal is spaced away from the second input terminal by an twelfth linear distance, the fifth power source terminal is spaced away from the second input terminal by a thirteenth linear distance, and the twelfth linear distance is shorter than the thirteenth linear distance, wherein the sixth power source terminal is spaced away from the second input terminal by a fourteenth fifteenth linear distance, and thirteenth linear distance is shorter than the fourteenth linear distance, wherein the second input terminal is spaced away from a third side opposite to the second side of the integrated circuit device by a fifteenth linear distance, the second input terminal is spaced away from the first side by a sixteenth linear distance, and the fifteenth linear distance is shorter than the sixteenth linear distance, wherein the fourth power source terminal is spaced away from the first side by a seventeenth linear distance, the fourth power source terminal is spaced away from the third side by an eighteenth linear distance, and the seventeenth linear distance is shorter than the eighteenth linear distance, wherein the fifth power source terminal is spaced away from the first side by a nineteenth linear distance, the fifth power source terminal is spaced away from the third side by a twentieth linear distance, and the nineteenth linear distance is shorter than the twentieth linear distance, and wherein the sixth power source terminal is spaced away from the first side by a twenty-first linear distance, the sixth power source terminal is spaced away from the third side by twenty-second linear distance, and the twenty-first linear distance is shorter than the twenty-second linear distance.

6. A circuit substrate on which an integrated circuit device is mounted, at least a part of a first gate driver, at least a part of a second gate driver, and at least a part of a first control circuit are integrated in the integrated circuit device, the integrated circuit device including:

a first power source terminal to which a first power source voltage is supplied;

a second power source terminal to which a second power source voltage is supplied;

a third power source terminal to which a third power source voltage is supplied; and a first input terminal to which a first input signal is input, wherein the first gate driver, the second gate driver, and the first control circuit configuring a first driving circuit that is configured to output a first driving signal to a discharge device so as to discharge a liquid, the first driving circuit including:

a first output node configured to output the first driving signal;

a first transistor pair which includes a first transistor and a second transistor which are connected to each other in series between a first power source voltage supply line for supplying the first power source voltage and a second power source voltage supply line for supplying the second power source voltage that is higher than the first power source voltage;

a second transistor pair which includes a third transistor and a fourth transistor which are connected to each other in series between the second power source voltage supply line and a third power source voltage supply line for supplying the third power source voltage that is higher than the second power source voltage the first gate driver to which the first power source voltage and the second power source voltage are supplied and which generates a first control signal that controls a switching operation of the first transistor pair;

the second gate driver to which the second power source voltage and the third power source voltage are supplied and which generates a second control signal that controls a switching operation of the second transistor pair; and the first control circuit which controls the first gate driver and the second gate driver based on the first input signal, wherein an output end of the first transistor pair and an output end of the second transistor pair are connected to the first output node, the circuit substrate comprising:

a first electrode to which the first power source terminal is connected;

a second electrode to which the second power source terminal is connected;

a third electrode to which the third power source terminal is connected; and a fourth electrode to which the first input terminal is connected, wherein the first electrode is spaced away from the fourth electrode by a first linear distance, the second electrode is spaced away from the fourth electrode by a second linear distance, and the first linear distance is shorter than the second linear distance, and wherein the third electrode is spaced away from the fourth electrode by a third linear distance, and the second linear distance is shorter than the third linear distance.

7. The circuit substrate according to claim 6, wherein the first control circuit includes a D/A conversion circuit which converts a digital signal that defines a waveform of the first driving signal into an original driving signal that serves as an origin of the first driving signal, and controls the first gate driver and the second gate driver based on the original driving signal, and wherein the first input signal is the digital signal.

8. The circuit substrate according to claim 6, wherein, when the integrated circuit device is mounted on the circuit substrate:

the first electrode is spaced away from a first side of the integrated circuit device by a fourth linear distance, the first electrode is spaced away from a second side of the integrated circuit device by a fifth linear distance, the second side is different from the first side, and the fourth linear distance is shorter than the fifth linear distance, and the fourth electrode is spaced away from the second side by a sixth linear distance, the fourth electrode is spaced away from the first side by a seventh linear distance, and the sixth linear distance is shorter than the seventh linear distance.

9. The circuit substrate according to claim 8,
wherein the second electrode is spaced away from the first side by an eighth linear distance, the second electrode is spaced away from the second side by a ninth linear distance, and the eighth linear distance is shorter than the ninth linear distance, and
wherein the third electrode is spaced away from the first side by a tenth linear distance, the third electrode is spaced away from the second side by an eleventh linear distance, and the tenth linear distance is shorter than the eleventh linear distance.

10. An integrated circuit device that is used in a first driving circuit, the first driving circuit including:
a first output node configured to output a first driving signal that drives a capacitive load;
a first transistor pair which includes a first transistor and a second transistor which are connected to each other in series between a first power source voltage supply line for supplying a first power source voltage and a second power source voltage supply line for supplying a second power source voltage that is higher than the first power source voltage;
a second transistor pair which includes a third transistor and a fourth transistor which are connected to each other in series between the second power source voltage supply line and a third power source voltage supply line for supplying a third power source voltage that is higher than the second power source voltage;
a first gate driver to which the first power source voltage and the second power source voltage are supplied and which generates a first control signal that controls a switching operation of the first transistor pair;
a second gate driver to which the second power source voltage and the third power source voltage are supplied and which generates a second control signal that controls a switching operation of the second transistor pair; and
a first control circuit which controls the first gate driver and the second gate driver based on a first input signal,
wherein an output end of the first transistor pair and an output end of the second transistor pair are connected to the first output node, the integrated circuit device comprising:
at least a part of the first gate driver;
at least a part of the second gate driver;
at least a part of the first control circuit;
a first power source terminal to which the first power source voltage is supplied;
a second power source terminal to which the second power source voltage is supplied;
a third power source terminal to which the third power source voltage is supplied; and
a first input terminal to which the first input signal is input,
wherein the first power source terminal is spaced away from the first input terminal by a first linear distance, the second power source terminal is spaced away from the first input terminal by a second linear distance, and the first linear distance is shorter than the second linear distance, and
wherein the third power source terminal is spaced away from the first input terminal by a third linear distance, and the second linear distance is shorter than the third linear distance.

11. The integrated circuit device according to claim 10,
wherein the first input terminal is spaced away from the first gate driver by a fourth linear distance, the first input terminal is spaced away from the second gate driver by a fifth linear distance, and the fourth linear distance is shorter than the fifth linear distance.

12. The integrated circuit device according to claim 10,
wherein the first power source terminal is spaced away from a first side of the integrated circuit device by a sixth linear distance, the first power source terminal is spaced away from a second side of the integrated circuit device by a seventh linear distance, the second side is different from the first side, and the sixth linear distance is shorter than the seventh linear distance, and
wherein the first input terminal is spaced away from the second side by an eighth linear distance, the first input terminal is spaced away from the first side by a ninth linear distance, and the eighth linear distance is shorter than the ninth linear distance.

13. The integrated circuit device according to claim 12,
wherein the second power source terminal is spaced away from the first side by a tenth linear distance, the second power source terminal is spaced away from the second side by an eleventh linear distance, and the tenth linear distance is shorter than the eleventh linear distance, and
wherein the third power source terminal is spaced way from the first side by a twelfth linear distance, the third power source terminal is spaced away from the second side by a thirteenth linear distance, and the twelfth linear distance is shorter than the thirteenth linear distance.

14. The integrated circuit device according to claim 12,
wherein the first driving circuit further includes a linear amplifier which amplifies a voltage of an original driving signal that serves as the first driving signal and outputs the amplified voltage,
wherein, in a predetermined period, the switching operation of the first transistor pair and the second transistor pair is stopped, and the amplified voltage output from the linear amplifier is applied to the first output node,
wherein the integrated circuit device further includes at least a part of the linear amplifier and a first output terminal from which a signal generated by the linear amplifier is output,
wherein the first output terminal is spaced away from the second side by a fourteenth linear distance, the first output terminal is spaced way from the first side by a fifteenth linear distance, and the fourteenth linear distance is shorter than the fifteenth linear distance, and
wherein the linear amplifier is provided between the second side and the first gate driver.

15. The integrated circuit device according to claim 10,
wherein the first control circuit includes a D/A conversion circuit which converts a digital signal that defines a waveform of the first driving signal into an original driving signal that serves as an origin of the first driving signal, and controls the first gate driver and the second gate driver based on the original driving signal, and
wherein the first input signal is the digital signal.

16. The integrated circuit device according to claim 10,
wherein the first control circuit further includes:
a D/A conversion circuit which converts a digital signal that defines a waveform of the first driving signal into an original driving signal that serves as an origin of the first driving signal; and
a selector which makes the first gate driver operable when a voltage of the first driving signal is between the first power source voltage and the second power source voltage, which makes the second gate driver operable when the voltage of the first driving signal is between the second power source voltage and the third power source voltage, and which controls the first gate driver and the second gate driver based on the original driving signal, wherein the integrated circuit device further includes at least a part of the D/A conversion circuit and at least a part of the selector, and wherein the selector is provided between an area in which the first gate driver and the second gate driver are disposed and an area in which the D/A conversion circuit is disposed.

* * * * *